(12) United States Patent
Yamazaki et al.

(10) Patent No.: US 12,437,703 B2
(45) Date of Patent: Oct. 7, 2025

(54) DISPLAY APPARATUS HAVING PIXEL SETS INCLUDING LIGHT-EMITTING DEVICES

(71) Applicant: Semiconductor Energy Laboratory Co., Ltd., Atsugi (JP)

(72) Inventors: Shunpei Yamazaki, Setagaya (JP); Hajime Kimura, Atsugi (JP); Takayuki Ikeda, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/274,263

(22) PCT Filed: Feb. 1, 2022

(86) PCT No.: PCT/IB2022/050841
§ 371 (c)(1),
(2) Date: Jul. 26, 2023

(87) PCT Pub. No.: WO2022/172124
PCT Pub. Date: Aug. 18, 2022

(65) Prior Publication Data
US 2024/0178360 A1    May 30, 2024

(30) Foreign Application Priority Data

Feb. 12, 2021 (JP) ................................ 2021-020852
Mar. 31, 2021 (JP) ................................ 2021-059417

(51) Int. Cl.
*G09G 3/32* (2016.01)
*G09G 3/30* (2006.01)
(Continued)

(52) U.S. Cl.
CPC ................. *G09G 3/32* (2013.01); *G09G 3/30* (2013.01); *G09G 3/3225* (2013.01);
(Continued)

(58) Field of Classification Search
CPC .......... G09G 3/30; G09G 3/32; G09G 3/3225; G09G 3/3233; G09G 3/20;
(Continued)

(56) References Cited

U.S. PATENT DOCUMENTS 7,183,582 B2   2/2007  Imamura
7,364,928 B2   4/2008  Imamura
(Continued)

FOREIGN PATENT DOCUMENTS

CN        001602509 A      3/2005
CN        102737578 A     10/2012
(Continued)

OTHER PUBLICATIONS

International Search Report (Application No. PCT/IB2022/050841) Dated Apr. 12, 2022.
(Continued)

*Primary Examiner* — Adam J Snyder
(74) *Attorney, Agent, or Firm* — Eric J. Robinson; Robinson Intellectual Property Law Office, P.C.

(57) ABSTRACT

A novel display apparatus that is highly convenient, useful, or reliable is provided. The display apparatus includes a first pixel set, a second pixel set, a first conductive film, and a second conductive film; the first pixel set includes a first light-emitting device set and a first pixel circuit set; the first pixel circuit set includes a first group of pixel circuits; and the first group of pixel circuits include a first pixel circuit. The second pixel set includes a second light-emitting device set and a second pixel circuit set; the second light-emitting device set is electrically connected to the second pixel circuit set; the second pixel circuit set includes a second group of pixel circuits; and the second group of pixel circuits include a second pixel circuit. The first conductive film is electrically connected to the first group of pixel circuits and
(Continued)

the second group of pixel circuits, and the second conductive film is electrically connected to the first pixel circuit and the second pixel circuit.

8 Claims, 45 Drawing Sheets

(51) Int. Cl.

| | | |
|---|---|---|
| *G09G 3/3225* | (2016.01) | |
| *G09G 3/3233* | (2016.01) | |
| *H01L 25/16* | (2023.01) | |
| *H10H 20/857* | (2025.01) | |
| *G09F 9/30* | (2006.01) | |
| *G09F 9/33* | (2006.01) | |
| *G09G 3/20* | (2006.01) | |
| *H01L 25/075* | (2006.01) | |
| *H05B 33/02* | (2006.01) | |
| *H05B 33/06* | (2006.01) | |
| *H05B 33/12* | (2006.01) | |
| *H05B 33/14* | (2006.01) | |
| *H10D 30/67* | (2025.01) | |
| *H10D 84/00* | (2025.01) | |
| *H10D 84/01* | (2025.01) | |
| *H10D 84/03* | (2025.01) | |
| *H10D 84/83* | (2025.01) | |

(52) U.S. Cl.
CPC ......... *G09G 3/3233* (2013.01); *H01L 25/167* (2013.01); *H10H 20/857* (2025.01); *G09F 9/30* (2013.01); *G09F 9/33* (2013.01); *G09G 3/20* (2013.01); *G09G 2300/0426* (2013.01); *G09G 2300/0452* (2013.01); *G09G 2300/0842* (2013.01); *G09G 2300/0852* (2013.01); *G09G 2310/08* (2013.01); *G09G 2330/021* (2013.01); *H01L 25/0753* (2013.01); *H05B 33/02* (2013.01); *H05B 33/06* (2013.01); *H05B 33/12* (2013.01); *H05B 33/14* (2013.01); *H10D 30/67* (2025.01); *H10D 84/00* (2025.01); *H10D 84/0126* (2025.01); *H10D 84/038* (2025.01); *H10D 84/83* (2025.01)

(58) Field of Classification Search
CPC ... G09G 2300/0426; G09G 2300/0452; G09G 2300/0842; G09G 2300/0852; G09G 2310/08; G09G 2330/021; G09F 9/30; G09F 9/33; H01L 21/8234; H01L 25/0753; H01L 25/167; H01L 27/06; H01L 27/088; H01L 29/786; H01L 33/62; H05B 33/02; H05B 33/06; H05B 33/12; H05B 33/14
See application file for complete search history.

(56) References Cited

U.S. PATENT DOCUMENTS

| | | |
|---|---|---|
| 8,507,927 B2 | 8/2013 | Iida et al. |
| 8,780,023 B2 | 7/2014 | Ootorii |
| 8,791,474 B1 | 7/2014 | Bibl et al. |
| 9,252,375 B2 | 2/2016 | Bibl et al. |
| 9,367,094 B2 | 6/2016 | Bibl et al. |
| 9,582,036 B2 | 2/2017 | Bibl et al. |
| 9,865,832 B2 | 1/2018 | Bibl et al. |
| 9,922,966 B2 | 3/2018 | Bibl et al. |
| 10,147,711 B2 | 12/2018 | Bibl et al. |
| 10,411,210 B2 | 9/2019 | Bibl et al. |
| 10,483,253 B1 | 11/2019 | Hu |
| 10,535,642 B2 | 1/2020 | Bibl et al. |
| 10,665,578 B2 | 5/2020 | Huitema et al. |
| 10,777,136 B2 | 9/2020 | Shibusawa |
| 10,950,591 B2 | 3/2021 | Hu |
| 10,957,678 B2 | 3/2021 | Bibl et al. |
| 10,964,900 B2 | 3/2021 | Bibl et al. |
| 11,114,423 B2 | 9/2021 | Iguchi |
| 11,222,587 B2 | 1/2022 | Toyomura |
| 11,362,076 B2 | 6/2022 | Bibl et al. |
| 11,380,862 B2 | 7/2022 | Bibi et al. |
| 11,527,199 B2 | 12/2022 | Wang |
| 11,670,626 B2 | 6/2023 | Hu |
| 11,676,953 B2 | 6/2023 | Bibi et al. |
| 2004/0032637 A1 | 2/2004 | Imamura |
| 2010/0244059 A1 | 9/2010 | Iida et al. |
| 2012/0256814 A1 | 10/2012 | Ootorii |
| 2014/0267683 A1 | 9/2014 | Bibl et al. |
| 2015/0169011 A1 | 6/2015 | Bibl et al. |
| 2018/0190615 A1 | 7/2018 | Pan |
| 2018/0358339 A1 | 12/2018 | Iguchi |
| 2020/0020741 A1 | 1/2020 | Woo |
| 2020/0052033 A1* | 2/2020 | Iguchi .................. G09G 3/32 |
| 2020/0343227 A1* | 10/2020 | Jang .................. H10H 20/018 |
| 2020/0403028 A1 | 12/2020 | Kusunoki et al. |
| 2021/0110761 A1* | 4/2021 | Liu ........................ G09G 3/32 |
| 2021/0158747 A1* | 5/2021 | Kusunoki .............. G09G 3/32 |
| 2021/0174734 A1 | 6/2021 | Takahashi et al. |
| 2021/0264848 A1* | 8/2021 | Yamashita ............ G09G 3/32 |
| 2021/0327865 A1 | 10/2021 | Yamazaki et al. |
| 2021/0358897 A1 | 11/2021 | Iguchi |
| 2022/0005790 A1 | 1/2022 | Watanabe et al. |
| 2022/0045039 A1 | 2/2022 | Tsukamoto. et al. |
| 2022/0139300 A1* | 5/2022 | Yokoyama .......... G09G 3/3233 345/214 |
| 2022/0293876 A1 | 9/2022 | Bibl et al. |

FOREIGN PATENT DOCUMENTS

| | | |
|---|---|---|
| CN | 105144387 A | 12/2015 |
| CN | 105793795 A | 7/2016 |
| CN | 108475712 A | 8/2018 |
| CN | 109920374 A | 6/2019 |
| CN | 111684576 A | 9/2020 |
| EP | 1533779 A | 5/2005 |
| EP | 2973715 A | 1/2016 |
| EP | 3084551 A | 10/2016 |
| EP | 3521972 A | 8/2019 |
| EP | 3726517 A | 10/2020 |
| EP | 3729494 A | 10/2020 |
| JP | 2005-003696 A | 1/2005 |
| JP | 2010-232577 A | 10/2010 |
| JP | 2012-227514 A | 11/2012 |
| JP | 2016-512347 | 4/2016 |
| JP | 2016-538586 | 12/2016 |
| JP | 2019-113728 A | 7/2019 |
| KR | 2006-0064697 A | 6/2006 |
| KR | 2015-0119149 A | 10/2015 |
| KR | 2020-0106929 A | 9/2020 |
| WO | WO-2003/100753 | 12/2003 |
| WO | WO-2014/149864 | 9/2014 |
| WO | WO-2015/094601 | 6/2015 |
| WO | WO-2017/094461 | 6/2017 |
| WO | WO-2019/114348 | 6/2019 |
| WO | WO-2019/130138 | 7/2019 |
| WO | WO-2019/163402 | 8/2019 |
| WO | WO-2019/168763 | 9/2019 |
| WO | WO-2019220265 A1 * | 11/2019 ............... G09G 3/32 |

OTHER PUBLICATIONS

Written Opinion (Application No. PCT/IB2022/050841) Dated Apr. 12, 2022.

* cited by examiner

FIG. 43A
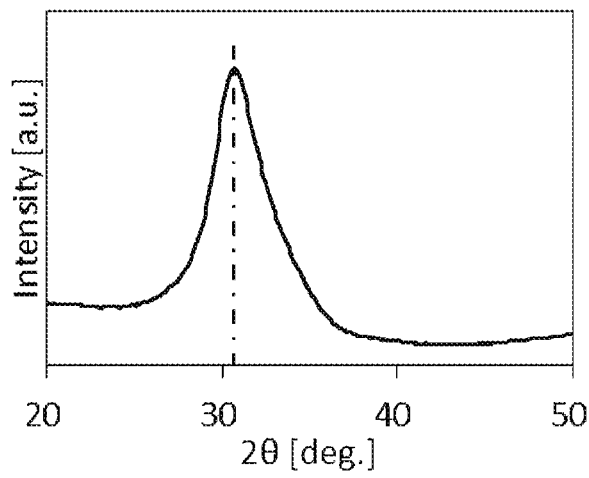
FIG. 43B
FIG. 43C
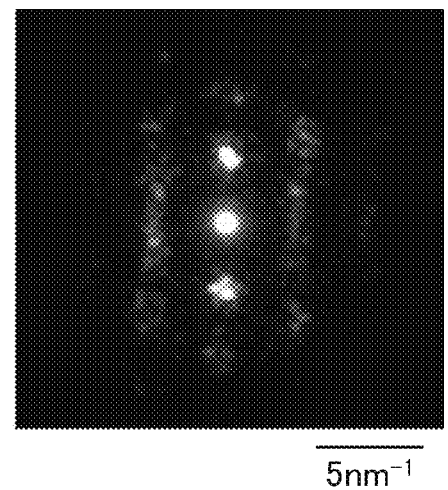

# DISPLAY APPARATUS HAVING PIXEL SETS INCLUDING LIGHT-EMITTING DEVICES

TECHNICAL FIELD

One embodiment of the present invention relates to a display apparatus, an electronic device, or a semiconductor device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Thus, more specifically, examples of the technical field of one embodiment of the present invention disclosed in this specification include a semiconductor device, a display apparatus, a light-emitting apparatus, a power storage device, a memory device, a driving method thereof, and a manufacturing method thereof.

BACKGROUND ART

A display using a micro light-emitting diode whose chromaticity changes little with respect to a current density is known (Patent Document 1). Specifically, a plurality of pixels each include a display element and a microcontroller. The microcontroller includes a first transistor, a triangular wave generation circuit, a comparator, a switch, and a constant current circuit. The first transistor has a function of retaining a potential corresponding to data written to the pixel by being turned off. The triangular wave generation circuit has a function of generating a triangular wave signal. The comparator has a function of generating an output signal corresponding to the retained potential and the triangular wave signal. The switch has a function of controlling whether to supply current flowing through the constant current circuit to the display element in accordance with the output signal.

REFERENCE

Patent Document

[Patent Document 1] PCT International Publication No. WO2019/130138 Pamphlet

SUMMARY OF THE INVENTION

Problems to be Solved by the Invention

An object of one embodiment of the present invention is to provide a novel display apparatus that is highly convenient, useful, or reliable. Another object is to provide a novel electronic device that is highly convenient, useful, or reliable. Another object is to provide a novel display apparatus, a novel electronic device, or a novel semiconductor device.

Note that the description of these objects does not preclude the existence of other objects. One embodiment of the present invention does not have to achieve all of these objects. Note that other objects will be apparent from the description of the specification, the drawings, the claims, and the like, and other objects can be derived from the description of the specification, the drawings, the claims, and the like.

Means for Solving the Problems (1) One embodiment of the present invention is a display apparatus including a first pixel set, a second pixel set, a third pixel set, a first conductive film, and a second conductive film.

The first pixel set includes a first light-emitting device set, a first pad, a second pad, a conductive material, and a first pixel circuit set.

The first light-emitting device set is electrically connected to the first pad, and the first pad overlaps with the second pad. The conductive material is sandwiched between the first pad and the second pad, and the conductive material electrically connects the first pad and the second pad. The second pad is electrically connected to the first pixel circuit set.

The first pixel circuit set includes a first group of pixel circuits, and the first group of pixel circuits include a first pixel circuit.

The second pixel set includes a second light-emitting device set and a second pixel circuit set, the second light-emitting device set is electrically connected to the second pixel circuit set, the second pixel circuit set includes a second group of pixel circuits, and the second group of pixel circuits include a second pixel circuit.

The third pixel set includes a third light-emitting device set and a third pixel circuit set, and the third light-emitting device set is electrically connected to the third pixel circuit set.

The first conductive film is electrically connected to the first group of pixel circuits and the second group of pixel circuits.

The second conductive film is electrically connected to the first pixel circuit and the second pixel circuit.

Thus, for example, with the use of the first conductive film, a signal can be supplied to one or more of the pixel circuits included in the first pixel circuit set in a first period. In addition, a signal can be supplied to one or more of the pixel circuits included in the second pixel circuit set in the same first period. Moreover, for example, with the use of the first conductive film, a signal can be supplied to a plurality of pixel circuits in the first period.

For another example, with the use of the second conductive film, a signal can be supplied to the first pixel circuit included in the first pixel circuit set in a second period. In addition, a signal can be supplied to the second pixel circuit included in the second pixel circuit set in the same second period. Moreover, in the second period, the first pixel circuit can supply power to the second pad of the first pixel set and the second pixel circuit can supply power to the second pad of the second pixel set.

The area of the second pad can be close to the area occupied by the first pixel circuit set. Furthermore, the area of the first pad can be close to the area occupied by the first pixel circuit set. Moreover, electrical connection between the second pad and the first pad is facilitated. In addition, electrical connection between the first pixel circuit set and the first light-emitting device set is facilitated. Alternatively, bonding between the first pixel circuit set and the first light-emitting device set is facilitated. As a result, a novel display apparatus that is highly convenient, useful, or reliable can be provided.

(2) Another embodiment of the present invention is a display apparatus including a first pixel set, a second pixel set, a third pixel set, a first conductive film, and a third conductive film.

The first pixel set includes a first light-emitting device set, a first pad, a second pad, a conductive material, and a first pixel circuit set.

The first light-emitting device set is electrically connected to the first pad, and the first pad overlaps with the second pad. The conductive material is sandwiched between the first pad and the second pad, and the conductive material electrically connects the first pad and the second pad. The second pad is electrically connected to the first pixel circuit set.

The first pixel circuit set includes a first group of pixel circuits, and the first group of pixel circuits include a first pixel circuit.

The second pixel set includes a second light-emitting device set and a second pixel circuit set, the second light-emitting device set is electrically connected to the second pixel circuit set, the second pixel circuit set includes a second group of pixel circuits, and the second group of pixel circuits include a second pixel circuit.

The third pixel set includes a third light-emitting device set and a third pixel circuit set, the third light-emitting device set is electrically connected to the third pixel circuit set, the third pixel circuit set includes a third group of pixel circuits, and the third group of pixel circuits include a third pixel circuit.

The first conductive film is electrically connected to the first group of pixel circuits and the second group of pixel circuits.

The third conductive film is electrically connected to the first pixel circuit and the third pixel circuit.

Thus, for example, a signal can be supplied to one or more of the pixel circuits included in each of the first pixel circuit set and the third pixel circuit set in a first period. For another example, a signal can be supplied to one or more of the pixel circuits included in the third pixel circuit set in a period different from the first period.

For another example, a signal can be supplied to the first pixel circuit included in the first pixel circuit set in a second period. In addition, a signal can be supplied to the third pixel circuit included in the third pixel circuit set in the same second period. Moreover, in the second period, the first pixel circuit can supply power to the second pad of the first pixel set and the third pixel circuit can supply power to the second pad of the third pixel set. As a result, a novel display apparatus that is highly convenient, useful, or reliable can be provided.

(3) Another embodiment of the present invention is a display apparatus including a first pixel set, a second pixel set, a third pixel set, a first conductive film, a fourth conductive film, and a fifth conductive film.

The first pixel set includes a first light-emitting device set, a first pad, a second pad, a conductive material, and a first pixel circuit set.

The first light-emitting device set is electrically connected to the first pad, and the first pad overlaps with the second pad. The conductive material is sandwiched between the first pad and the second pad, and the conductive material electrically connects the first pad and the second pad. The second pad is electrically connected to the first pixel circuit set.

The first pixel circuit set includes a first group of pixel circuits, and the first group of pixel circuits include a first pixel circuit.

The second pixel set includes a second light-emitting device set and a second pixel circuit set, the second light-emitting device set is electrically connected to the second pixel circuit set, the second pixel circuit set includes a second group of pixel circuits, and the second group of pixel circuits include a second pixel circuit.

The third pixel set includes a third light-emitting device set and a third pixel circuit set, the third light-emitting device set is electrically connected to the third pixel circuit set, the third pixel circuit set includes a third group of pixel circuits, and the third group of pixel circuits include a third pixel circuit.

The first conductive film is electrically connected to the first group of pixel circuits and the second group of pixel circuits.

The fourth conductive film is electrically connected to the first pixel circuit and the second pixel circuit.

The fifth conductive film is electrically connected to the first pixel circuit and the third pixel circuit.

Thus, for example, with the use of the first conductive film, a signal can be supplied to one or more of the pixel circuits included in the first pixel circuit set in a first period. In addition, a signal can be supplied to one or more of the pixel circuits included in the second pixel circuit set in the same first period. Moreover, for example, with the use of the first conductive film, a signal can be supplied to a plurality of pixel circuits in the first period.

For another example, with the use of the fourth conductive film and the fifth conductive film, a signal can be supplied to the first pixel circuit included in the first pixel circuit set in a second period.

With the use of two conductive films intersecting with each other, e.g., the fourth conductive film and the fifth conductive film, a signal can be supplied to one pixel circuit selected from the first pixel circuit set. In addition, the number of conductive films for supplying a signal can be reduced. As a result, a novel display apparatus that is highly convenient, useful, or reliable can be provided.

(4) Another embodiment of the present invention is the display apparatus including a sixth conductive film.

The first light-emitting device set includes a first light-emitting device, and the second light-emitting device set includes a second light-emitting device. The sixth conductive film is electrically connected to the first light-emitting device and the second light-emitting device.

Thus, for example, with the use of the sixth conductive film, the second light-emitting device included in the second light-emitting device set can be selected at the timing when the first light-emitting device included in the first light-emitting device set is selected. In addition, the first pad of the first pixel set can supply power to the second light-emitting device at the timing when the first pad of the first pixel set supplies power to the first light-emitting device.

The area of the first pad can be close to the area occupied by the first light-emitting device set. Moreover, electrical connection between the second pad and the first pad is facilitated. In addition, electrical connection between the first pixel circuit set and the first light-emitting device set is facilitated. Alternatively, bonding between the first pixel circuit set and the first light-emitting device set is facilitated. As a result, a novel display apparatus that is highly convenient, useful, or reliable can be provided.

(5) Another embodiment of the present invention is the display apparatus including a seventh conductive film.

The first light-emitting device set includes the first light-emitting device, and the third light-emitting device set includes a third light-emitting device. The seventh conductive film is electrically connected to the first light-emitting device and the third light-emitting device.

(6) Another embodiment of the present invention is the display apparatus in which the first light-emitting device is a light-emitting diode.

Thus, for example, with the use of the seventh conductive film, the third light-emitting device included in the third light-emitting device set can be selected at the timing when the first light-emitting device included in the first light-emitting device set is selected. In addition, a pad of the third pixel set can supply power to the third light-emitting device at the timing when the first pad of the first pixel set supplies power to the first light-emitting device. As a result, a novel display apparatus that is highly convenient, useful, or reliable can be provided.

(7) Another embodiment of the present invention is the display apparatus including an eighth conductive film and a ninth conductive film.

The first pixel circuit includes a first switch, a second switch, a transistor, a capacitor, and a node.

The first switch includes a first terminal electrically connected to the eighth conductive film and a second terminal electrically connected to the node, and has a function of controlling its on/off state on the basis of a potential of the first conductive film.

The transistor includes a gate electrode electrically connected to the node and a first electrode electrically connected to the ninth conductive film.

The capacitor includes a conductive film electrically connected to the node and a conductive film electrically connected to the ninth conductive film.

The second switch includes a first terminal electrically connected to a second electrode of the transistor and a second terminal electrically connected to the second pad, and has a function of controlling its on/off state on the basis of a second selection signal.

(8) Another embodiment of the present invention is the display apparatus including a first driver circuit.

The first driver circuit supplies a first selection signal to the first conductive film, and the first driver circuit supplies a second selection signal to the second conductive film.

The first driver circuit controls a potential of the sixth conductive film.

(9) Another embodiment of the present invention is the display apparatus including a first functional layer and a second functional layer.

The first functional layer includes the first pixel circuit set and the second pad.

The second functional layer overlaps with the first functional layer, and the second functional layer includes the first light-emitting device set and the first pad.

Thus, the first pixel circuit set and the first light-emitting device set can be electrically connected to each other using the second pad, the first pad, and the conductive material. For example, a plurality of pixel circuits and a plurality of light-emitting devices can be connected to each other using one pad. Specifically, three pixel circuits and three light-emitting devices can be connected to each other using one pad. The number of connection portions can be reduced, which can inhibit generation of a connection defect. In addition, the proportion of the area for connection with respect to the area occupied by the first light-emitting device set can be reduced. As a result, a novel display apparatus that is highly convenient, useful, or reliable can be provided.

(10) Another embodiment of the present invention is the display apparatus including a third functional layer.

The third functional layer includes a region where the first functional layer is sandwiched between the second functional layer and the third functional layer, and the third functional layer includes a second driver circuit.

The second driver circuit has a function of supplying an image signal.

Thus, the image signal to be displayed on the display apparatus can be generated without a size increase of the external shape of the display apparatus. In addition, the second driver circuit and the first pixel circuit set provided directly thereover can be electrically connected to each other. As a result, a novel display apparatus that is highly convenient, useful, or reliable can be provided.

(11) Another embodiment of the present invention is an electronic device including an arithmetic portion and any of the above display apparatuses.

The arithmetic portion generates image information, and the display apparatus displays the image information.

(12) Another embodiment of the present invention is an electronic device including any of the above display apparatuses and an arithmetic portion.

The third functional layer includes the arithmetic portion, and the arithmetic portion generates image information. The display apparatus displays the image information.

Although a block diagram in which components are classified by their functions and shown as independent blocks is shown in the drawing attached to this specification, it is difficult to completely separate actual components according to their functions and one component can relate to a plurality of functions.

In this specification, the names of a source and a drain of a transistor interchange with each other depending on the polarity of the transistor and the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, for the sake of convenience, the connection relationship of a transistor is sometimes described assuming that the source and the drain are fixed; in reality, the names of the source and the drain interchange with each other according to the above relationship of the potentials.

In this specification, a source of a transistor means a source region that is part of a semiconductor film functioning as an active layer or a source electrode connected to the semiconductor film. Similarly, a drain of a transistor means a drain region that is part of the semiconductor film or a drain electrode connected to the semiconductor film. Moreover, a gate means a gate electrode.

In this specification, a state in which transistors are connected in series means, for example, a state in which only one of a source and a drain of a first transistor is connected to only one of a source and a drain of a second transistor. In addition, a state in which transistors are connected in parallel means a state in which one of a source and a drain of a first transistor is connected to one of a source and a drain of a second transistor and the other of the source and the drain of the first transistor is connected to the other of the source and the drain of the second transistor In this specification, connection means electrical connection and corresponds to a state in which current, voltage, or a potential can be supplied or transmitted. Accordingly, a state of being connected does not necessarily mean a state of being directly connected and also includes, in its category, a state of being indirectly connected through a circuit element such as a wiring, a resistor, a diode, or a transistor that allows current, voltage, or a potential to be supplied or transmitted.

In this specification, even when independent components are connected to each other in a circuit diagram, there is actually a case where one conductive film has functions of a plurality of components, such as a case where part of a wiring functions as an electrode, for example.

Connection in this specification also includes such a case where one conductive film has functions of a plurality of components, in its category.

Furthermore, in this specification, one of a first electrode and a second electrode of a transistor refers to a source electrode and the other refers to a drain electrode.

Effect of the Invention

According to one embodiment of the present invention, a novel display apparatus that is highly convenient, useful, or reliable can be provided. Alternatively, a novel electronic device that is highly convenient, useful, or reliable can be provided. Alternatively, a novel display apparatus, a novel electronic device, or a novel semiconductor device can be provided.

Note that the description of these effects does not preclude the existence of other effects. One embodiment of the present invention does not need to have all of these effects. Note that other effects will be apparent from the description of the specification, the drawings, the claims, and the like, and other effects can be derived from the description of the specification, the drawings, the claims, and the like.

BRIEF DESCRIPTION OF THE DRAWINGS

FIG. 43A to FIG. 43C are diagrams showing a metal oxide of an embodiment.

MODE FOR CARRYING OUT THE INVENTION

Figure 1A:
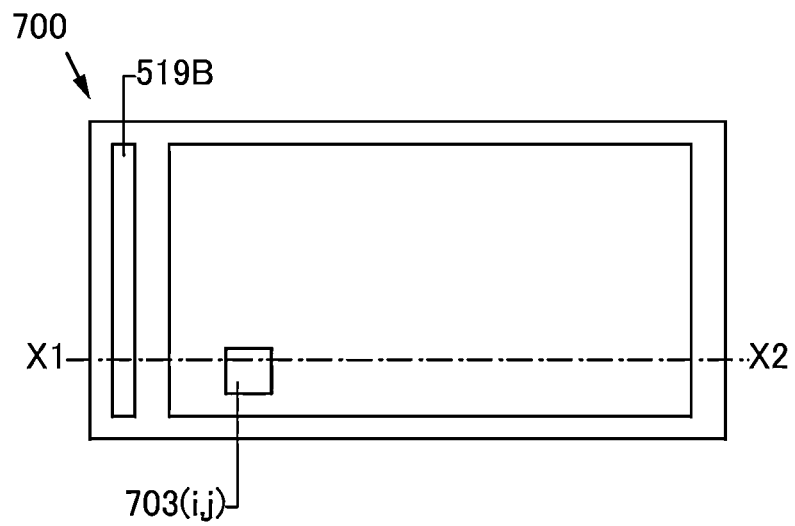
FIG. 1A and FIG. 1B are diagrams illustrating a structure of a display apparatus of an embodiment.

A display apparatus of one embodiment of the present invention includes a first pixel set, a second pixel set, a first conductive film, and a second conductive film. The first pixel set includes a first light-emitting device set, a first pad, a second pad, a conductive material, and a first pixel circuit set. The first light-emitting device set is electrically connected to the first pad, and the first pad overlaps with the second pad. The conductive material is sandwiched between the first pad and the second pad, and the conductive material electrically connects the first pad and the second pad. The second pad is electrically connected to the first pixel circuit set. The first pixel circuit set includes a first group of pixel circuits, and the first group of pixel circuits include a first pixel circuit. The second pixel set includes a second light-emitting device set and a second pixel circuit set, the second light-emitting device set is electrically connected to the second pixel circuit set, the second pixel circuit set includes a second group of pixel circuits, and the second group of pixel circuits include a second pixel circuit. The first conductive film is electrically connected to the first group of pixel circuits and the second group of pixel circuits. The second conductive film is electrically connected to the first pixel circuit and the second pixel circuit. Thus, for example, with the use of the first conductive film, a signal can be supplied to one or more of the pixel circuits included in the first pixel circuit set in a first period. In addition, a signal can be supplied to one or more of the pixel circuits included in the second pixel circuit set in the same first period. Moreover, for example, with the use of the first conductive film, a signal can be supplied to a plurality of pixel circuits in the first period.

For another example, with the use of the second conductive film, a signal can be supplied to the first pixel circuit included in the first pixel circuit set in a second period. In addition, a signal can be supplied to the second pixel circuit included in the second pixel circuit set in the same second period. Moreover, in the second period, the first pixel circuit can supply power to the second pad of the first pixel set and the second pixel circuit can supply power to the second pad of the second pixel set.

The area of the second pad can be close to the area occupied by the first pixel circuit set. Furthermore, the area of the first pad can be close to the area occupied by the first pixel circuit set. Moreover, electrical connection between the second pad and the first pad is facilitated. In addition, electrical connection between the first pixel circuit set and the first light-emitting device set is facilitated. Alternatively, bonding between the first pixel circuit set and the first light-emitting device set is facilitated. As a result, a novel display apparatus that is highly convenient, useful, or reliable can be provided.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments. Note that in structures of the invention described below, the same portions or portions having similar functions are denoted by the same reference numerals in different drawings, and the description thereof is not repeated.

Embodiment 1

In this embodiment, structures of a display apparatus of one embodiment of the present invention will be described with reference to FIG. 1 to FIG. 9.

Figure 1B:
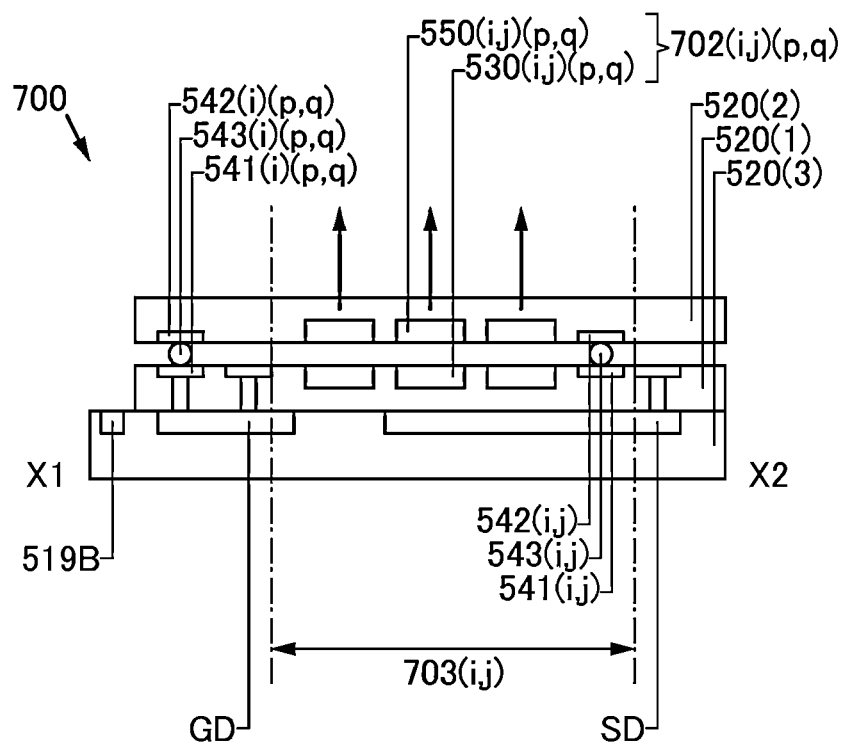
Figure 2:
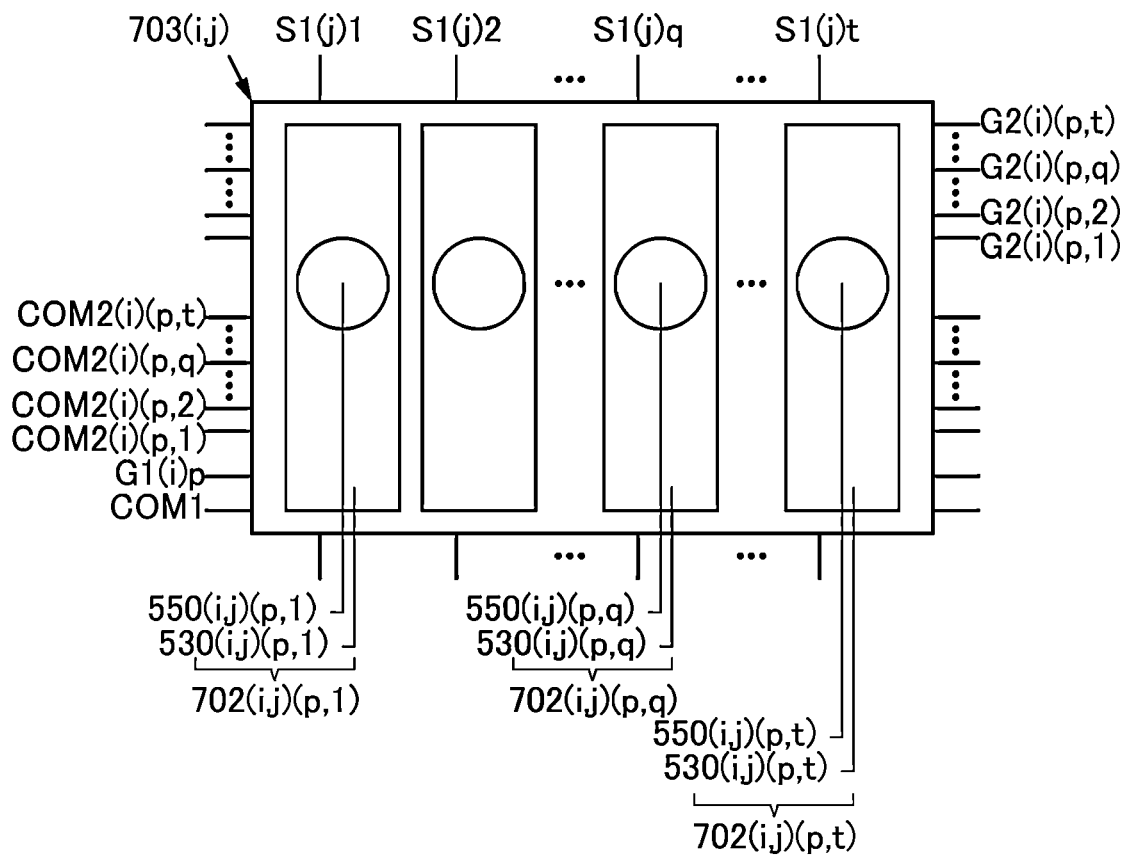
FIG. 2 is a block diagram illustrating a structure of a display apparatus of an embodiment.

FIG. 1A is a top view illustrating the structure of the display apparatus of one embodiment of the present invention, and FIG. 1B is a cross-sectional view taken along the cutting line X1-X2 in the display apparatus of one embodiment of the present invention illustrated in FIG. 1A FIG. 2 is a block diagram illustrating a structure of a pixel set $703(i,j)$ illustrated in FIG. 1A.

Figure 3:
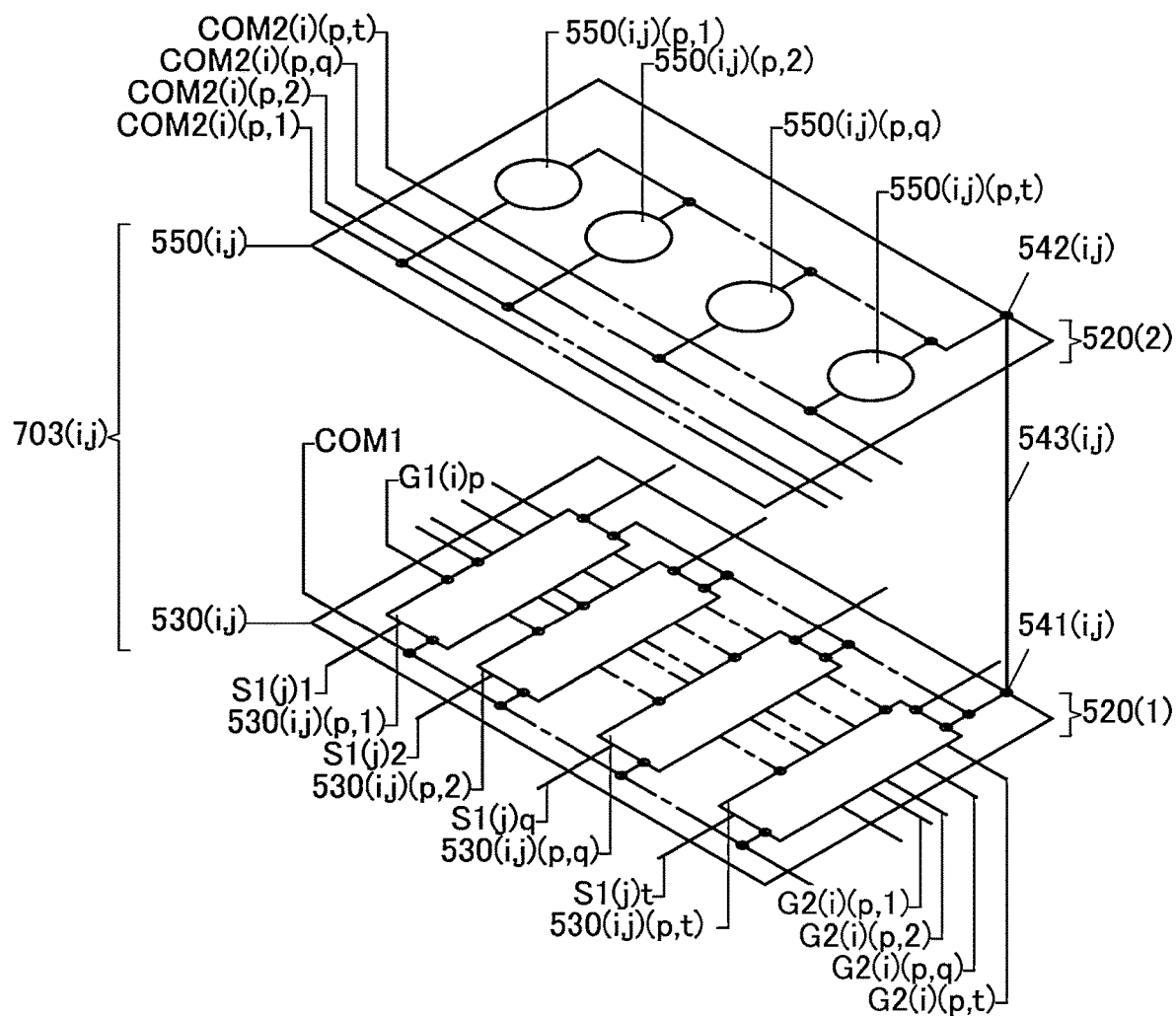
FIG. 3 is a block diagram illustrating a structure of a display apparatus of an embodiment.

FIG. 3 is a block diagram illustrating the structure of the pixel set $703(i,j)$ illustrated in FIG. 2.

Figure 4:
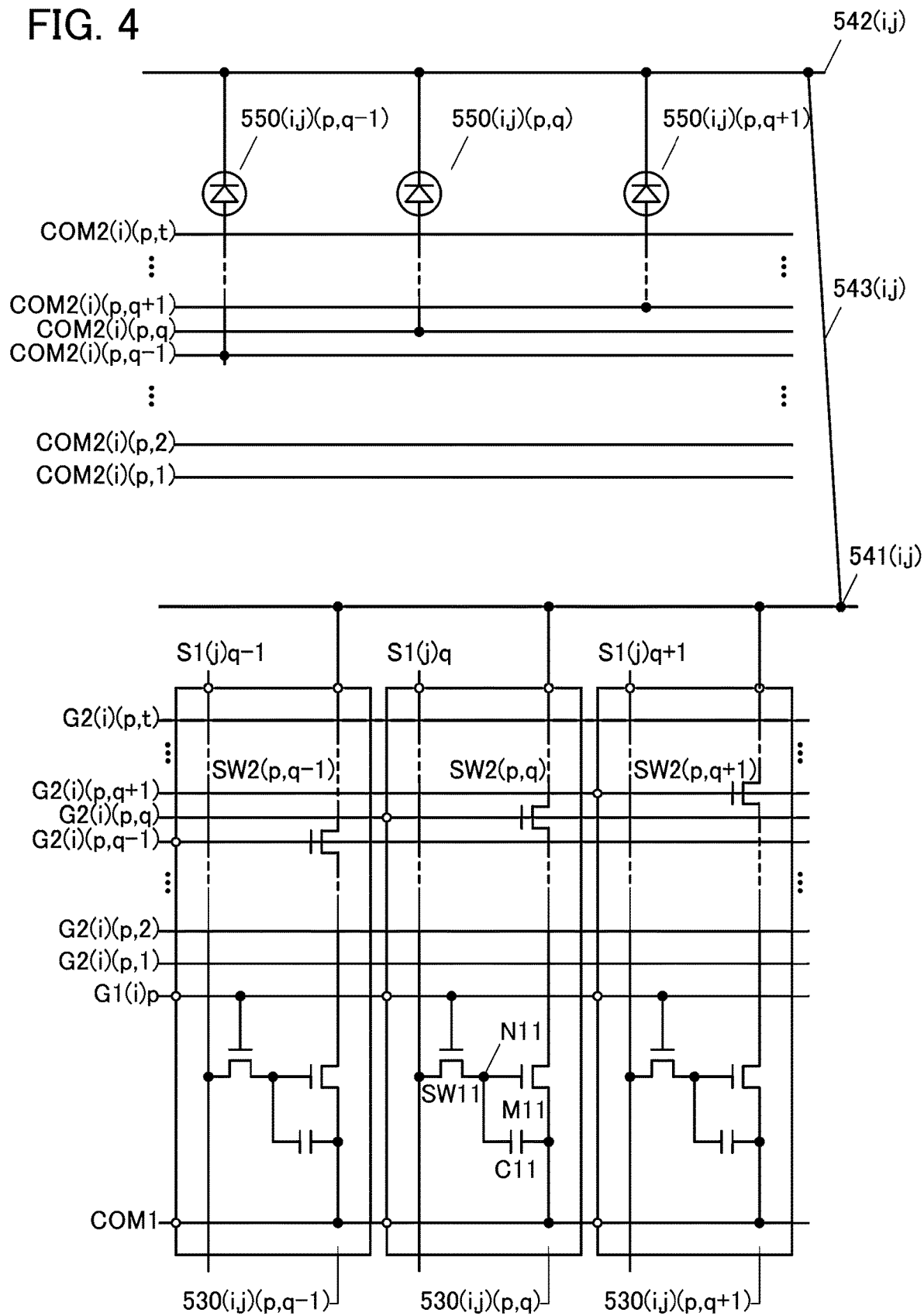
FIG. 4 is a circuit diagram illustrating a structure of a display apparatus of an embodiment.

FIG. 4 is a circuit diagram illustrating the structure of the pixel set $703(i,j)$ illustrated in FIG. 2.

Figure 5:
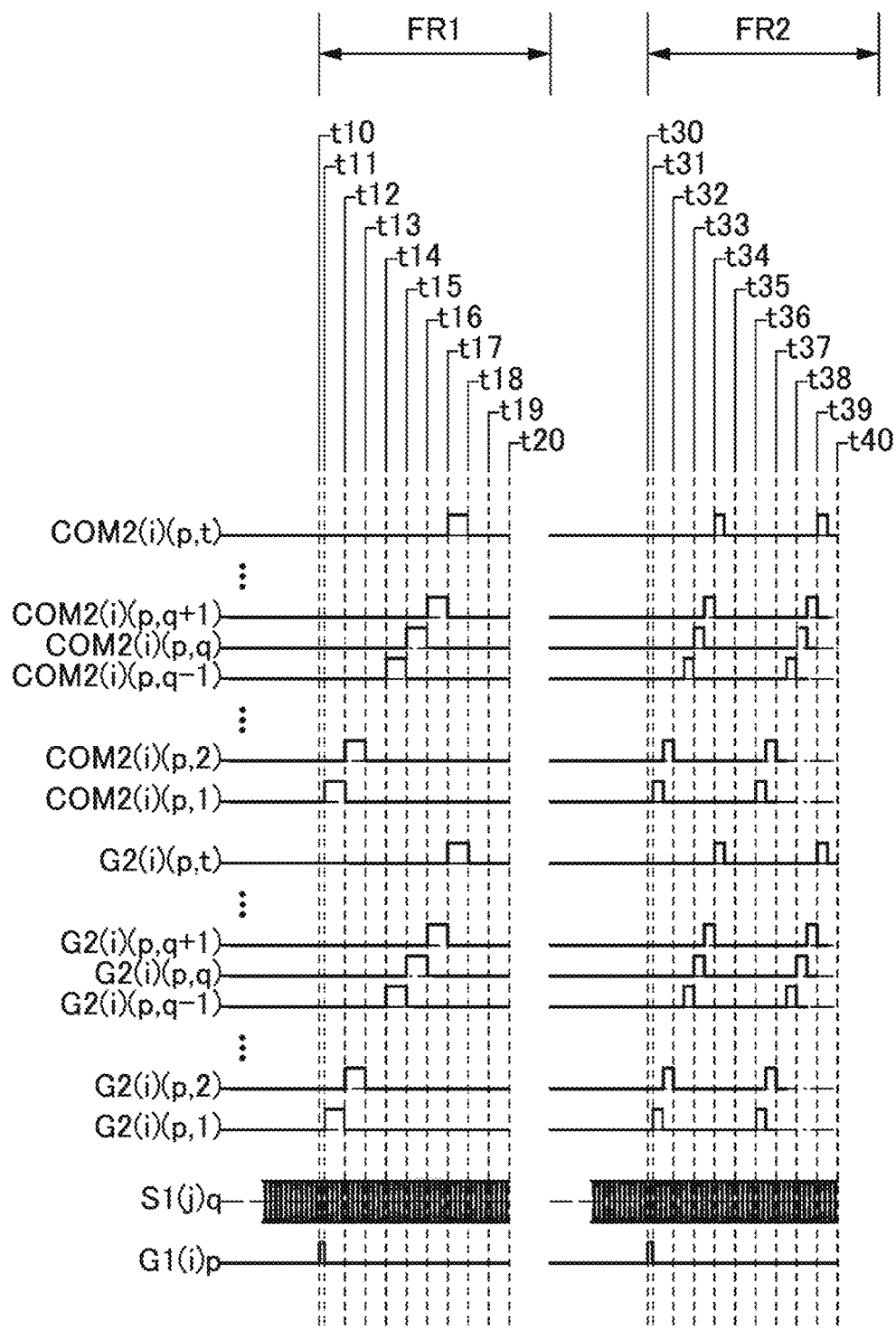
FIG. 5 is a timing chart showing a method for driving a display apparatus of an embodiment.

FIG. 5 is a timing chart showing an operation of the pixel set $703(i,j)$ illustrated in FIG. 2.

Figure 6:
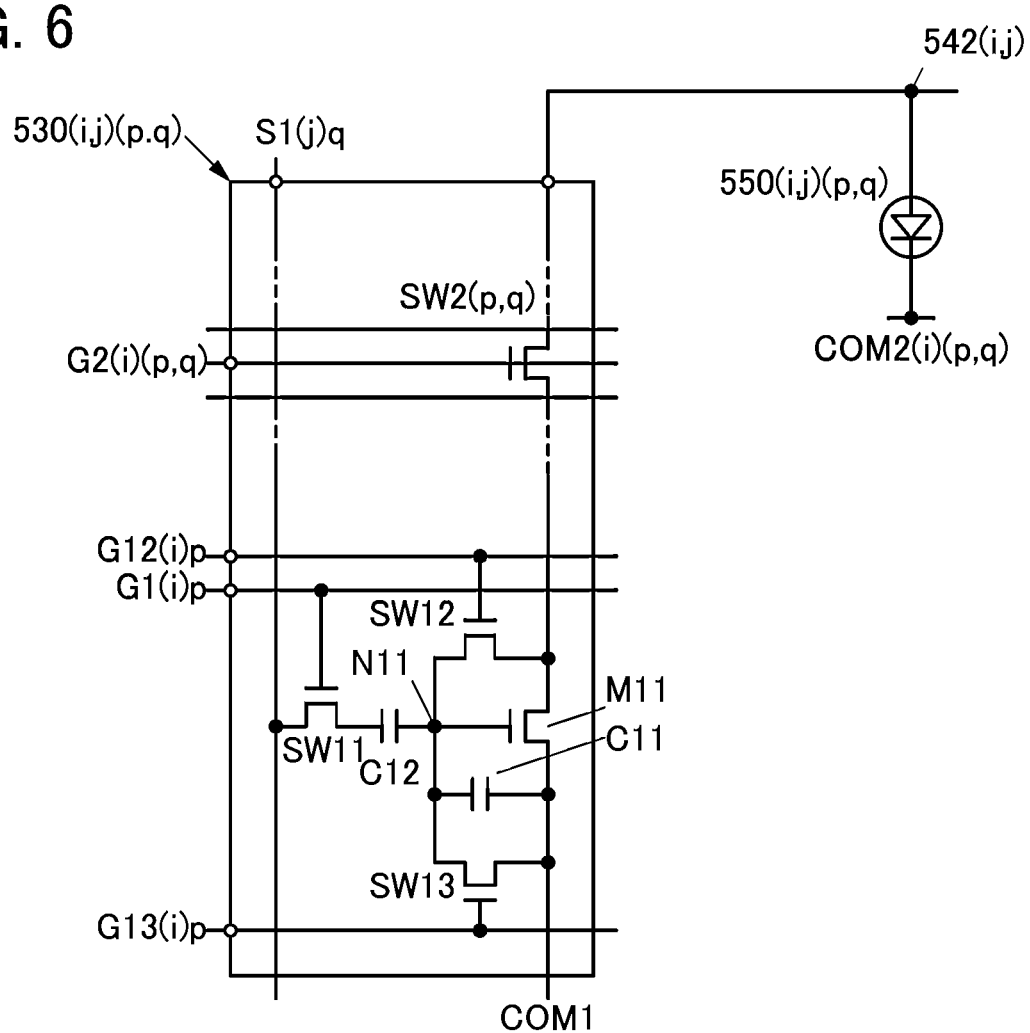
FIG. 6 is a circuit diagram illustrating a structure of a display apparatus of an embodiment.

FIG. 6 is a circuit diagram illustrating a structure of the pixel set $703(i,j)$ that is different from the structure in FIG. 4.

Figure 7:
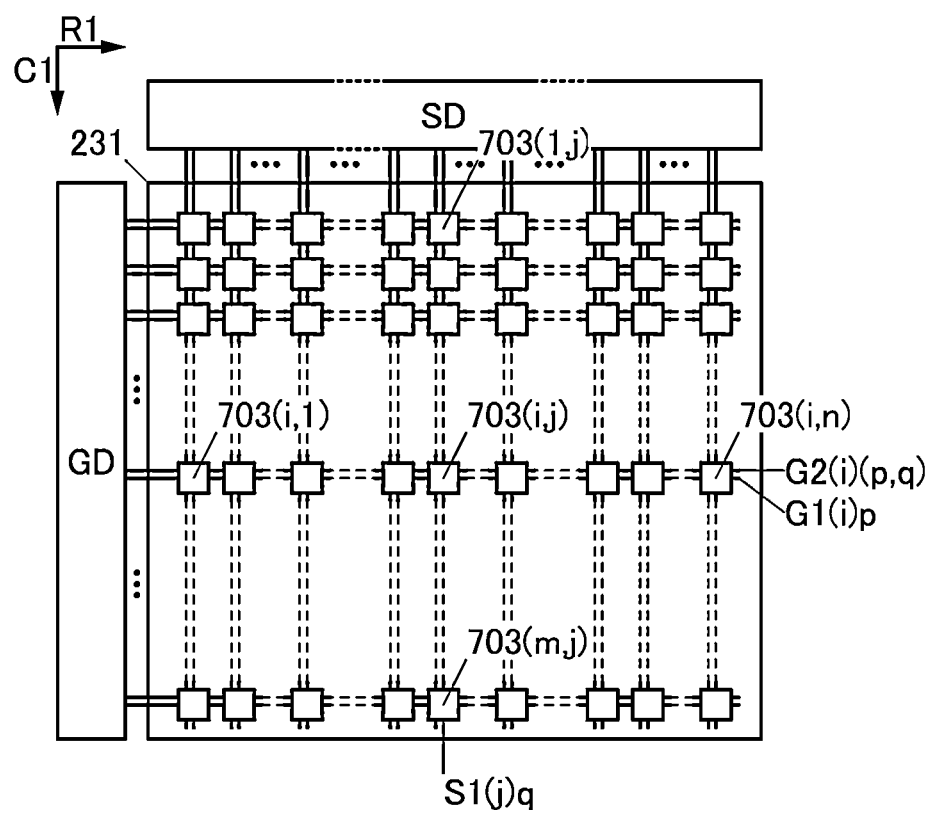
FIG. 7 is a diagram illustrating a structure of a display apparatus of an embodiment.

FIG. 7 is a top view illustrating the structure of the display apparatus of one embodiment of the present invention.

Figure 8A:
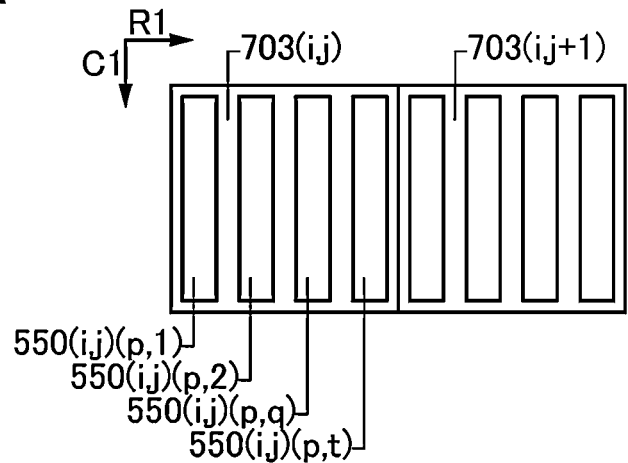
FIG. 8A and FIG. 8B are block diagrams illustrating structures of a display apparatus of an embodiment.
Figure 8B:
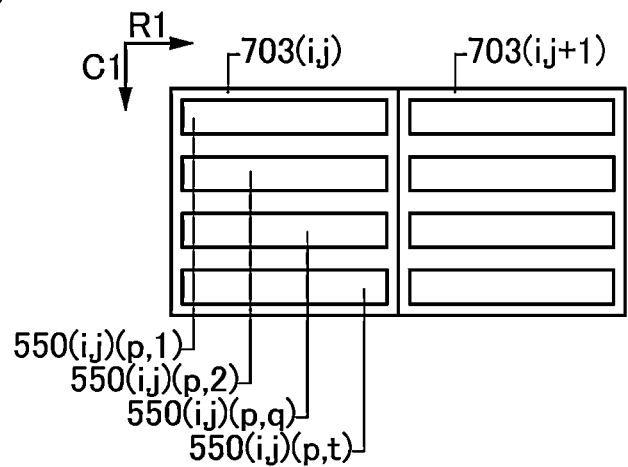

FIG. 8A is a block diagram illustrating a structure of the pixel set $703(i,j)$ illustrated in FIG. 7, and FIG. 8B is a block diagram illustrating a structure of the pixel set $703(i,j)$ that is different from the structure illustrated in FIG. 8A.

Figure 9A:
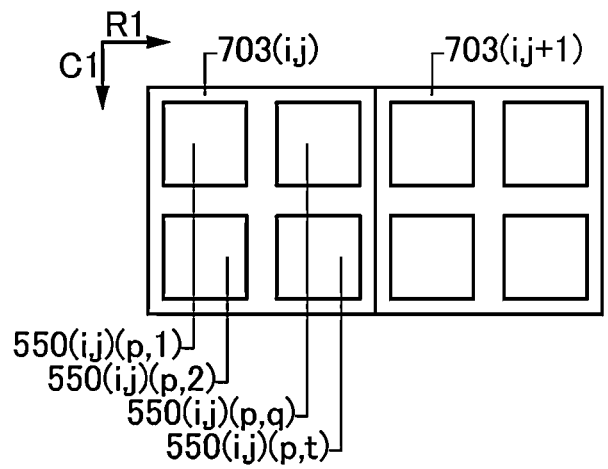
FIG. 9A and FIG. 9B are block diagrams illustrating structures of a display apparatus of an embodiment.
Figure 9B:
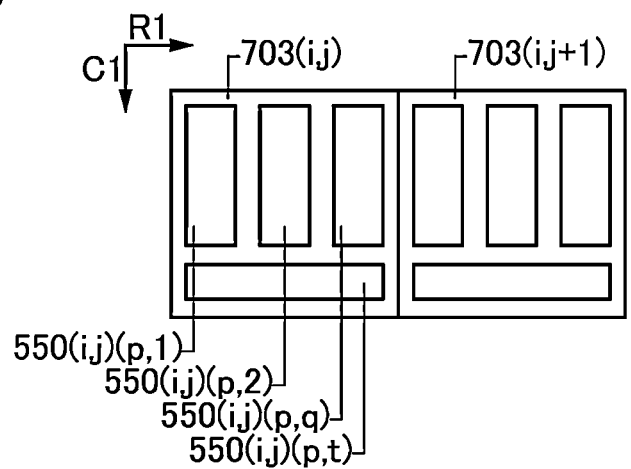

FIG. 9A is a block diagram illustrating the structure of the pixel set $703(i,j)$ illustrated in FIG. 8, and FIG. 9B is a block diagram illustrating a structure of the pixel set $703(i,j)$ that is different from the structure illustrated in FIG. 9A.

Note that in this specification, an integer variable of 1 or more is sometimes used in reference numerals. For example, (p) where p is an integer variable of 1 or more is sometimes used in part of a reference numeral that specifies any of p components at a maximum. For another example, (m,n) where m and n are each an integer variable of 1 or more is sometimes used in part of a reference numeral that specifies any of m×n components at a maximum.

Structure Example 1 of Display Apparatus

A display apparatus 700 of one embodiment of the present invention includes the pixel set 703$(i,j)$, a functional layer 520(1), and a functional layer 520(2) (see FIG. 1A and FIG. 1B). For example, the functional layer 520(1) and the functional layer 520(2) are formed and then bonded to each other, whereby the display apparatus of one embodiment of the present invention can be formed.

Structure Example of Pixel Set 703$(i,j)$

The pixel set 703$(i,j)$ includes a light-emitting device set 550$(i,j)$, a pixel circuit set 530$(i,j)$, a pad 541$(i,j)$, a pad 542$(i,j)$, and a conductive material 543$(i,j)$ (see FIG. 1B and FIG. 3). The light-emitting device set 550$(i,j)$ includes, for example, a light-emitting device 550$(i,j)$(p,1) to a light-emitting device 550$(i,j)$(p,f) (see FIG. 2 and FIG. 3). Specifically, a light-emitting device emitting red light, a light-emitting device emitting green light, and a light-emitting device emitting blue light can be used in the light-emitting device set. The pixel circuit set 530$(i,j)$ includes a pixel circuit 530$(i,j)$(p,1) to a pixel circuit 530$(i,j)$(p,1) (see FIG. 2 and FIG. 3). Note that/is not limited to 3 and is an integer greater than or equal to 1. A metal or a composite material can be used as the conductive material 543, for example. Specifically, a nickel particle or a nickel particle covered with gold can be used as the conductive material 543. Alternatively, a composite material in which a resin is plated with a metal can be used as the conductive material 543. Further alternatively, a composite material in which a metal or a metal-plated resin is covered with an insulating material can be used as the conductive material 543.

Structure Example of Functional Layer 520(1)

The functional layer 520(1) includes the pixel circuit set 530$(i,j)$ and the pad 541$(i,j)$. The pad 541$(i,j)$ is electrically connected to the pixel circuit set 530$(i,j)$.

Structure Example of Functional Layer 520(2)

The functional layer 520(2) overlaps with the functional layer 520(1), and the functional layer 520(2) includes the light-emitting device set 550(*i,j*) and the pad 542(*i,j*). The pad 542(*i,j*) is electrically connected to the light-emitting device set 550(*i,j*). For example, the functional layer 520(2) includes a plurality of light-emitting devices arranged in a matrix. Note that a light-emitting device emitting red light, a light-emitting device emitting green light, and a light-emitting device emitting blue light can be used in the functional layer 520(2). For another example, a plurality of light-emitting devices emitting blue light may be arranged in a matrix and a color conversion layer that converts the blue light into light of another color may be provided directly over the light-emitting devices. An LED, an OLED, or the like can be used as a light-emitting device.

Structural Example of Conductive Material 543(*i,j*)

The conductive material 543(*i,j*) is sandwiched between the pad 541(*i,j*) and the pad 542(*i,j*) and electrically connects the pad 541(*i,j*) and the pad 542(*i,j*). In other words, the conductive material 543(*i,j*) electrically connects the pixel circuit set 530(*i,j*) and the light-emitting device set 550(*i,j*) through the pad 541(*i,j*) and the pad 542(*i,j*).

Thus, the pixel circuit set 530(*i,j*) and the light-emitting device set 550(*i,j*) can be electrically connected to each other using the pad 541(*i,j*), the pad 542(*i,j*), and the conductive material 543(*i,j*). For example, q pixel circuits and q light-emitting devices can be connected to each other using q or fewer pads. Note that q is an integer greater than or equal to 1. Specifically, three pixel circuits and three light-emitting devices can be connected to each other using a pair of pads. The number of connection portions can be reduced, which can inhibit generation of a connection defect. In addition, the proportion of the area for connection with respect to the area occupied by the light-emitting device set 550(*i,j*) can be reduced. In other words, in one embodiment of the present invention, a plurality of pixel circuits that are actively driven and a plurality of light-emitting devices can be connected to each other using a pair of pads, so that the plurality of light-emitting devices can be driven as if they are passively driven. As a result, a novel display apparatus that is highly convenient, useful, or reliable can be provided.

Structure Example 2 of Display Apparatus

The display apparatus of one embodiment of the present invention includes a conductive film COM1 and a conductive film COM2(*i*)(p,q) (see FIG. 3). Note that the conductive film COM1 and the conductive film COM2(*i*)(p,q) each function as a wiring.

The pixel circuit set 530(*i,j*) includes pixel circuits 530(*i,j*)(p,q) and 530(*i,j*)(p,2), and the light-emitting device set 550(*i,j*) includes light-emitting devices 550(*i,j*)(p,q) and 550(*i,j*)(p,2). The pixel set 703(*i,j*) includes a pixel 702(*i,j*)(p,q) (see FIG. 2). For example, the pixel circuit set 530(*i,j*) includes/pixel circuits. Note that/is an integer greater than or equal to 1, and p is an integer greater than or equal to 1 and less than or equal to t.

Structure Example of Pixel 702(*i,j*)(p,q)

The pixel 702(*i,j*)(p,q) includes the pixel circuit 530(*i,j*)(p,q) and the light-emitting device 550(*i,j*)(p,q).

The pixel circuit 530(*i,j*)(p,q) is electrically connected to the conductive film COM1, and the pixel circuit 530(*i,j*)(p,q) is electrically connected to one electrode of the light-emitting device 550(*i,j*)(p,q) during a predetermined period. For example, in the case where the pixel set 703(*i,j*) includes a pixel 702(*i,j*)(p,1) to a pixel 702(*i,j*)(p,1), one of/periods obtained by equally dividing a period during which the pixel set 703(*i,j*) performs display can be regarded as a predetermined period.

The other electrode of the light-emitting device 550(*i,j*)(p,q) is electrically connected to the conductive film COM2(*i*)(p,q), and a predetermined voltage is supplied between the conductive film COM2(*i*)(p,q) and the conductive film COM1 in the predetermined period. For example, voltage at which the light-emitting device 550(*i,j*)(p,q) is driven at the maximum luminance can be used as the predetermined voltage. Note that the pixel circuit 530(*i,j*)(p,q) controls voltage to be distributed to the light-emitting device 550(*i,j*)(p,q) from the predetermined voltage. In a period other than the predetermined period, voltage at which the light-emitting device 550(*i,j*)(p,q) does not emit light is supplied to the conductive film COM2(*i*)(p,q).

Thus, for example, the light-emitting device 550(*i,j*)(p,q) can be selected, and the light-emitting device can be driven using the pixel circuit 530(*i,j*)(p,q). Furthermore, the pixel circuit 530(*i,j*)(p,q) can be selected to drive the light-emitting device 550(*i,j*)(p,q) in the predetermined period. Moreover, the pixel set 703(*i,j*) can be driven in a plurality of periods. As a result, a novel display apparatus that is highly convenient, useful, or reliable can be provided.

Structure Example 3 of Display Apparatus

The display apparatus of one embodiment of the present invention includes a conductive film S1(*j*)q, a conductive film G1(*i*)p, and a conductive film G2(*i*)(p,q) (see FIG. 4). Note that the conductive film S1(*j*)q, the conductive film S1(*j*)q-1, the conductive film G1(*i*)p, and the conductive film G2(*i*)(p,q) each function as a wiring.

Structure Example of Pixel Circuit 530(*i,j*)(p,q)

The pixel circuit 530(*i,j*)(p,q) includes a switch SW2(*p,q*), a switch SW11, a transistor M11, a capacitor C11, and a node N11.

The switch SW11 includes a first terminal electrically connected to the conductive film S1(*j*)q and a second terminal electrically connected to the node N11, and has a function of controlling its on/off state on the basis of the potential of the conductive film G1(*i*)p.

The transistor M11 includes a gate electrode electrically connected to the node N11 and a first electrode electrically connected to the conductive film COM1.

The capacitor C11 includes a conductive film electrically connected to the node N11 and a conductive film electrically connected to the conductive film COM1.

The switch SW2(*p,q*) includes a first terminal electrically connected to a second electrode of the transistor M11 and a second terminal electrically connected to the pad 541(*i,j*), and has a function of controlling its on/off state on the basis of the potential of the conductive film G2(*i*)(p,q).

The pixel circuit set 530(*i,j*) includes the pixel circuit 530(*i,j*)(p,1) to the pixel circuit 530(*i,j*)(p,t) and is electrically connected to the pad 541(*i,j*) through any one of a switch SW2(*p*,1) to a switch SW2(*p,t*). The switch SW2(*p*,1) to the switch SW2(*p,f*) have a function of selecting any one of the pixel circuit 530(*i,j*)(p,1) to the pixel circuit 530(*i,j*)(p,f) and establishing electrical continuity between the selected pixel circuit and the pad 541(*i,j*). Note that the switch SW2(*p*,1) to the switch SW2(*p,t*) include a switch SW2(*p,q*+1).

Note that the illustrated circuits are examples of a circuit that can be used as the pixel circuit 530($i,j$)(p,q), and the structure is not limited thereto. For example, a circuit illustrated in FIG. 6 can be used as part of the pixel circuit 530($i,j$)(p,q). Specifically, a switch SW12, a switch SW13, and a capacitor C12 can be used in the pixel circuit 530($i, j$)(p,q). The display apparatus includes a conductive film G12($i$)p and a conductive film G13($i$)p that are electrically connected to the pixel circuit 530($i,j$)(p,q). The switch SW12 includes a first terminal electrically connected to the node N11 and a second terminal electrically connected to the first electrode of the transistor M11, and has a function of controlling its on/off state on the basis of the potential of the conductive film G12($i$)p. The switch SW13 includes a first terminal electrically connected to the node N11 and a second terminal electrically connected to the conductive film COM1, and has a function of controlling its on/off state on the basis of the potential of the conductive film G13($i$)p. The capacitor C12 includes a conductive film connected to the second terminal of the switch SW11 and a conductive film electrically connected to the node N11.

Structure Example 4 of Display Apparatus

The display apparatus of one embodiment of the present invention includes a driver circuit GD (see FIG. 1B).

Structure Example of Driver Circuit GD

The driver circuit GD supplies a first selection signal to the conductive film G1($i$)p. The pixel circuit 530($i,j$)(p,1) to the pixel circuit 530($i,j$)(p,t) that are electrically connected to the conductive film G1($i$)p can obtain, for example, an image signal from any one of a conductive film S1($j$)1 to a conductive film S1($j$)/on the basis of the first selection signal (see FIG. 3).

The driver circuit GD supplies a second selection signal to the conductive film G2($i$)(p,q). Electrical continuity is established between the pad 541($i,j$) and the pixel circuit 530($i,j$)(p,q) electrically connected to the conductive film G2($i$)(p,q) on the basis of the second selection signal. Note that the driver circuit GD selects one of the conductive film G2($i$)(p,1) to the conductive film G2($i$)(p,1) in a predetermined order and supplies the second selection signal in the predetermined period.

The driver circuit GD controls the potential of the conductive film COM2($i$)(p,q). The potential of the conductive film COM2($i$)(p,q) is controlled such that the predetermined voltage is applied between the conductive film COM1 and the conductive film COM2($i$)(p,q) in a period during which the second selection signal is supplied to the conductive film G2($i$)(p,q). For example, the potential of the conductive film COM2($i$)(p,q) is controlled such that voltage at which the light-emitting device 550($i,j$)(p,q) is driven at the maximum luminance is applied. Note that the driver circuit GD selects one of the conductive film COM2($i$)(p,1) to the conductive film COM2($i$)(p,t) in the predetermined order and controls the potential such that the predetermined voltage is applied in the predetermined period. The potentials of the conductive film COM2($i$)(p,1) to the conductive film COM2($i$)(p,f) are controlled to be potentials at which the light-emitting device does not emit light in a period other than the predetermined period.

Structure Example 5 of Display Apparatus

The display apparatus of one embodiment of the present invention includes a pad 541($i$)(p,q), a pad 542($i$)(p,q), and a conductive material 543($i$)(p,q) (see FIG. 1B).

The pad 541($i$)(p,q) is electrically connected to the driver circuit GD, and the pad 542($i$)(p,q) is electrically connected to the conductive film COM2($i$)(p,q), for example. The conductive material 543($i$)(p,q) is sandwiched between the pad 541($i$)(p,q) and the pad 542($i$)(p,q) and electrically connects the pad 541($i$)(p,q) and the pad 542($i$)(p,q).

Thus, the potential of the conductive film COM2($i$)(p,q) can be controlled using the driver circuit GD.

Driving Method Example 1 of Display Apparatus

A method for driving the display apparatus of one embodiment of the present invention will be described. Specifically, the method for driving the display apparatus is described using the operations of a pixel 702($i,j$)(p,q−1), the pixel 702($i,j$)(p,q), and a pixel 702($i,j$)(p,q+1) included in the pixel set 703($i,j$) (see FIG. 4 and FIG. 5).
[First Step]
In a period from Time t10 to Time t11, the first selection signal is supplied to the conductive film G1($i$)p (see FIG. 5).
The pixel circuit 530($i,j$)(p,1) to the pixel circuit 530($i,j$)(p,t) included in the pixel circuit set 530($i,j$) obtain image signals on the basis of the first selection signal.
For example, the pixel circuit 530($i,j$)(p,q) obtains an image signal from the conductive film S1($j$)q.
[Second Step]
In a period from Time t11 to Time t18, one of the conductive film G2($i$)(p,1) to the conductive film G2($i$)(p,t) is selected in the predetermined order and the second selection signal is supplied. In addition, one of the conductive film COM2($i$)(p,1) to the conductive film COM2($i$)(p,t) is selected in the predetermined order and a predetermined potential is supplied. Note that the conductive film G2($i$)(p, 1) to the conductive film G2($i$)(p,t) include a conductive film G2($i$)(p+1,1).
The pixel circuit 530($i,j$)(p,1) to the pixel circuit 530($i,j$)(p,t) included in the pixel circuit set 530($i,j$) control the potential of the pad 541($i,j$) on the basis of the obtained image signal and the second selection signal.
[Operation of Pixel 702($i,j$)(p,q−1) in Second Step]
In a period from Time t14 to Time t15, for example, the pixel circuit 530($i,j$)(p,q−1) is supplied with the second selection signal from the conductive film G2($i$)(p,q−1) and controls the potential of the pad 541($i,j$) on the basis of the obtained image signal.
In the period from Time t14 to Time t15, the predetermined potential is supplied to the conductive film COM2($i$) (p,q−1).
Thus, in the period from Time t14 to Time t15, the light-emitting device 550($i,j$)(p,q−1) performs display at a predetermined luminance on the basis of the potential difference between the pad 541($i,j$) and the conductive film COM2($i$)(p,q−1).
[Operation of Pixel 702($i,j$)(p,q) in Second Step] In a period from Time t15 to Time t16, for example, the pixel circuit 530($i,j$)(p,q) is supplied with the selection signal from the conductive film G2($i$)(p,q) and controls the potential of the pad 541($i,j$) on the basis of the obtained image signal. In the period from Time t15 to Time t16, the predetermined potential is supplied to the conductive film COM2($i$)(p,q). Thus, in the period from Time t15 to Time t16, the light-emitting device 550($i,j$)(p,q) performs display at the predetermined luminance on the basis of the potential difference between the pad 541($i,j$) and the conductive film COM2($i$)(p,q).
[Operation of Pixel 702($i,j$)(p,q+1) in Second Step]
In a period from Time t16 to Time t17, for example, the pixel circuit 530($i,j$)p+1 is supplied with the selection signal from the conductive film G2($i$)(p,q+1) and controls the potential of the pad 541($i,j$) on the basis of the obtained image signal. In the period from Time t16 to Time t17, the predetermined potential is supplied to the conductive film COM2($i$)(p,q+1). Thus, in the period from Time t16 to Time t17, the light-emitting device 550($i,j$)(p,q+1) performs display at the predetermined luminance on the basis of the potential difference between the pad 541($i,j$) and the conductive film COM2($i$)(p,q+1).

[Third Step]

In a period from Time t18 to Time t20, potentials at which the switch SW2($p$,1) to the switch SW2($p,t$) are turned off are supplied to the conductive film G2($i$)(p,1) to the conductive film G2($i$)(p,f). In addition, potentials at which the light-emitting device 550($i,j$)(p,1) to the light-emitting device 550($i,j$)(p,t) are brought into a non-light-emitting state are supplied to the conductive film COM2($i$)(p,1) to the conductive film COM2($i$)(p,t).

Note that a period FR1 in the drawing corresponds to one frame period. Thus, the display apparatus of one embodiment of the present invention is capable of duty driving.

Driving Method Example 2 of Display Apparatus

The display apparatus of one embodiment of the present invention can be driven by a method different from that in Driving method 1. Driving method example 2 is different from Driving method 1 in that display is performed in a plurality of steps in one frame period from Time t30 to Time t40. Different portions will be described in detail here, and the above description is referred to for portions that have similar structures.

[First Step]

In a period from Time t30 to Time t31, the first selection signal is supplied to the conductive film G1($i$)p (see FIG. 5).

The pixel circuit 530($i,j$)(p,1) to the pixel circuit 530($i,j$)(p,t) included in the pixel circuit set 530($i,j$) obtain image signals on the basis of the first selection signal.

[Second Step]

In a period from Time t31 to Time t35, one of the conductive film G2($i$)(p,1) to the conductive film G2($i$)(p,t) is selected in the predetermined order and the second selection signal is supplied. In addition, one of the conductive film COM2($i$)(p,1) to the conductive film COM2($i$)(p,t) is selected in the predetermined order and the predetermined potential is supplied. The pixel circuit 530($i,j$)(p,1) to the pixel circuit 530($i,j$)(p,t) included in the pixel circuit set 530($i,j$) control the potential of the pad 541($i,j$) on the basis of the obtained image signal and the second selection signal.

[Third Step]

In a period from Time t36 to Time t40, one of the conductive film G2($i$)(p,1) to the conductive film G2($i$)(p,t) is selected in the predetermined order and the second selection signal is supplied. In addition, one of the conductive film COM2($i$)(p,1) to the conductive film COM2($i$)(p,t) is selected in the predetermined order and the predetermined potential is supplied. The pixel circuit 530($i,j$)(p,1) to the pixel circuit 530($i,j$)(p,t) included in the pixel circuit set 530($i,j$) control the potential of the pad 541($i,j$) on the basis of the obtained image signal and the second selection signal.

Note that a period FR2 in the drawing corresponds to one frame period. Thus, the pixels in the display apparatus of one embodiment of the present invention can perform display twice in one frame period. For example, it is possible to inhibit occurrence of a color breaking phenomenon.

Structure Example 5 of Display Apparatus

The display apparatus of one embodiment of the present invention includes a functional layer 520(3) (see FIG. 1B).

The functional layer 520(3) includes a region where the functional layer 520(1) is sandwiched between the functional layer 520(3) and the functional layer 520(2). In other words, the functional layer 520(3), the functional layer 520(1), and the functional layer 520(2) are stacked.

The functional layer 520(3) includes a driver circuit SD, and the driver circuit SD supplies an image signal to the conductive film S1($j$)q. The functional layer 520(3) includes a terminal 519B.

Thus, the image signal to be displayed on the display apparatus can be generated without a size increase of the external shape of the display apparatus. In addition, the driver circuit SD and the pixel circuit set 530($i,j$) provided directly thereover can be electrically connected to each other. As a result, a novel display apparatus that is highly convenient, useful, or reliable can be provided.

Structure Example 6 of Display Apparatus

The display apparatus of one embodiment of the present invention includes a region 231 (see FIG. 7). The region 231 includes a group of pixel sets 703($i$,1) to 703($i,n$) and a different group of pixel sets 703(1,$j$) to 703($m,j$). In other words, the region 231 includes a group of pixel circuit sets 530($i$,1) to 530($i,n$) and a different group of pixel circuit sets 530(1,$j$) to 530($m,j$). Note that m is an integer greater than or equal to 1, and i is an integer greater than or equal to 1 and less than or equal to m. Furthermore, n is an integer greater than or equal to 1, and j is an integer greater than or equal to 1 and less than or equal to n.

The group of pixel circuit sets 530($i$,1) to 530($i,n$) are arranged in the row direction (the direction indicated by an arrow RI in the drawing), the group of pixel circuit sets 530($i$,1) to 530($i,n$) include the pixel circuit set 530($i,j$), and the group of pixel circuit sets 530($i$,1) to 530($i,n$) are electrically connected to the conductive film G1($i$)p.

The different group of pixel circuit sets 530(1,$j$) to 530($m,j$) are arranged in the column direction intersecting with the row direction (the direction indicated by an arrow Cl in the drawing), and the different group of pixel circuit sets 530(1,$j$) to 530($m,j$) include the pixel circuit set 530($i,j$). The different group of pixel circuit sets 530(1,$j$) to 530($m,j$) are electrically connected to the conductive film S1($j$)q.

Structure Example 7 of Display Apparatus

In the display apparatus of one embodiment of the present invention, the light-emitting device set 550($i,j$) includes the light-emitting device 550($i,j$)(p,1) to the light-emitting device 550($i,j$)(p,t) (see FIG. 8A). Note that the light-emitting device 550($i,j$)(p,1) to the light-emitting device 550($i,j$)(p,t) are arranged in the row direction.

Structure Example 8 of Display Apparatus

In the display apparatus of one embodiment of the present invention, the light-emitting device set 550($i,j$) includes the light-emitting device 550($i,j$)(p,1) to the light-emitting device 550($i,j$)(p,t), and the light-emitting device 550($i,j$)(p,1) to the light-emitting device 550($i,j$)(p,t) may be arranged in the column direction (see FIG. 8B).

Structure Example 9 of Display Apparatus

In the display apparatus of one embodiment of the present invention, the light-emitting device set 550($i,j$) includes the light-emitting device 550($i,j$)(p,1) to the light-emitting device 550(*i,j*)(p,t), and the light-emitting device 550(*i,j*)(p, 1) to the light-emitting device 550(*i,j*)(p,t) may be arranged in a matrix (see FIG. 9A and FIG. 9B).

This embodiment can be combined with the description of the other embodiments as appropriate.

Embodiment 2

In this embodiment, structures of the display apparatus of one embodiment of the present invention will be described with reference to FIG. 10 to FIG. 29.

Figure 10A:
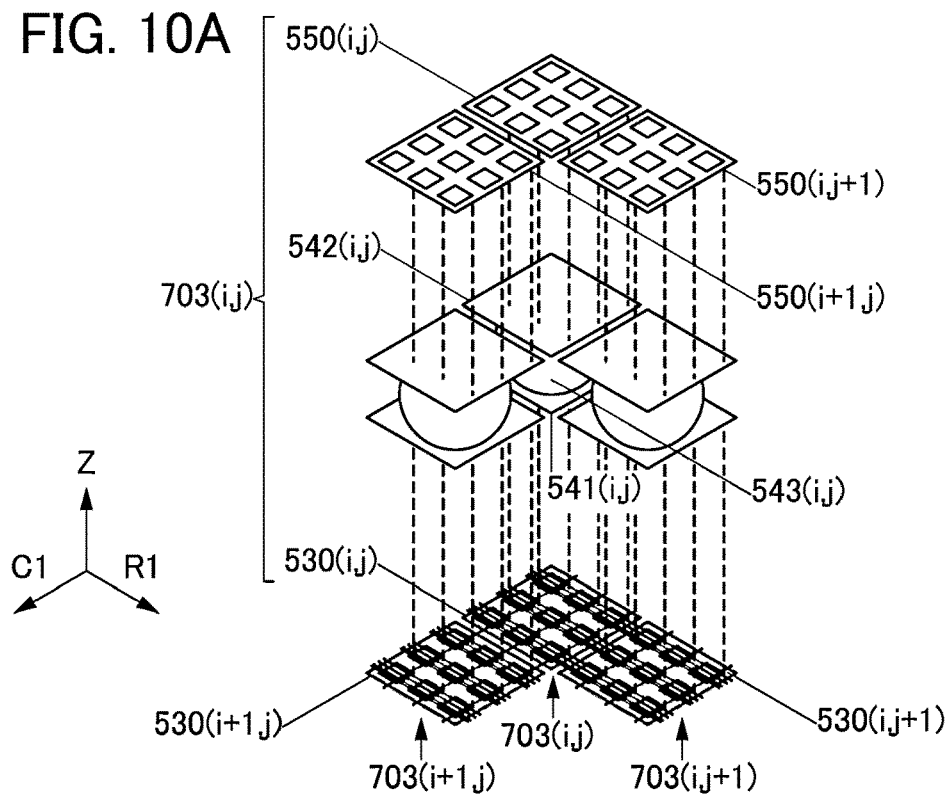
FIG. 10A and FIG. 10B are diagrams illustrating a structure of a display apparatus of an embodiment.
Figure 10B:
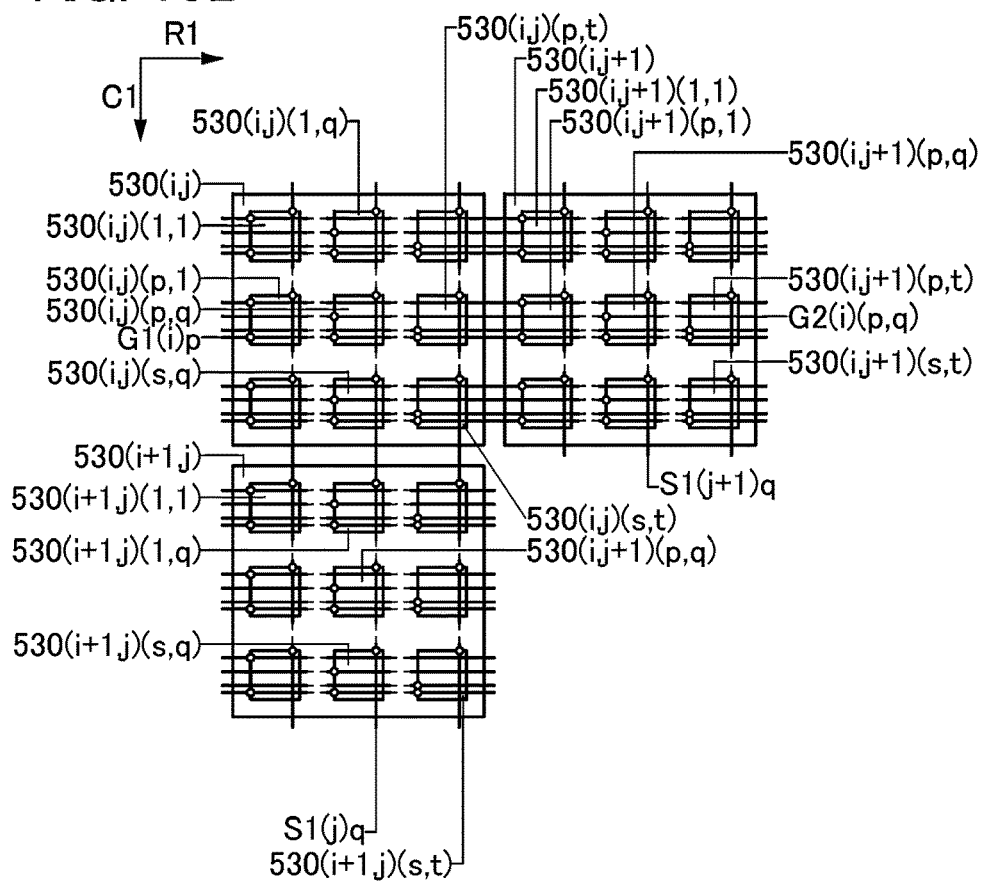

FIG. 10A is a perspective view illustrating a structure of the display apparatus of one embodiment of the present invention, and FIG. 10B is a top view illustrating part of the display apparatus of one embodiment of the present invention illustrated in FIG. 10A.

Figure 11A:
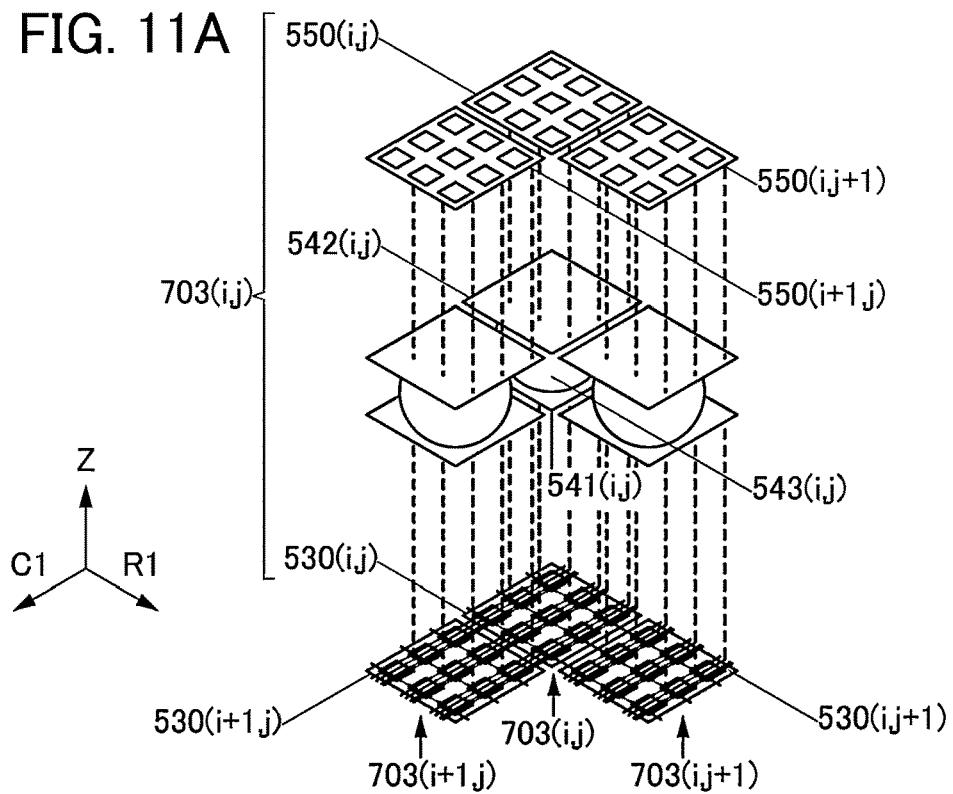
FIG. 11A and FIG. 11B are diagrams illustrating a structure of a display apparatus of an embodiment.
Figure 11B:
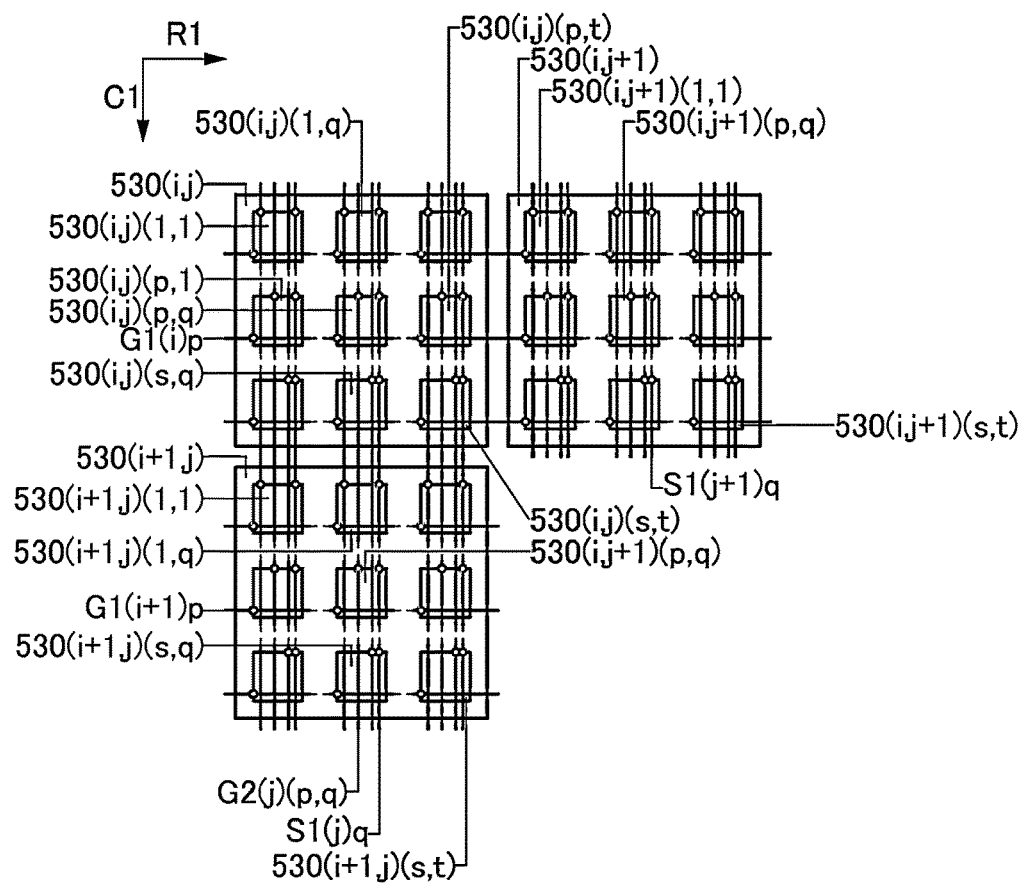

FIG. 11A is a perspective view illustrating a structure of the display apparatus of one embodiment of the present invention, and FIG. 11B is a top view illustrating part of the display apparatus of one embodiment of the present invention illustrated in FIG. 11A.

Figure 12A:
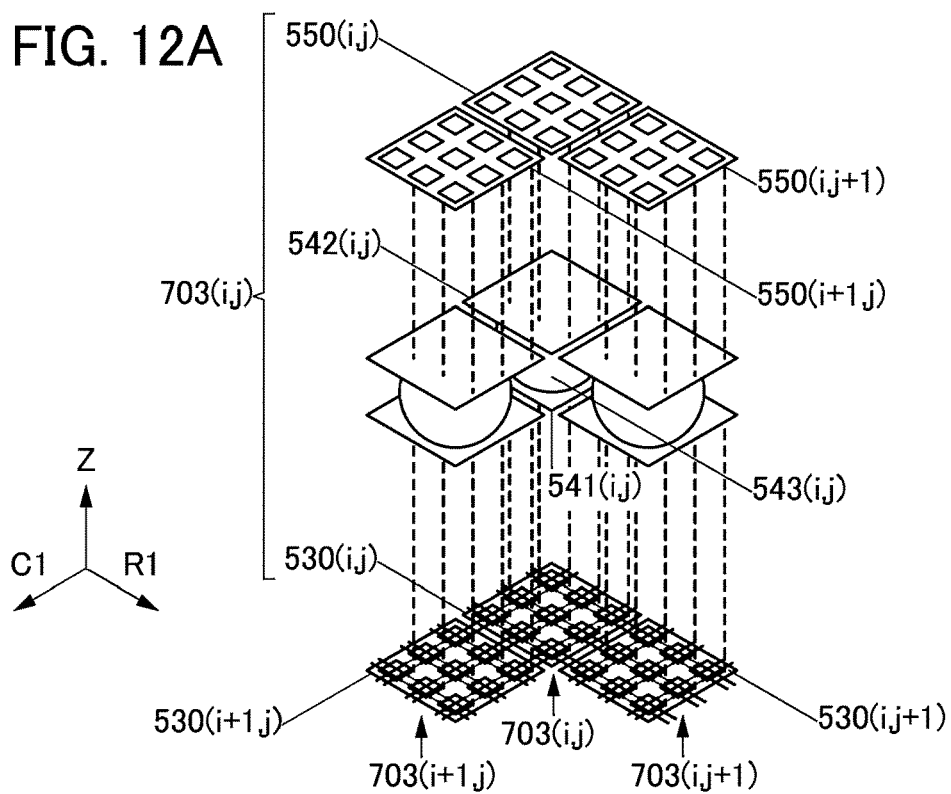
FIG. 12A and FIG. 12B are diagrams illustrating a structure of a display apparatus of an embodiment.
Figure 12B:
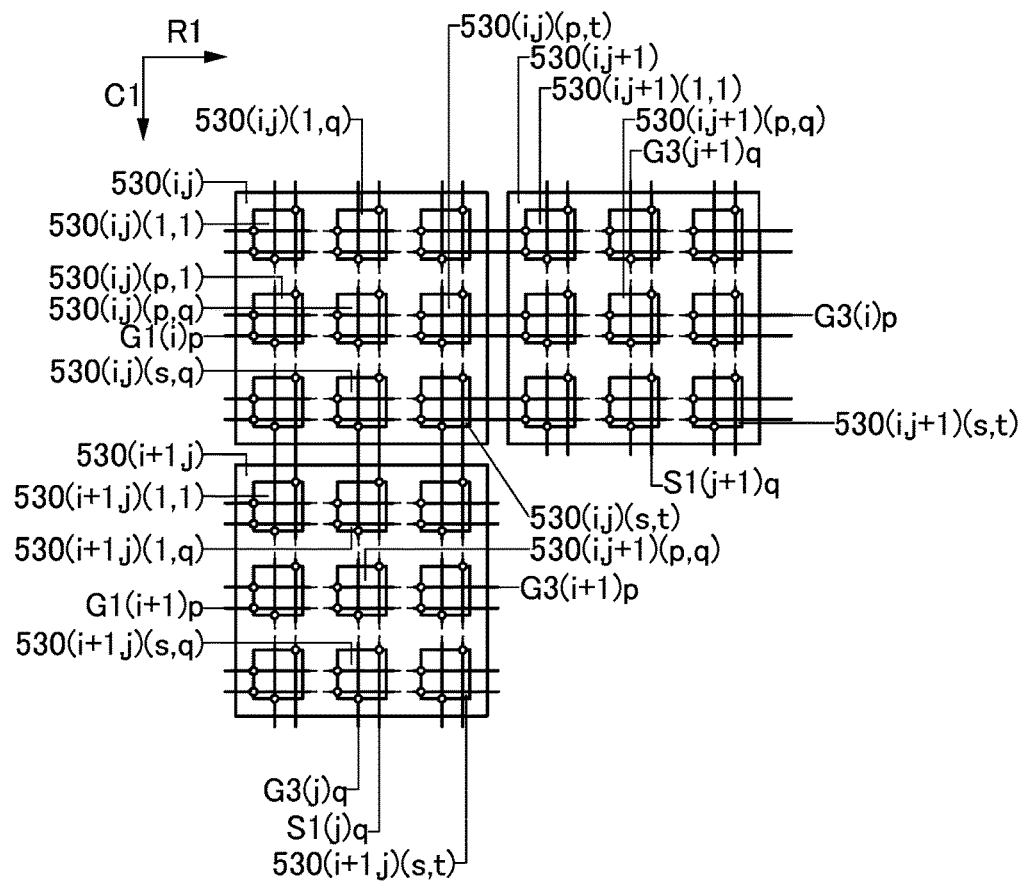

FIG. 12A is a perspective view illustrating a structure of the display apparatus of one embodiment of the present invention, and FIG. 12B is a top view illustrating part of the display apparatus of one embodiment of the present invention illustrated in FIG. 12A.

Figure 13A:
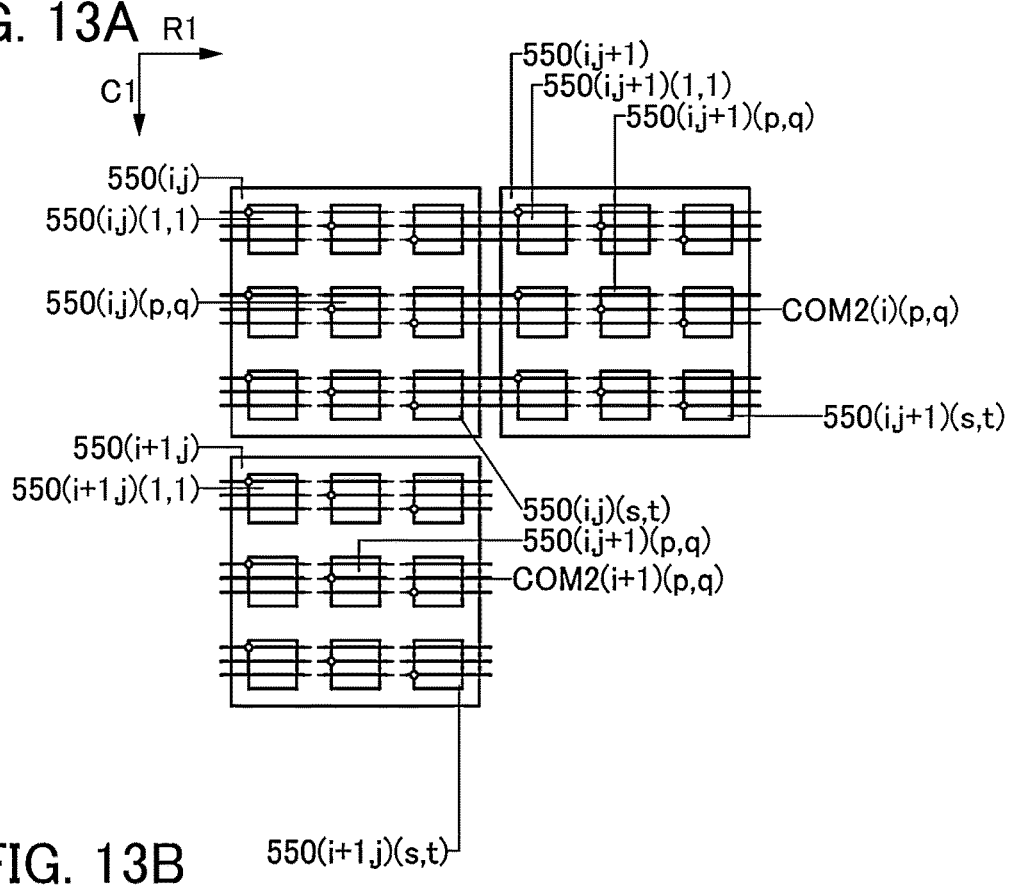
FIG. 13A and FIG. 13B are diagrams illustrating structures of a display apparatus of an embodiment.
Figure 13B:
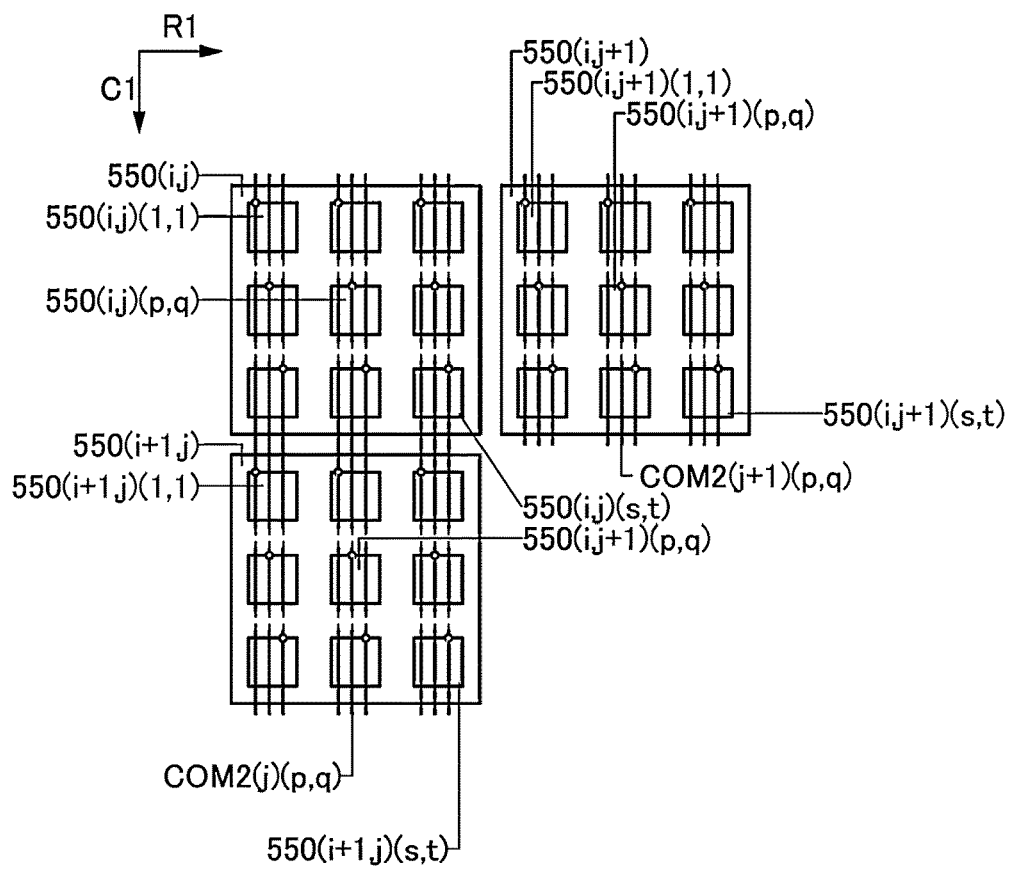

FIG. 13A is a top view illustrating a structure of the display apparatus of one embodiment of the present invention, and FIG. 13B is a top view illustrating a structure of the display apparatus of one embodiment of the present invention that is different from the structure illustrated in FIG. 13A.

Figure 14A:
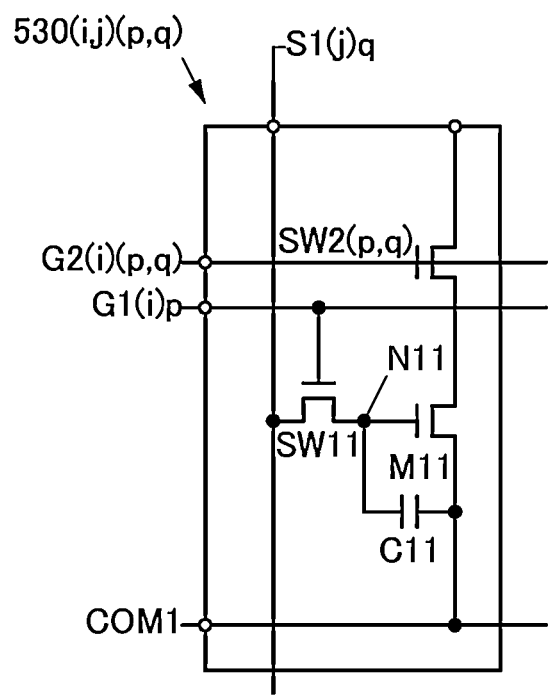
FIG. 14A and FIG. 14B are diagrams illustrating a structure of a display apparatus of an embodiment.
Figure 14B:
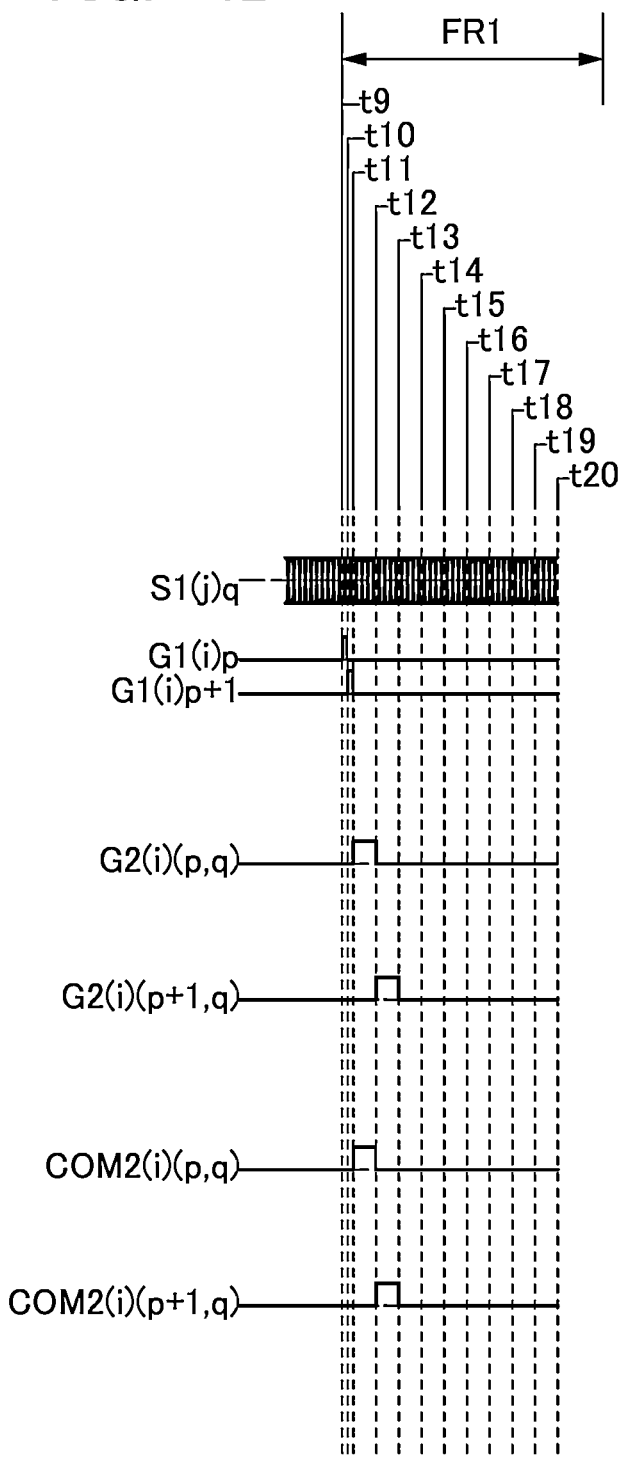

FIG. 14A is a circuit diagram illustrating a pixel circuit that can be used in the display apparatus of one embodiment of the present invention, and FIG. 14B is a timing chart showing the operation of the pixel circuit illustrated in FIG. 14A.

Figure 15:
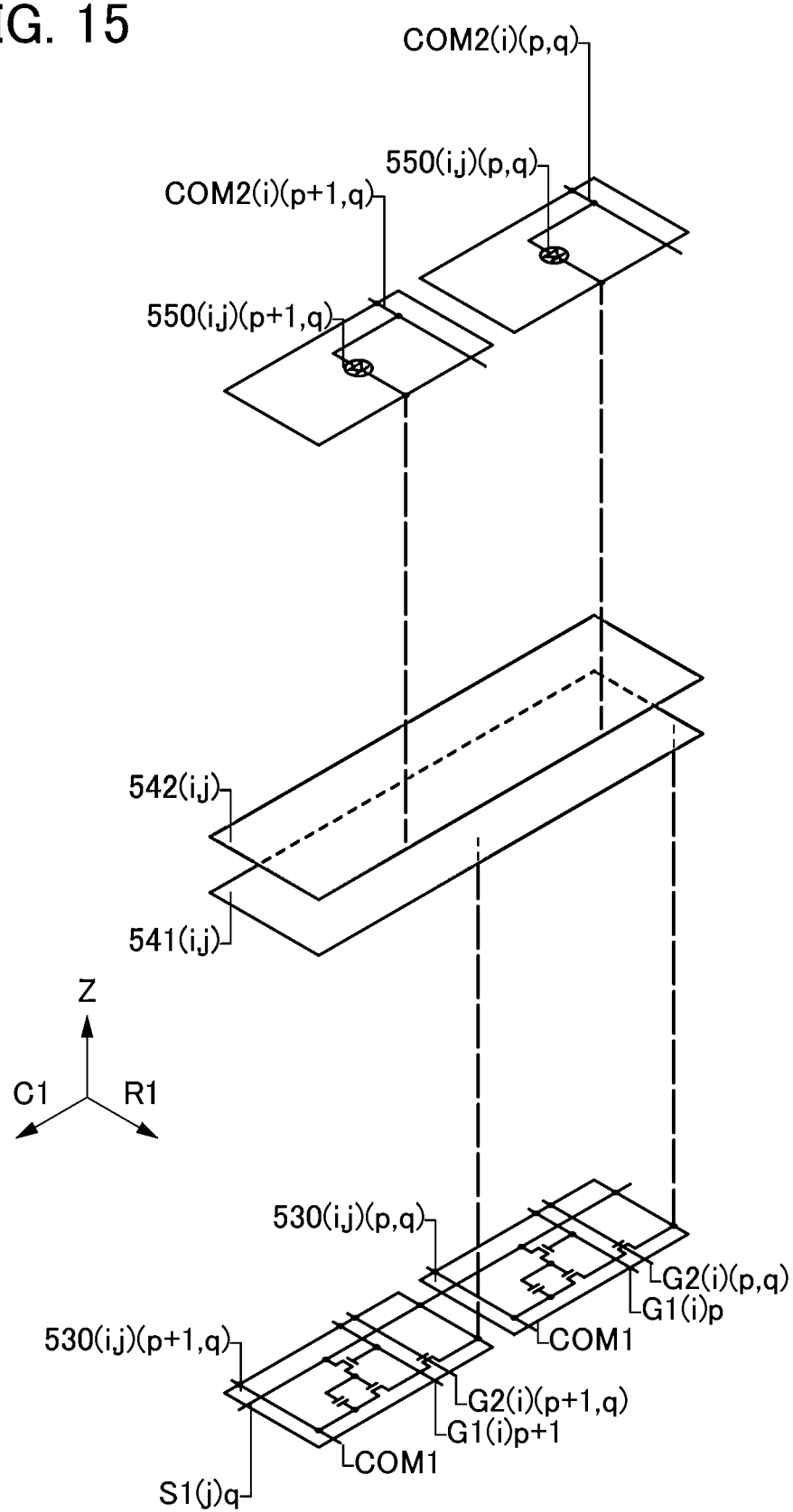
FIG. 15 is a diagram illustrating a structure of a display apparatus of an embodiment.

FIG. 15 is a perspective view illustrating a structure of a pixel set that can be used in the display apparatus of one embodiment of the present invention.

Figure 16:
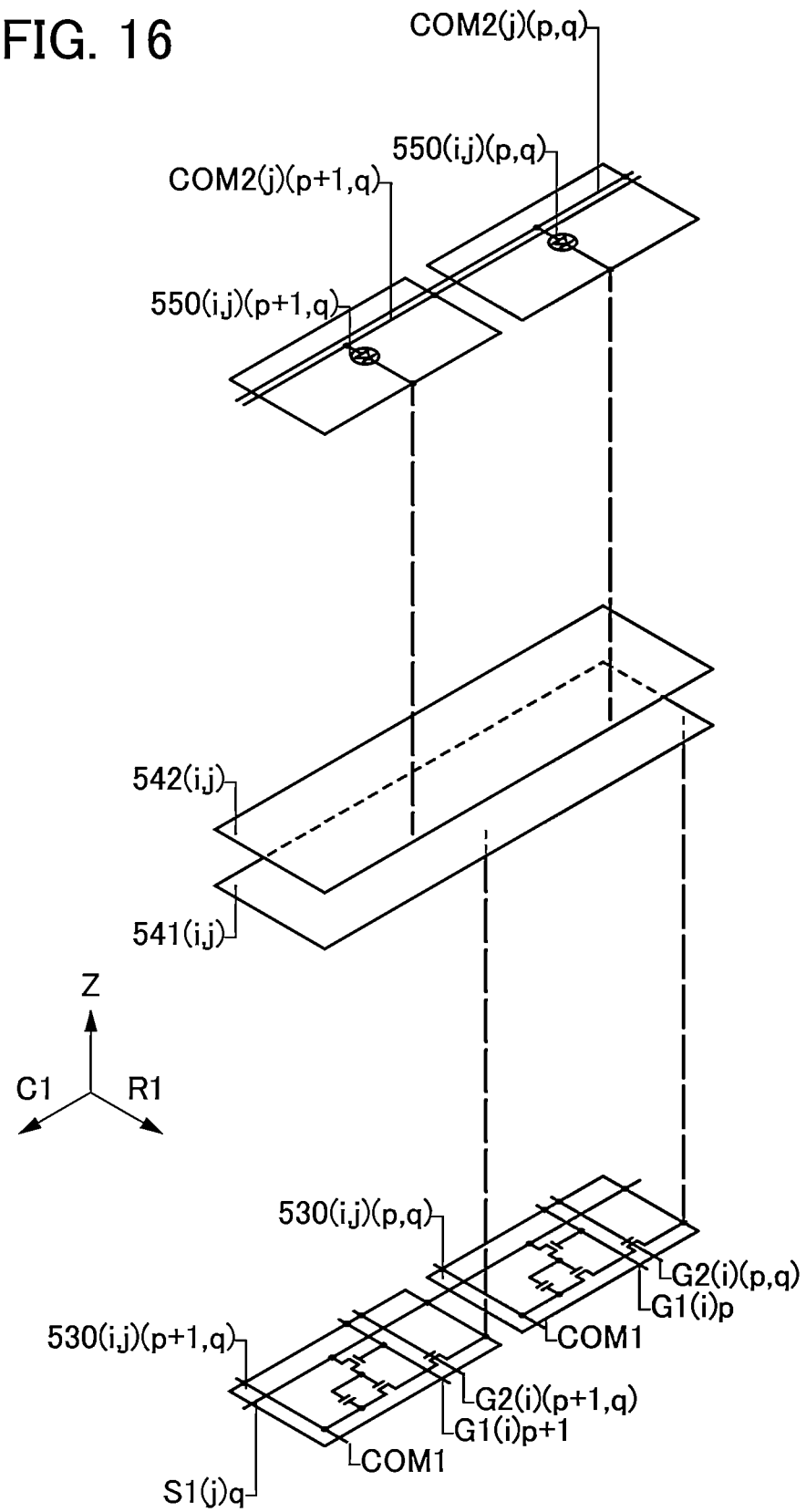
FIG. 16 is a diagram illustrating a structure of a display apparatus of an embodiment.

FIG. 16 is a perspective view illustrating a structure of the pixel set that is different from the structure illustrated in FIG. 15.

Figure 17A:
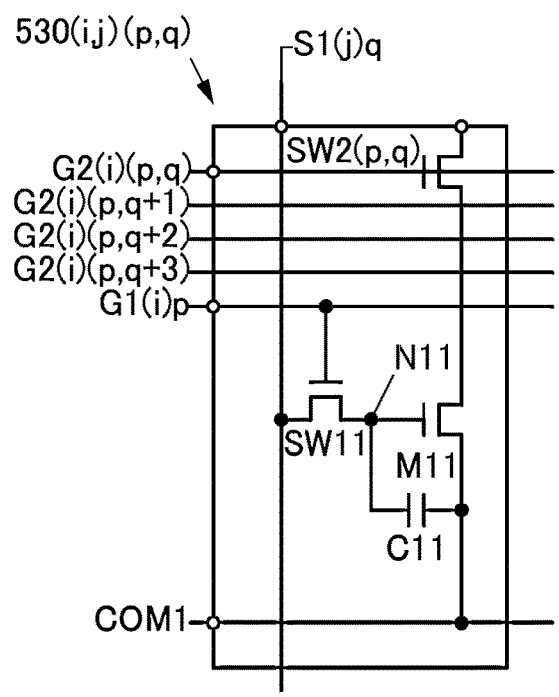
FIG. 17A and FIG. 17B are diagrams illustrating a structure of a display apparatus of an embodiment.
Figure 17B:
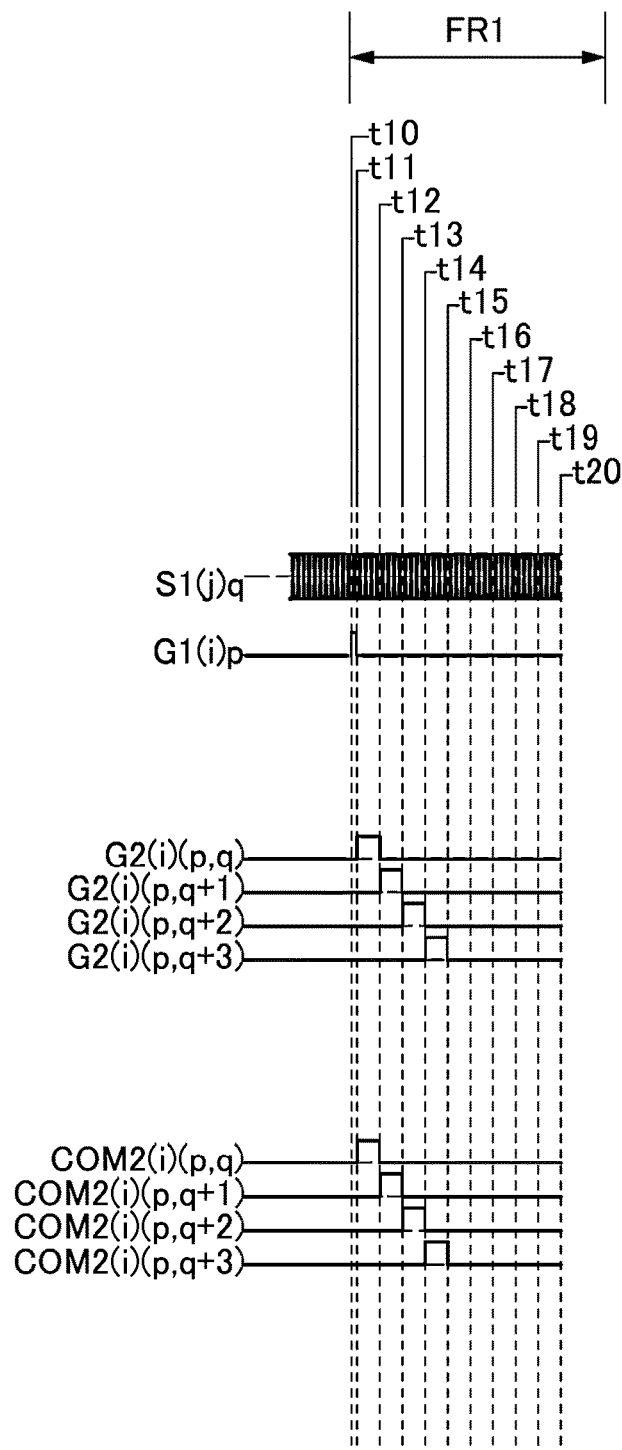

FIG. 17A is a circuit diagram illustrating a pixel circuit that can be used in the display apparatus of one embodiment of the present invention, and FIG. 17B is a timing chart showing the operation of the pixel circuit illustrated in FIG. 17A.

Figure 18:
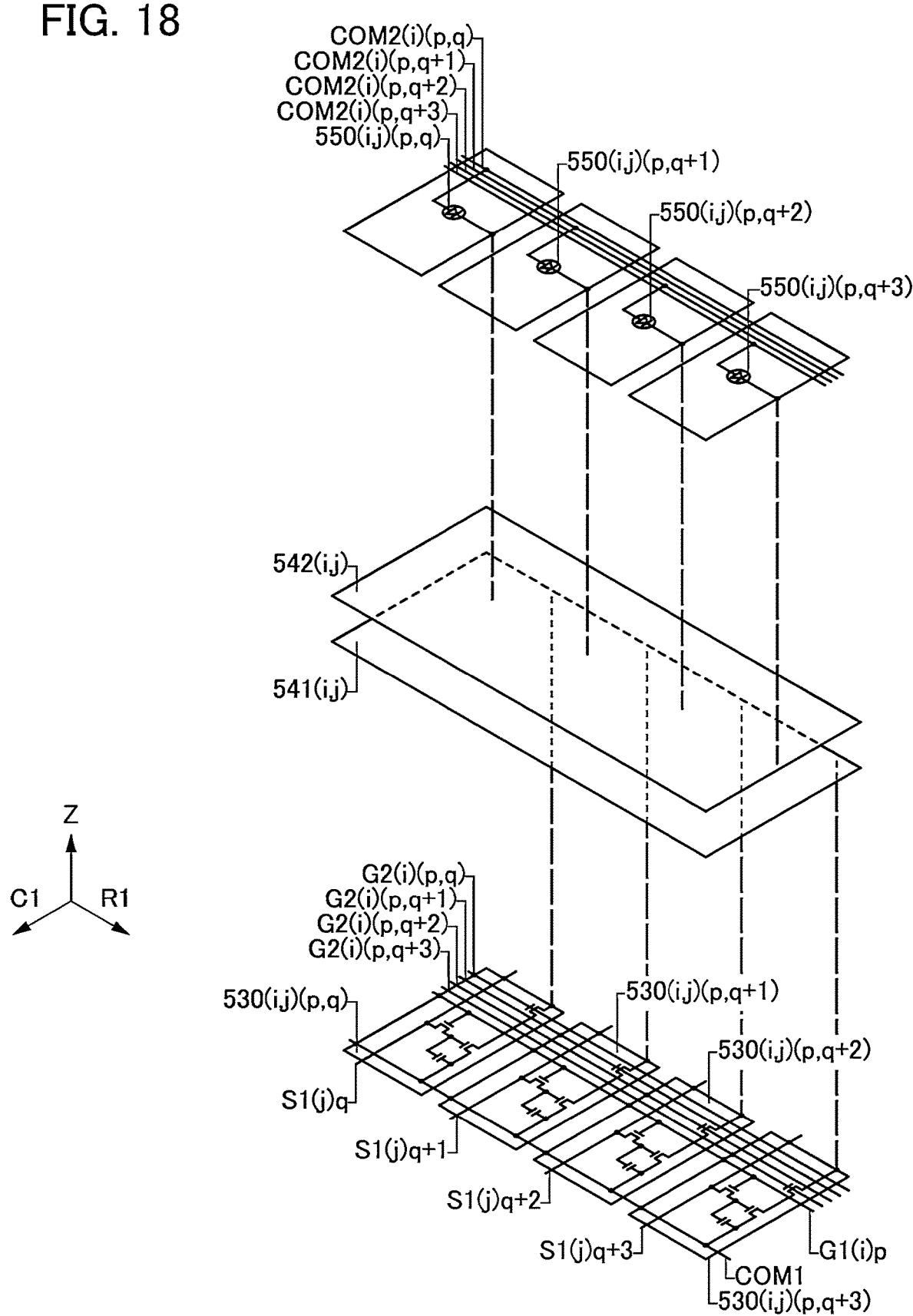
FIG. 18 is a diagram illustrating a structure of a display apparatus of an embodiment.

FIG. 18 is a perspective view illustrating a structure of a pixel set that can be used in the display apparatus of one embodiment of the present invention.

Figure 19:
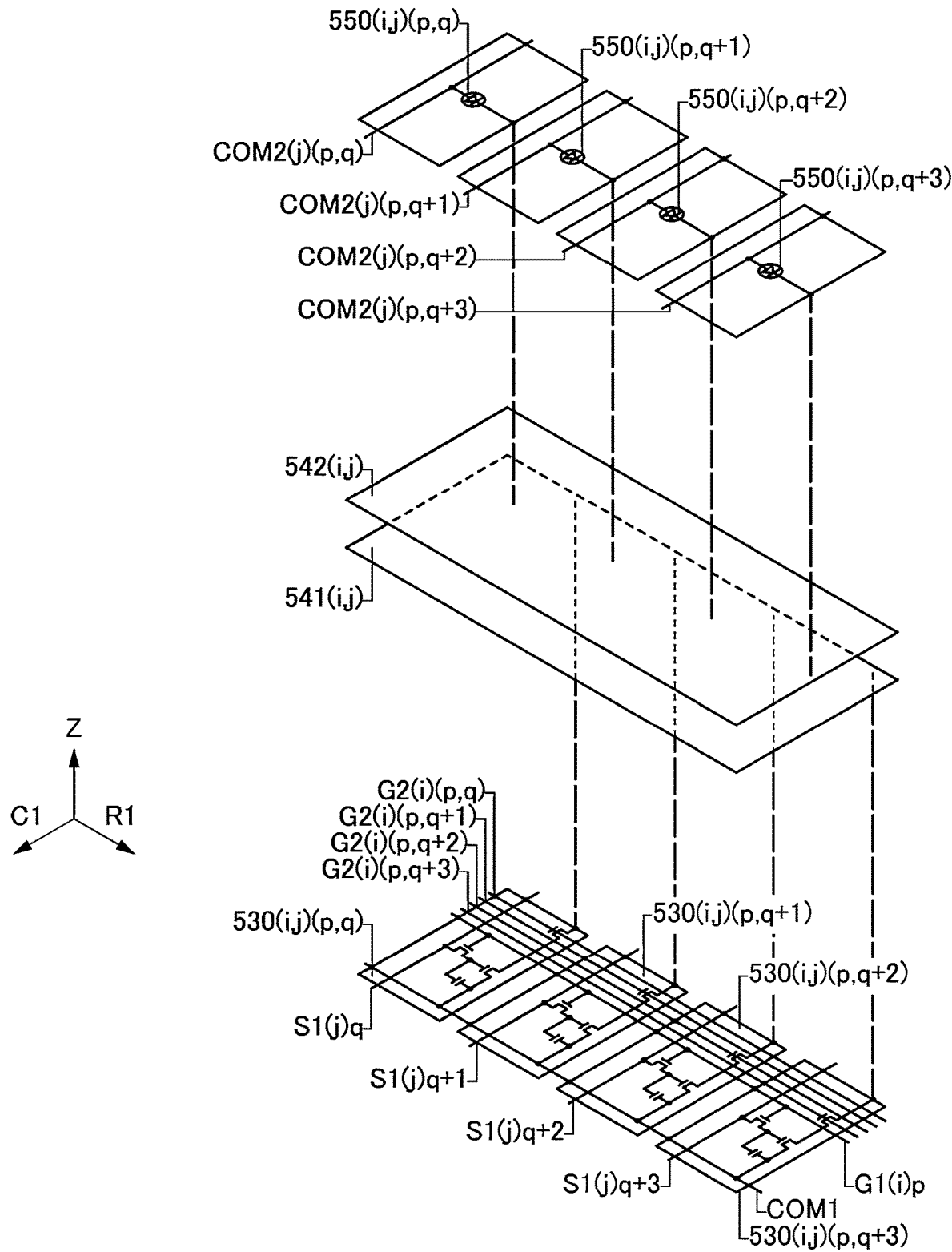
FIG. 19 is a diagram illustrating a structure of a display apparatus of an embodiment.

FIG. 19 is a perspective view illustrating a structure of the pixel set that is different from the structure illustrated in FIG. 18.

Figure 20A:
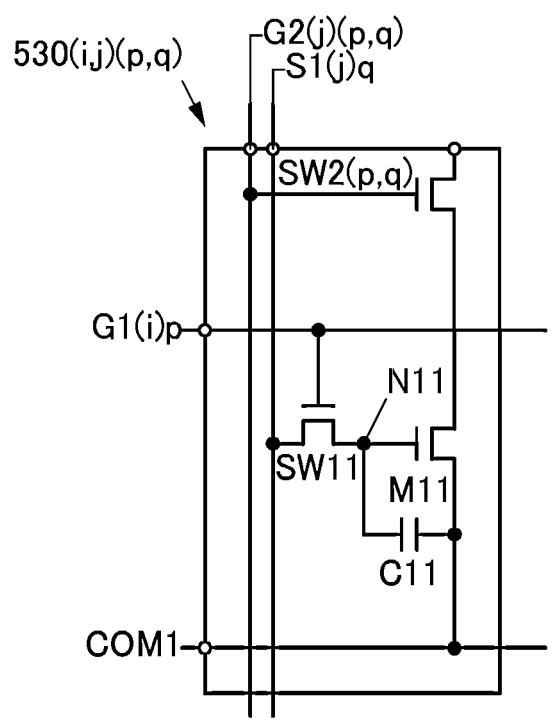
FIG. 20A and FIG. 20B are diagrams illustrating a structure of a display apparatus of an embodiment.
Figure 20B:
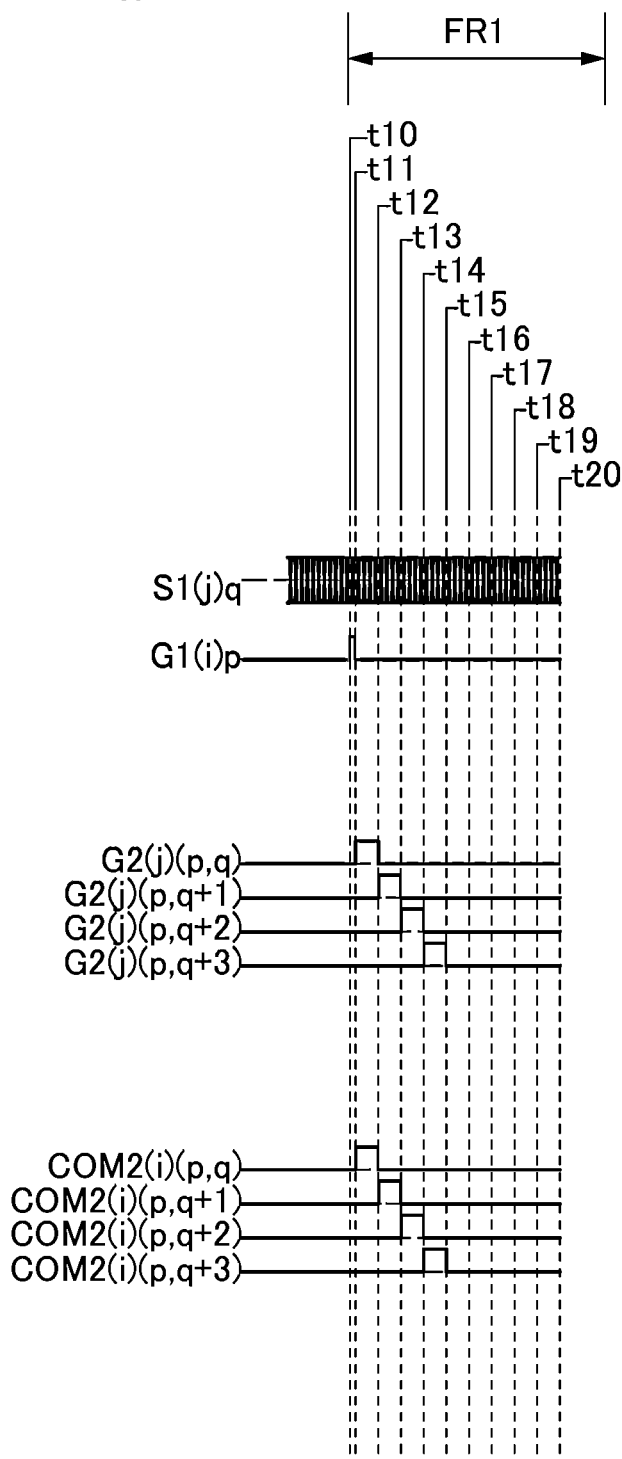

FIG. 20A is a circuit diagram illustrating a pixel circuit that can be used in the display apparatus of one embodiment of the present invention, and FIG. 20B is a timing chart showing the operation of the pixel circuit illustrated in FIG. 20A.

Figure 21:
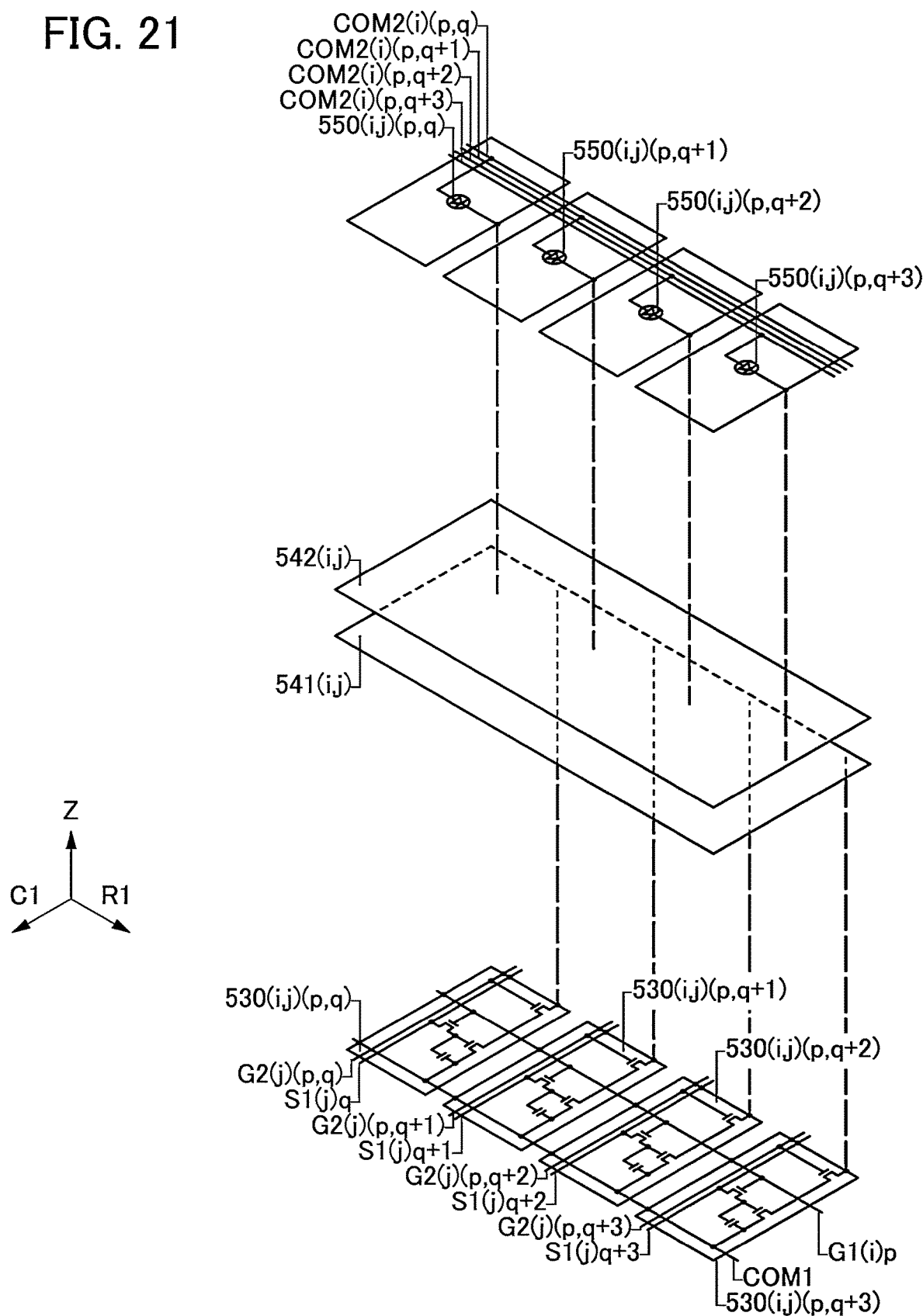
FIG. 21 is a diagram illustrating a structure of a display apparatus of an embodiment.

FIG. 21 is a perspective view illustrating a structure of a pixel set that can be used in the display apparatus of one embodiment of the present invention.

Figure 22:
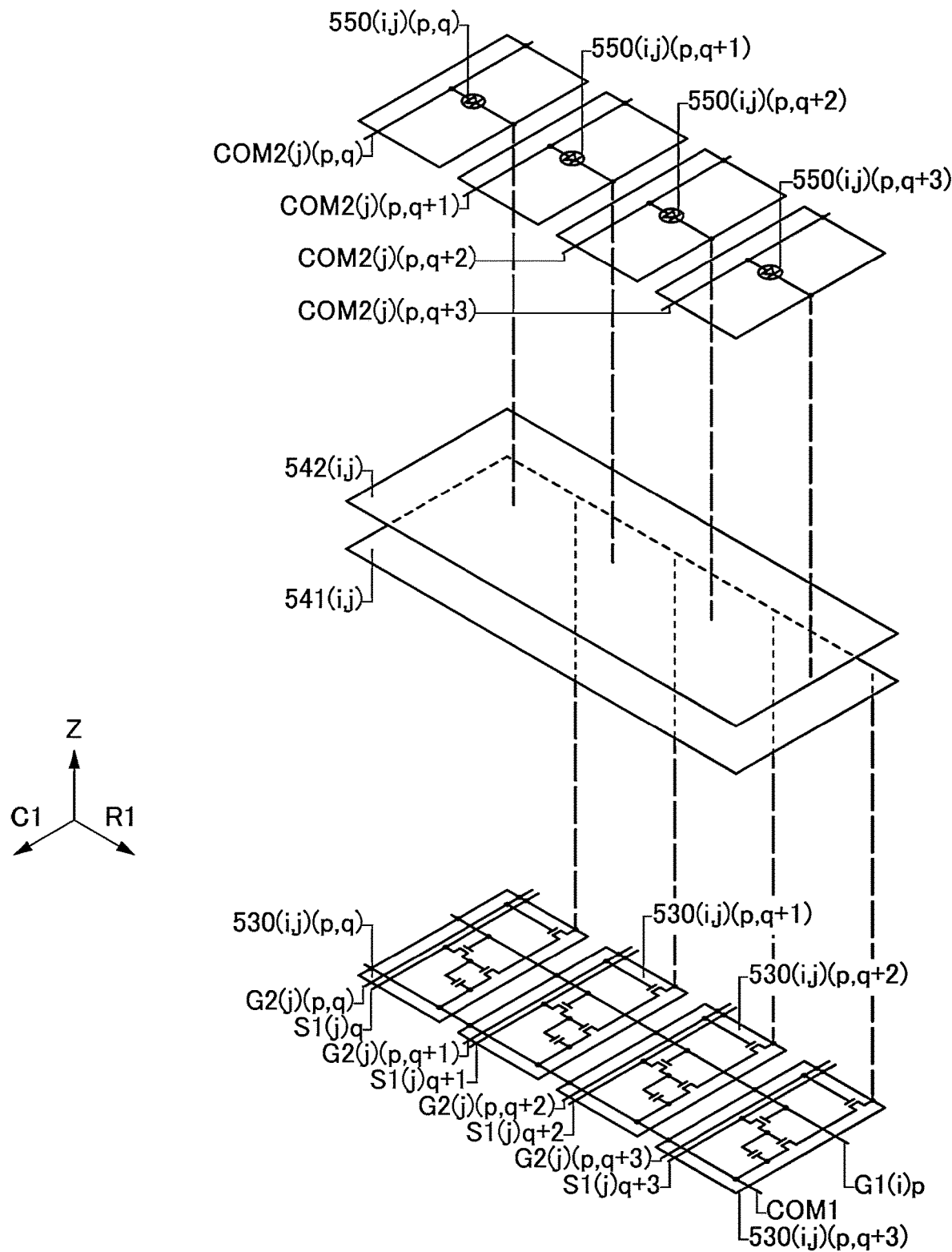
FIG. 22 is a diagram illustrating a structure of a display apparatus of an embodiment.

FIG. 22 is a perspective view illustrating a structure of the pixel set that is different from the structure illustrated in FIG. 21.

Figure 23A:
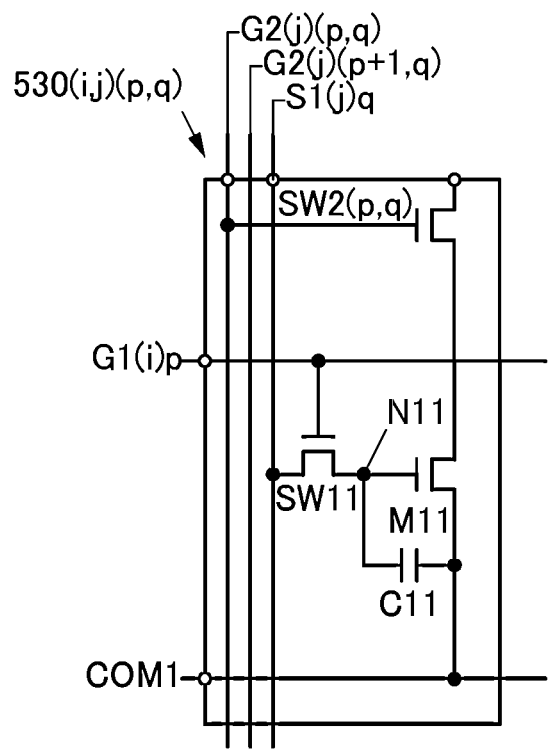
FIG. 23A and FIG. 23B are diagrams illustrating a structure of a display apparatus of an embodiment.
Figure 23B:
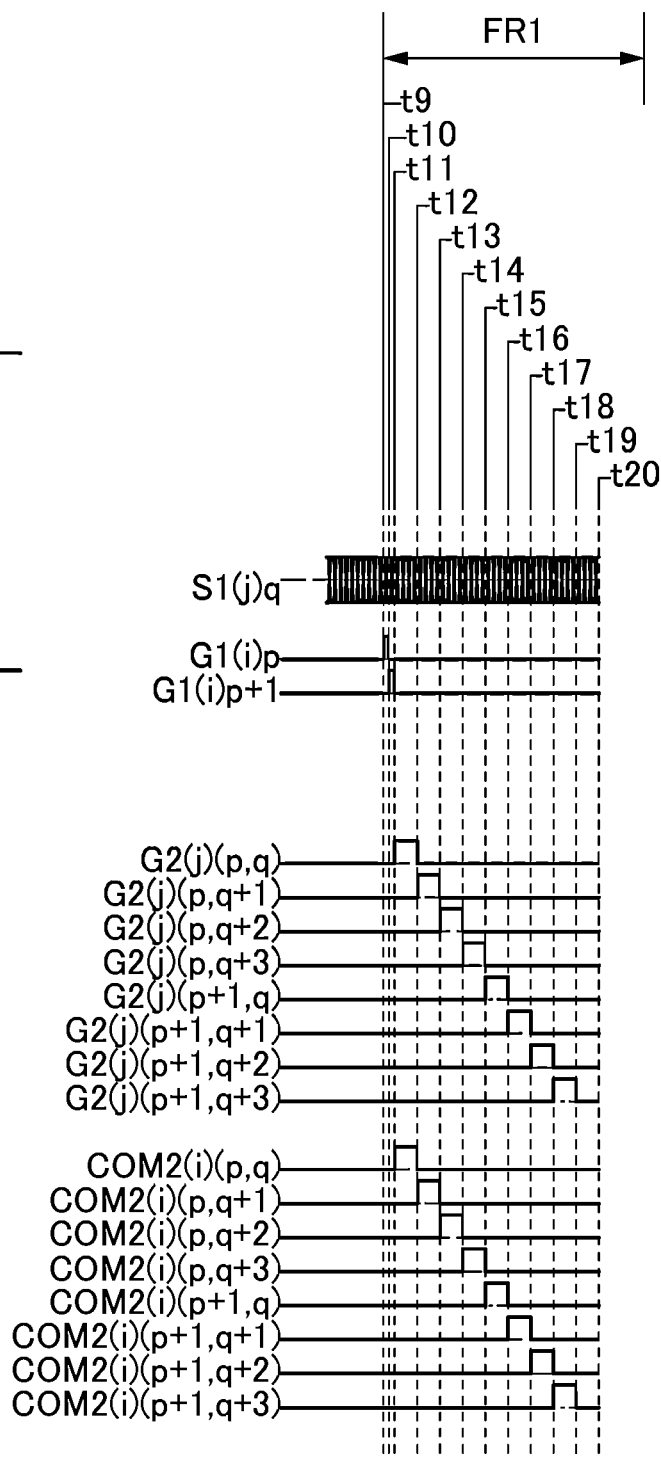

FIG. 23A is a circuit diagram illustrating a pixel circuit that can be used in the display apparatus of one embodiment of the present invention, and FIG. 23B is a timing chart showing the operation of the pixel circuit illustrated in FIG. 23A.

Figure 24:
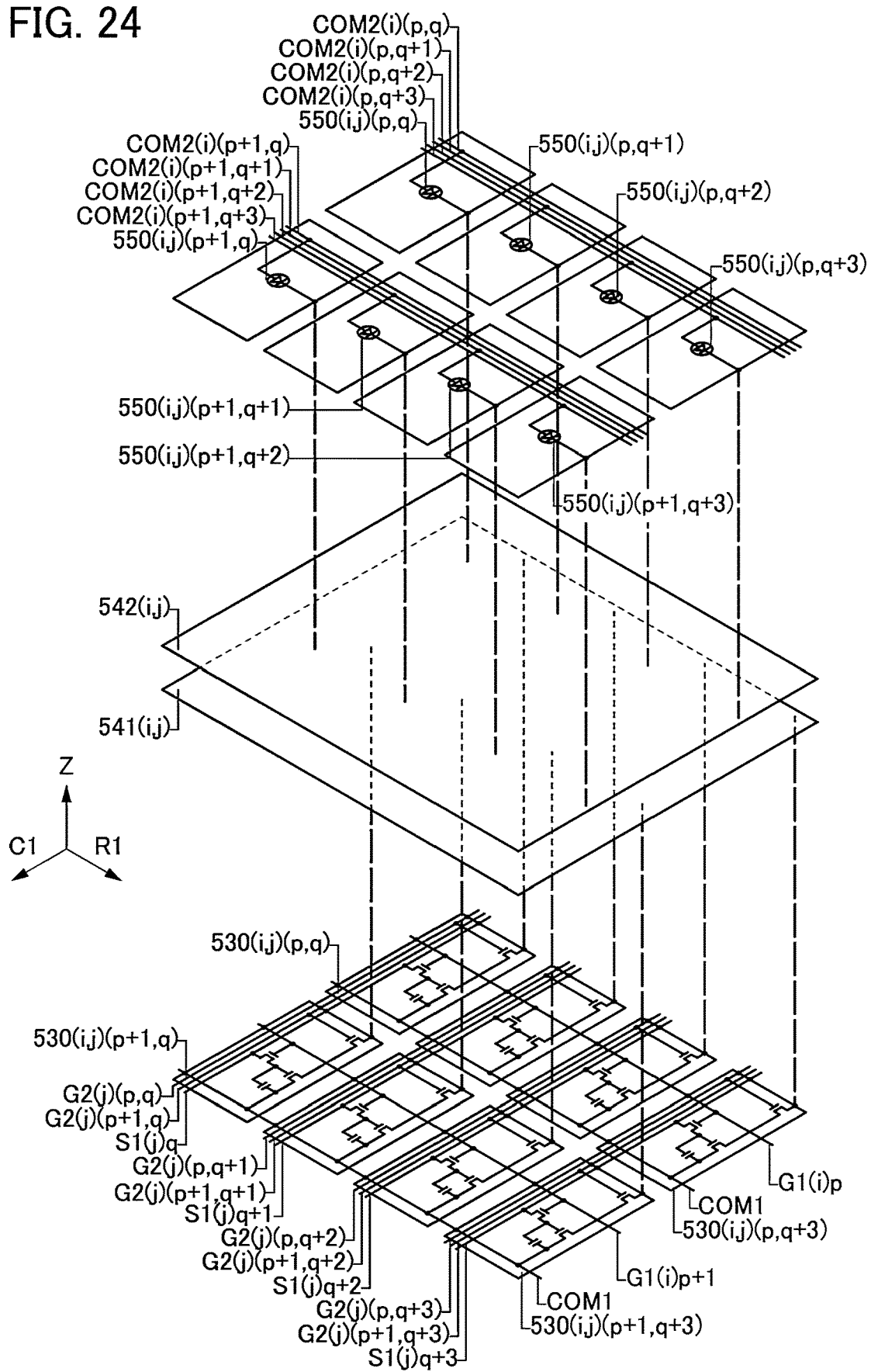
FIG. 24 is a diagram illustrating a structure of a display apparatus of an embodiment.

FIG. 24 is a perspective view illustrating a structure of a pixel set that can be used in the display apparatus of one embodiment of the present invention.

Figure 25:
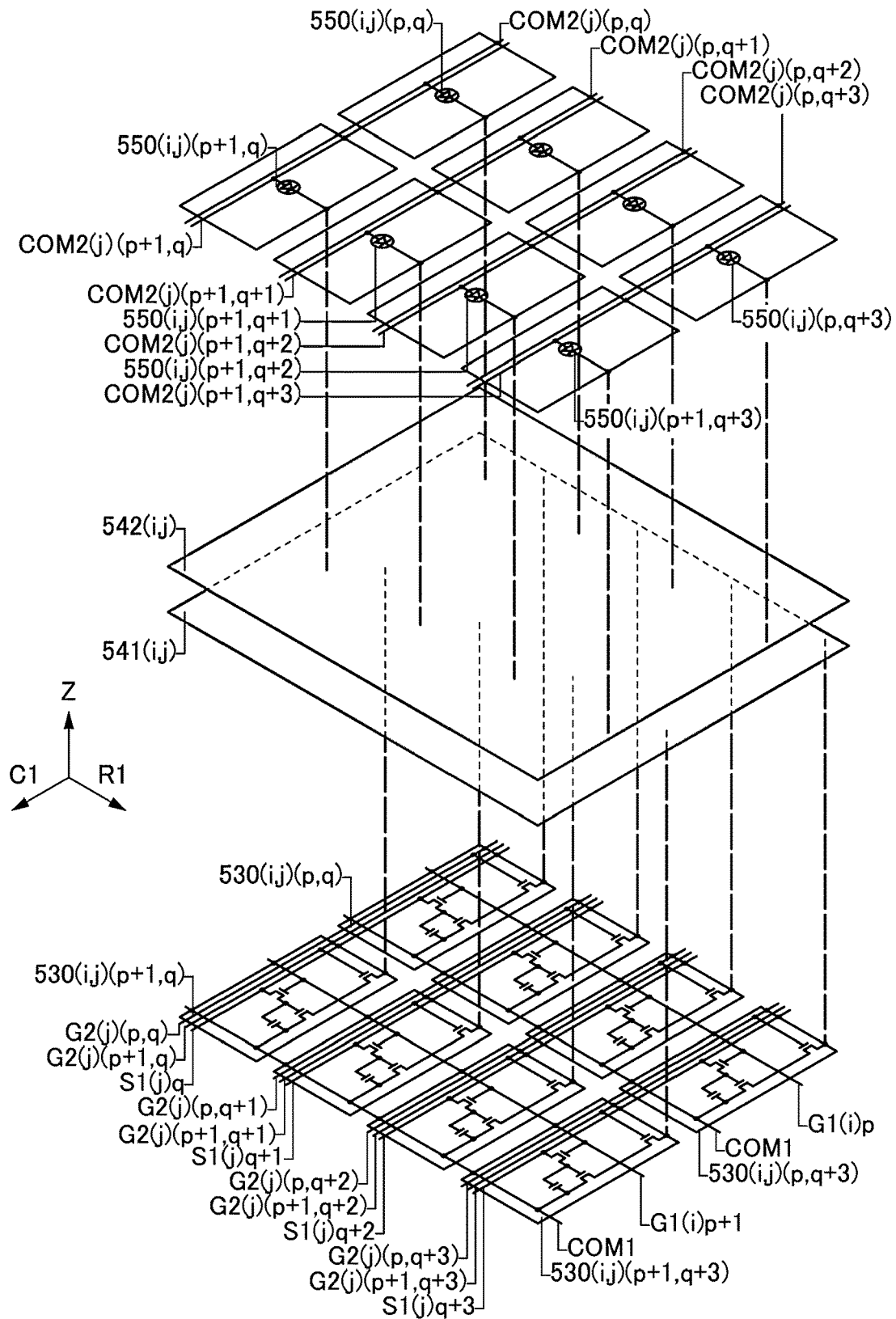
FIG. 25 is a diagram illustrating a structure of a display apparatus of an embodiment.

FIG. 25 is a perspective view illustrating a structure of the pixel set that is different from the structure illustrated in FIG. 24.

Figure 26A:
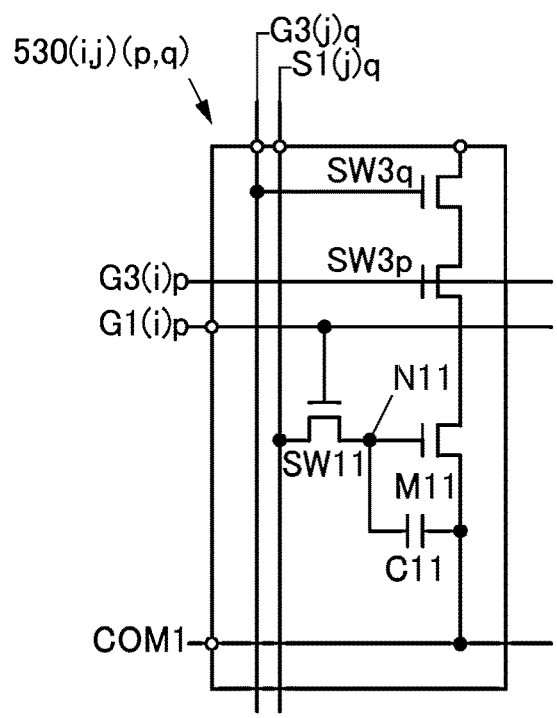
FIG. 26A and FIG. 26B are diagrams illustrating a structure of a display apparatus of an embodiment.
Figure 26B:
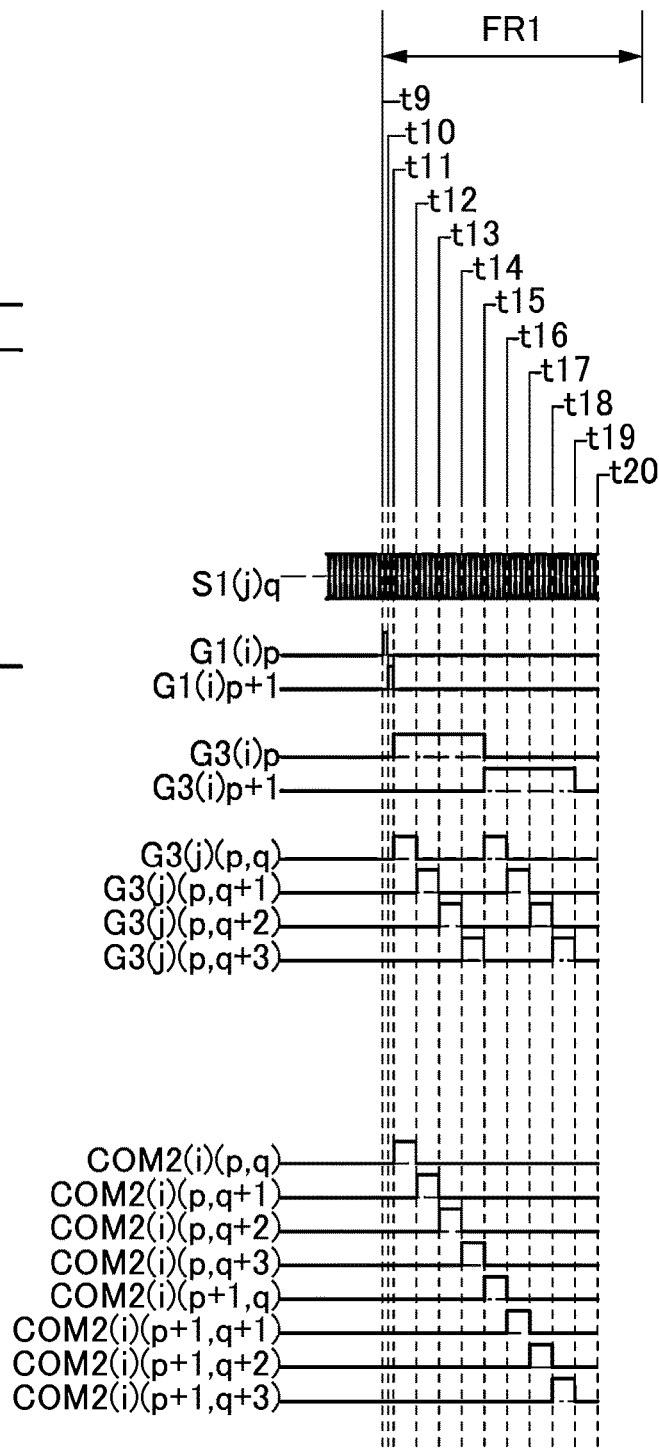

FIG. 26A is a circuit diagram illustrating a pixel circuit that can be used in the display apparatus of one embodiment of the present invention, and FIG. 26B is a timing chart showing the operation of the pixel circuit illustrated in FIG. 26A.

Figure 27:
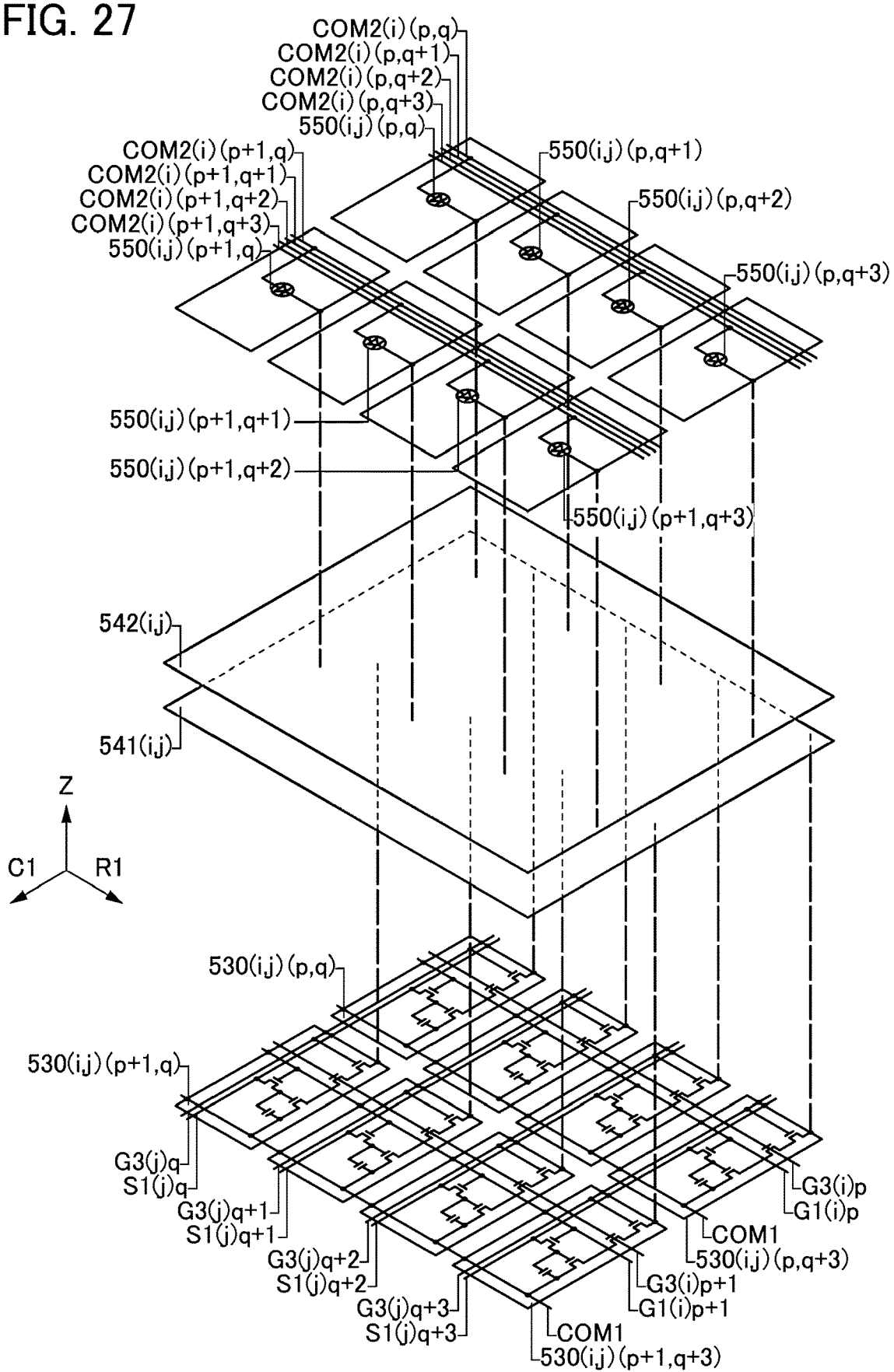
FIG. 27 is a diagram illustrating a structure of a display apparatus of an embodiment.

FIG. 27 is a perspective view illustrating a structure of a pixel set that can be used in the display apparatus of one embodiment of the present invention.

Figure 28:
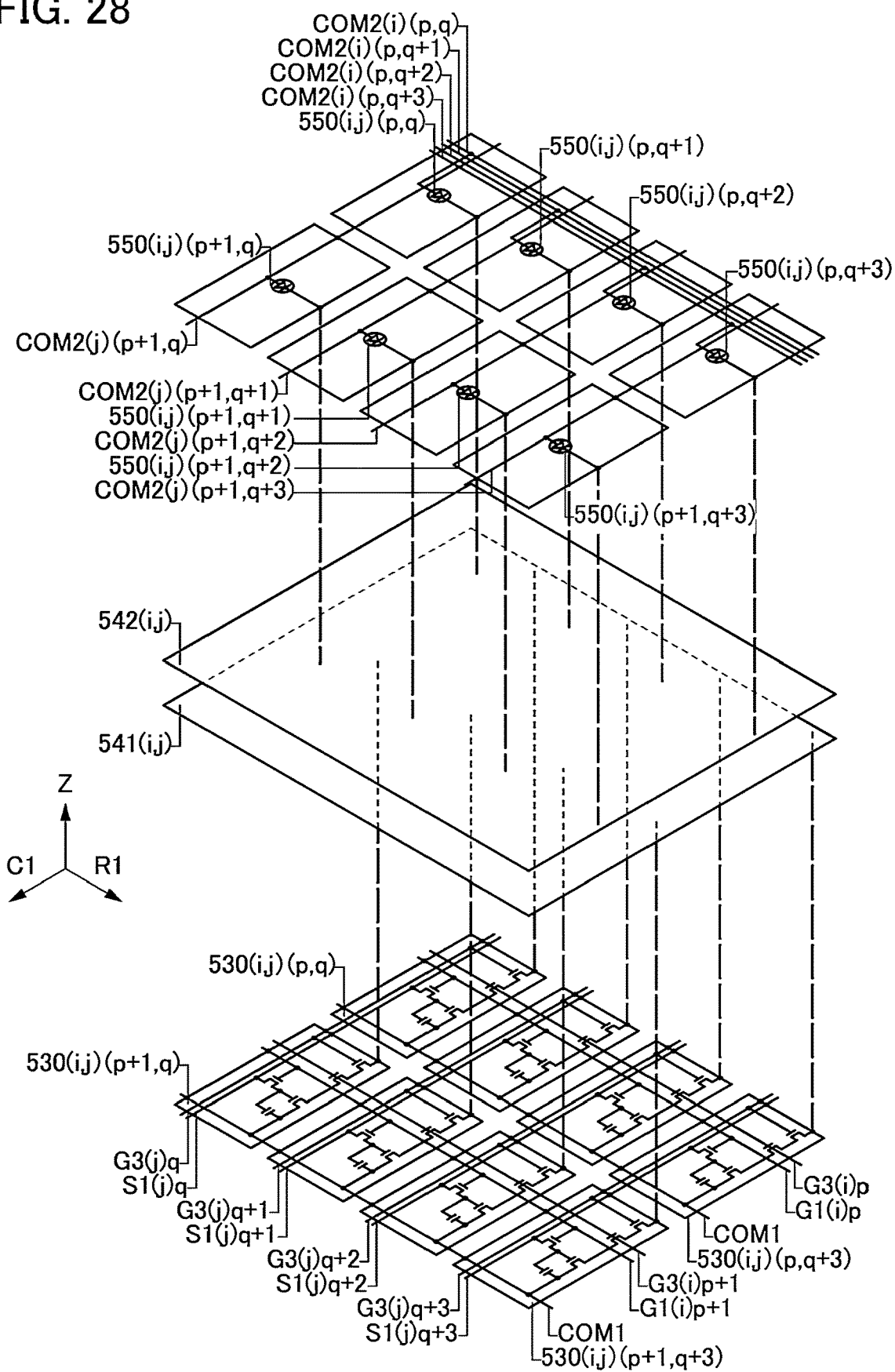
FIG. 28 is a diagram illustrating a structure of a display apparatus of an embodiment.

FIG. 28 is a perspective view illustrating a structure of the pixel set that is different from the structure illustrated in FIG. 27.

Figure 29:
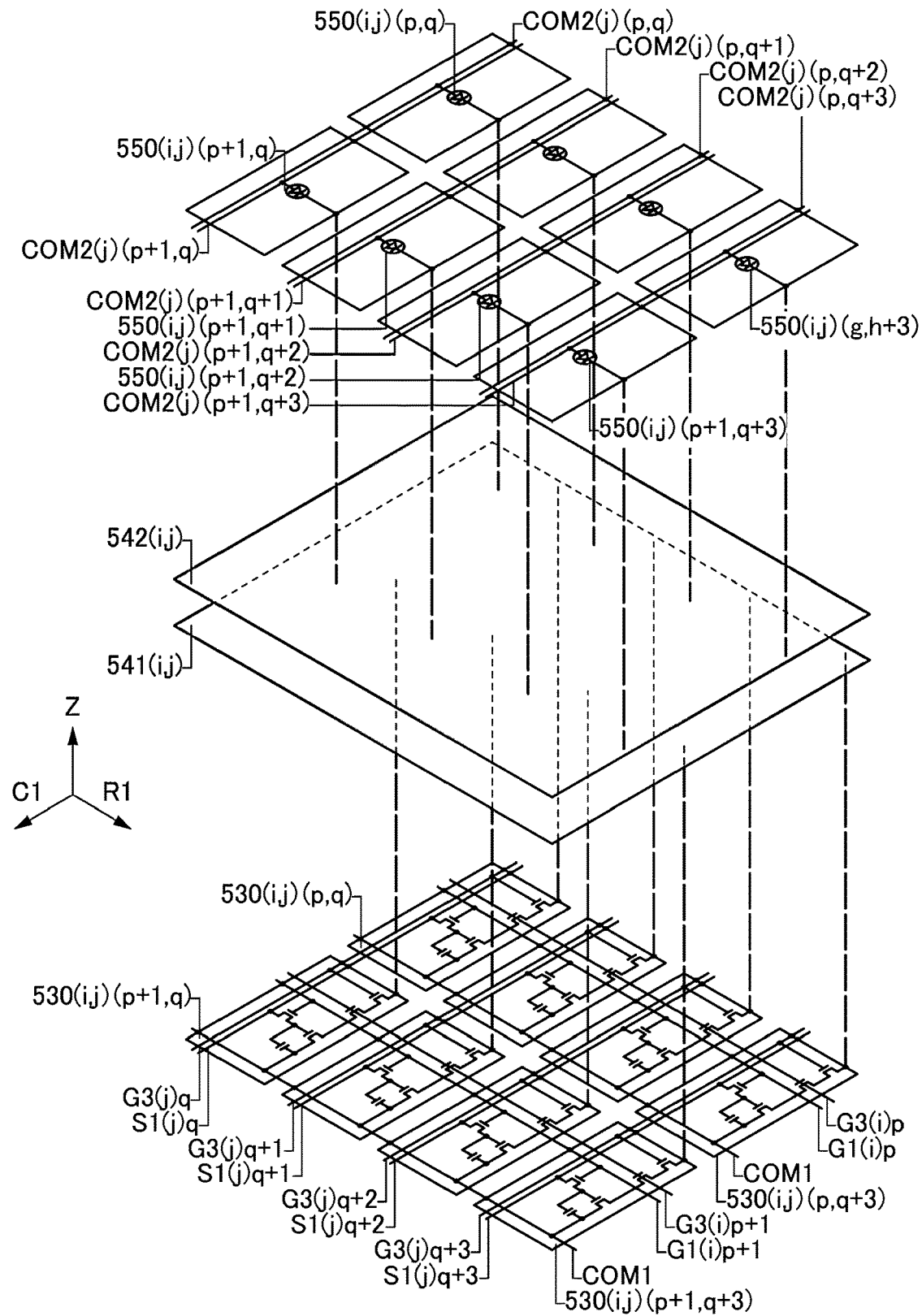
FIG. 29 is a diagram illustrating a structure of a display apparatus of an embodiment.

FIG. 29 is a perspective view illustrating a structure of the pixel set that is different from the structures illustrated in FIG. 27 and FIG. 28.

Structure Example 1 of Display Apparatus

The display apparatus described in this embodiment includes the pixel set 703(*i,j*), a pixel set 703(*i,j*+1), a pixel set 703(*i*+1,j), the conductive film G1(*i*)p, and the conductive film G2(*i*)(p,q) (see FIG. 10A).

Structure Example 1 of Pixel Set 703(*i,j*)

The pixel set 703(*i,j*) includes the light-emitting device set 550(*i,j*), the pad 542(*i,j*), the pad 541(*i,j*), the conductive material 543(*i,j*), and the pixel circuit set 530(*i,j*).

The light-emitting device set 550(*i,j*) is electrically connected to the pad 542(*i,j*). The pad 542(*i,j*) overlaps with the pad 541(*i,j*), and the pad 541(*i,j*) is electrically connected to the pixel circuit set 530(*i,j*).

Note that the conductive material 543(*i,j*) is sandwiched between the pad 542(*i,j*) and the pad 541(*i,j*), and the conductive material 543(*i,j*) electrically connects the pad 542(*i,j*) and the pad 541(*i,j*).

Structure Example 1 of Pixel Circuit Set 530(*i,j*)

The pixel circuit set 530(*i,j*) includes a group of pixel circuits 530(*i,j*)(p,1) to 530(*i,j*)(p,t), and the group of pixel circuits 530(*i,j*)(p,1) to 530(*i,j*)(p,t) include the pixel circuit 530(*i,j*)(p,q) (see FIG. 10B).

The pixel circuit set 530(*i,j*) includes a group of pixel circuits 530(*i,j*)(1,*q*) to 530(*i,j*)(s,q), and the group of pixel circuits 530(*i,j*)(1,*q*) to 530(*i,j*)(s,q) include the pixel circuit 530(*i,j*)(p,q). Note that s is an integer greater than or equal to 1. The pixel circuit set 530(*i,j*) includes a pixel circuit 530(*i,j*)(1,1) to a pixel circuit 530(*i,j*)(s,t).

Structure Example 1 of Pixel Set 703(*i,j*+1)

The pixel set 703(*i,j*+1) includes a light-emitting device set 550(*i,j*+1) and a pixel circuit set 530(*i,j*+1), and the light-emitting device set 550(*i,j*+1) and the pixel circuit set 530(*i,j*+1) are electrically connected to each other (see FIG. 10A).

Structure Example 1 of Pixel Circuit Set 530(*i,j*+1)

The pixel circuit set 530(*i,j*+1) includes a group of pixel circuits 530(*i,j*+1)(p,1) to 530(*i,j*+1)(p,t), and the group of pixel circuits 530($i,j$+1)(p,1) to 530($i,j$+1)(p,t) include a pixel circuit 530($i,j$+1)(p,q) (see FIG. 10B). The pixel circuit set 530($i,j$+1) includes a pixel circuit 530($i,j$+1)(1,1) to a pixel circuit 530($i,j$+1)(s,t).

Structure Example 1 of Pixel Set 703($i$+1,j)

The pixel set 703($i$+1,j) includes a light-emitting device set 550($i$+1,j) and a pixel circuit set 530($i$+1,j), and the light-emitting device set 550($i$+1,j) and the pixel circuit set 530($i$+1,j) are electrically connected to each other (see FIG. 10A).

Structure Example 1 of Pixel Circuit Set 530($i$+1,j)

The pixel circuit set 530($i$+1,j) includes a group of pixel circuits 530($i$+1,j)(1,$q$) to 530($i$+1,j)(s,q), and the group of pixel circuits 530($i$+1,j)(1,$q$) to 530($i$+1,j)(s,q) include a pixel circuit 530($i$+1,j)(p,q) (see FIG. 10B). The pixel circuit set 530($i$+1,j) includes a pixel circuit 530($i$+1,j)(1,1) to a pixel circuit 530($i$+1,j)(s,f).

Structure Example 1 of Conductive Film G1($i$)p

The conductive film G1($i$)p is electrically connected to the group of pixel circuits 530($i,j$)(p,1) to 530($i,j$)(p,1) and the group of pixel circuits 530($i,j$+1)(p,1) to 530($i,j$+1)(p,t).

Structure Example 1 of Conductive Film G2($i$)(p,q)

The conductive film G2($i$)(p,q) is electrically connected to the pixel circuit 530($i,j$)(p,q) and the pixel circuit 530($i,j$+1)(p,q).

Thus, for example, a signal can be supplied to one or more of the pixel circuits included in the pixel circuit set 530($i,j$) in the first period with the use of the conductive film G1($i$)p. In addition, a signal can be supplied to one or more of the pixel circuits included in another pixel circuit set 530($i,j$+1) in the same first period. For another example, a signal can be supplied to the plurality of pixel circuits in the first period with the use of the conductive film G1($i$)p.

A signal can be supplied to the pixel circuit 530($i,j$)(p,q) included in the pixel circuit set 530($i,j$) in the second period with the use of the conductive film G2($i$)(p,q), for example. In addition, a signal can be supplied to the pixel circuit 530($i,j$+1)(p,q) included in another pixel circuit set 530($i,j$+1) in the same second period. Moreover, in the same second period, the pixel circuit 530($i,j$)(p,q) can supply power to the pad 541($i,j$) and the pixel circuit 530($i,j$+1)(p,q) can supply power to a pad 541($i,j$+1).

The area of the pad 541($i,j$) can be close to the area occupied by the pixel circuit set 530($i,j$). Furthermore, the area of the pad 542($i,j$) can be close to the area occupied by the pixel circuit set 530($i,j$). Moreover, electrical connection between the pads 541($i,j$) and 542($i,j$) is facilitated. In addition, electrical connection between the pixel circuit set 530($i,j$) and the light-emitting device set 550($i,j$) is facilitated. Alternatively, bonding between the pixel circuit set 530($i,j$) and the light-emitting device set 550($i,j$) is facilitated. As a result, a novel display apparatus that is highly convenient, useful, or reliable can be provided.

Structure Example 2 of Pixel Circuit Set 530($i,j$)

The pixel circuit set 530($i,j$) described in this embodiment includes, for example, the pixel circuit 530($i,j$)(p,q) and a pixel circuit 530($i,j$)(p+1,q) (see FIG. 15 and FIG. 16).

Structure Example 1 of Pixel Circuit 530($i,j$)

The pixel circuit 530($i,j$)(p,q) includes the switch SW11, the switch SW2($p,q$), the transistor M11, the capacitor C11, and the node N11 (see FIG. 14A and FIG. 17A).

The switch SW11 includes the first terminal electrically connected to the conductive film S1($j$)q and the second terminal electrically connected to the node N11, and has a function of controlling its on/off state on the basis of the potential of the conductive film G1($i$)p.

The transistor M11 includes the gate electrode electrically connected to the node N11 and the first electrode electrically connected to the conductive film COM1.

The capacitor C11 includes the conductive film electrically connected to the node N11 and the conductive film electrically connected to the conductive film COM1.

The switch SW2($p,q$) includes the first terminal electrically connected to the second electrode of the transistor M11 and the second terminal electrically connected to the pad 541($i,j$), and has a function of controlling its on/off state on the basis of the potential of the conductive film G2($i$)(p,q).

Driving Method Example 1 of Display Apparatus

A method for driving the display apparatus of one embodiment of the present invention will be described. Specifically, the method for driving the display apparatus is described using the operations of the pixel circuit 530($i,j$)(p,q) and the pixel circuit 530($i,j$)(p+1,q) included in the pixel set 703($i,j$) (see FIG. 14B and FIG. 15). Note that the period FR1 in the drawing corresponds to one frame period.

[First Step]

In a period from Time t9 to Time t10, the first selection signal is supplied to the conductive film G1($i$)p. In a period from Time t10 to Time t11, the first selection signal is supplied to a conductive film G1($i$)p+1.

The pixel circuit 530($i,j$)(p,q) obtains an image signal from the conductive film S1($j$)q on the basis of the first selection signal. In addition, a pixel circuit 530($i,j$)(p+1,q) obtains an image signal from a conductive film S1($j$)q+1 on the basis of the first selection signal.

[Second Step]

In a period from Time t11 to Time t12, the second selection signal is supplied to the conductive film G2($i$)(p,q). In addition, the predetermined potential is supplied to the conductive film COM2($i$)(p,q).

The pixel circuit 530($i,j$)(p,q) controls the potential of the pad 541($i,j$) on the basis of the obtained image signal and the second selection signal.

[Third Step]

In a period from Time t12 to Time t13, the second selection signal is supplied to a conductive film G2($i$)(p+1,q). In addition, the predetermined potential is supplied to a conductive film COM2($i$)(p+1,q).

The pixel circuit 530($i,j$)(p+1,q) controls the potential of the pad 541($i,j$) on the basis of the obtained image signal and the second selection signal.

Structure Example 3 of Pixel Circuit Set 530($i,j$)

The pixel circuit set 530($i,j$) described in this embodiment includes, for example, the pixel circuit 530($i,j$)(p,q), the pixel circuit 530($i,j$)(p,q+1), a pixel circuit 530($i,j$)(p,q+2), and a pixel circuit 530($i,j$)(p,q+3) (see FIG. 18 and FIG. 19). Note that the display apparatus includes a conductive film S1($j$)q+2 and a conductive film S1($j$)q+3. The light-emitting device set 550($i,j$) includes a light-emitting device 550($i,j$)

(p,q+2) and a light-emitting device $550(i,j)$(p,q+3). The display apparatus includes a conductive film COM2$(j)$(p,q+1), a conductive film COM2$(j)$(p,q+2), and a conductive film COM2$(j)$(p,q+3) (see FIG. 19).

Driving Method Example 2 of Display Apparatus

A method for driving the display apparatus of one embodiment of the present invention will be described. Specifically, the method for driving the display apparatus is described using the operations of the pixel circuit $530(i,j)$(p,q) to the pixel circuit $530(i,j)$(p,q+3) included in the pixel set $703(i,j)$ (see FIG. 17B and FIG. 18). Note that the period FR1 in the drawing corresponds to one frame period.
[First Step]
In a period from Time t10 to Time t11, the first selection signal is supplied to the conductive film G1$(i)$p.

The pixel circuit $530(i,j)$(p,q) obtains an image signal from the conductive film S1$(j)$q on the basis of the first selection signal. In addition, the pixel circuit $530(i,j)$(p,q+1) obtains an image signal from the conductive film S1$(j)$q+1 on the basis of the first selection signal.
[Second Step]
In a period from Time t11 to Time t15, one of the conductive film G2$(i)$(p,q) to the conductive film G2$(i)$(p,q+3) is selected in the predetermined order and the second selection signal is supplied. In addition, one of the conductive film COM2$(i)$(p,q) to the conductive film COM2$(i)$(p,q+3) is selected in the predetermined order and the predetermined potential is supplied. Note that the conductive film G2$(i)$(p,q) to the conductive film G2$(i)$(p,q+3) include the conductive film G2$(i)$(p,q+2), and the conductive film COM2$(i)$(p,q) to the conductive film COM2$(i)$(p,q+3) include the conductive film COM2$(i)$(p,q+2).
[Operation of Pixel $702(i,j)$(p,q) in Second Step]
In the period from Time t11 to Time t12, for example, the pixel circuit $530(i,j)$(p,q) is supplied with the second selection signal from the conductive film G2$(i)$(p,q) and controls the potential of the pad $541(i,j)$ on the basis of the obtained image signal.

In the period from Time t11 to Time t12, the predetermined potential is supplied to the conductive film COM2$(i)$(p,q).

Thus, in the period from Time t11 to Time t12, the light-emitting device $550(i,j)$(p,q) performs display at the predetermined luminance on the basis of the potential difference between the pad $541(i,j)$ and the conductive film COM2$(i)$(p,q).
[Operation of Pixel $702(i,j)$(p,q+1) in Second Step]
In the period from Time t12 to Time t13, for example, the pixel circuit $530(i,j)$(p,q+1) is supplied with the second selection signal from the conductive film G2$(i)$(p,q+1) and controls the potential of the pad $541(i,j)$ on the basis of the obtained image signal.

In the period from Time t12 to Time t13, the predetermined potential is supplied to the conductive film COM2$(i)$(p,q+1).

Thus, in the period from Time t12 to Time t13, the light-emitting device $550(i,j)$(p,q+1) performs display at the predetermined luminance on the basis of the potential difference between the pad $541(i,j)$ and the conductive film COM2$(i)$(p,q+1).

Structure Example 2 of Display Apparatus

The display apparatus described in this embodiment is different from that in Structure example 1 of display apparatus in including a conductive film G2$(j)$(p,q) instead of the conductive film G2$(i)$(p,q) (see FIG. 11B). Different portions will be described in detail here, and the above description is referred to for portions that can use similar structures.

Structure Example 1 of Conductive Film G2$(j)$(p,q)

The conductive film G2$(j)$(p,q) is electrically connected to the pixel circuit $530(i,j)$(p,q) and the pixel circuit $530(i+1,j)$(p,q).

Thus, for example, a signal can be supplied to one or more of the pixel circuits included in the pixel circuit set $530(i,j)$ and the pixel circuit set $530(i,j+1)$ in the first period with the use of the conductive film G1$(i)$p. For another example, a signal can be supplied to one or more of the pixel circuits included in the pixel circuit set $530(i+1,j)$ in a period different from the first period with the use of the conductive film G1$(i+1)$p.

For another example, a signal can be supplied to the pixel circuit $530(i,j)$(p,q) included in the pixel circuit set $530(i,j)$ in the second period with the use of the conductive film G2$(j)$(p,q). In addition, a signal can be supplied to the pixel circuit $530(i+1,j)$(p,q) included in another pixel circuit set $530(i+1,j)$ in the same second period. Moreover, in the second period, the pixel circuit $530(i,j)$(p,q) can supply power to the pad $541(i,j)$ and the pixel circuit $530(i+1,j)$(p,q) can supply power to a pad $541(i+1,j)$. As a result, a novel display apparatus that is highly convenient, useful, or reliable can be provided.

Structure Example 4 of Pixel Circuit Set $530(i,j)$

The pixel circuit set $530(i,j)$ described in this embodiment includes, for example, the pixel circuit $530(i,j)$(p,q), the pixel circuit $530(i,j)$(p,q+1), the pixel circuit $530(i,j)$(p,q+2), and the pixel circuit $530(i,j)$(p,q+3) (see FIG. 21 and FIG. 22).

Structure Example 2 of Pixel Circuit $530(i,j)$

The pixel circuit $530(i,j)$ is different from that in Structure example 1 of pixel circuit $530(i,j)$ in that the switch SW2 $(p,q)$ has a function of controlling its on/off state on the basis of the potential of the conductive film G2$(j)$(p,q) instead of the potential of the conductive film G2$(i)$(p,q) (see FIG. 20A and FIG. 23A). Different portions will be described in detail here, and the above description is referred to for portions that can use similar structures.

Driving Method Example 3 of Display Apparatus

A method for driving the display apparatus of one embodiment of the present invention will be described. Specifically, the method for driving the display apparatus is described using the operations of the pixel circuit $530(i,j)$(p,q) to the pixel circuit $530(i,j)$(p,q+3) included in the pixel set $703(i,j)$ (see FIG. 20B and FIG. 21). Note that the period FR1 in the drawing corresponds to one frame period.
[First Step]
In a period from Time t10 to Time t11, the first selection signal is supplied to the conductive film G1$(i)$p.

The pixel circuit $530(i,j)$(p,q) obtains an image signal from the conductive film S1$(j)$q on the basis of the first selection signal. In addition, the pixel circuit $530(i,j)$(p,q+1) obtains an image signal from the conductive film S1$(j)$q+1 on the basis of the first selection signal.

[Second Step]

In a period from Time t11 to Time t15, one of the conductive film G2(*j*)(p,q) to a conductive film G2(*j*)(p,q+3) is selected in the predetermined order and the second selection signal is supplied. In addition, one of the conductive film COM2(*i*)(p,q) to the conductive film COM2(*i*)(p, q+3) is selected in the predetermined order and the predetermined potential is supplied.

[Operation of Pixel 702(*i,j*)(p,q) in Second Step]

In a period from Time t11 to Time t12, for example, the pixel circuit 530(*i,j*)(p,q) is supplied with the second selection signal from the conductive film G2(*j*)(p,q) and controls the potential of the pad 541(*i,j*) on the basis of the obtained image signal.

In the period from Time t11 to Time t12, the predetermined potential is supplied to the conductive film COM2(*i*) (p,q).

Thus, in the period from Time t11 to Time t12, the light-emitting device 550(*i,j*)(p,q) performs display at the predetermined luminance on the basis of the potential difference between the pad 541(*i,j*) and the conductive film COM2(*i*)(p,q).

[Operation of Pixel 702(*i,j*)(p,q+1) in Second Step]

In a period from Time t12 to Time t13, for example, the pixel circuit 530(*i,j*)(p,q+1) is supplied with the second selection signal from the conductive film G2(*j*)(p,q+1) and controls the potential of the pad 541(*i,j*) on the basis of the obtained image signal.

In the period from Time t12 to Time t13, the predetermined potential is supplied to the conductive film COM2(*i*) (p,q+1).

Thus, in the period from Time t12 to Time t13, the light-emitting device 550(*i,j*)(p,q+1) performs display at the predetermined luminance on the basis of the potential difference between the pad 541(*i,j*) and the conductive film COM2(*i*)(p,q+1).

Structure Example 5 of Pixel Circuit Set 530(*i,j*)

The pixel circuit set 530(*i,j*) described in this embodiment includes, for example, the pixel circuit 530(*i,j*)(p,q) to the pixel circuit 530(*i,j*)(p,q+3) and the pixel circuit 530(*i,j*)(p+1,q) to a pixel circuit 530(*i,j*)(p+1,q+3) (see FIG. 24 and FIG. 25).

Driving Method Example 4 of Display Apparatus

A method for driving the display apparatus of one embodiment of the present invention will be described. Specifically, the method for driving the display apparatus is described using the operations of the pixel circuit 530(*i,j*)(p,q) to the pixel circuit 530(*i,j*)(p+1,q+3) included in the pixel set 703(*i,j*) (see FIG. 23B and FIG. 24). Note that the period FR1 in the drawing corresponds to one frame period.

[First Step]

In a period from Time t9 to Time t10, the first selection signal is supplied to the conductive film G1(*i*)p. In a period from Time t10 to Time t11, the first selection signal is supplied to the conductive film G1(*i*)p+1.

The pixel circuit 530(*i,j*)(p,q) obtains an image signal from the conductive film S1(*j*)q on the basis of the first selection signal. In addition, the pixel circuit 530(*i,j*)(p,q+1) obtains an image signal from the conductive film S1(*j*)q+1 on the basis of the first selection signal.

[Second Step]

In a period from Time t11 to Time t19, one of the conductive film G2(*j*)(p,q) to a conductive film G2(*j*)(p+1, q+3) is selected in the predetermined order and the second selection signal is supplied. In addition, one of the conductive film COM2(*i*)(p,q) to the conductive film COM2(*i*)(p, q+3) is selected in the predetermined order and the predetermined potential is supplied.

[Operation of Pixel 702(*i,j*)(p,q) in Second Step] In a period from Time t11 to Time t12, for example, the pixel circuit 530(*i,j*)(p,q) is supplied with the second selection signal from the conductive film G2(*j*)(p,q) and controls the potential of the pad 541(*i,j*) on the basis of the obtained image signal.

In the period from Time t11 to Time t12, the predetermined potential is supplied to the conductive film COM2(*i*) (p,q).

Thus, in the period from Time t11 to Time t12, the light-emitting device 550(*i,j*)(p,q) performs display at the predetermined luminance on the basis of the potential difference between the pad 541(*i,j*) and the conductive film COM2(*i*)(p,q).

[Operation of Pixel 702(*i,j*)(p,q+1) in Second Step]

In a period from Time t12 to Time t13, for example, the pixel circuit 530(*i,j*)(p,q+1) is supplied with the second selection signal from the conductive film G2(*j*)(p,q+1) and controls the potential of the pad 541(*i,j*) on the basis of the obtained image signal.

In the period from Time t12 to Time t13, the predetermined potential is supplied to the conductive film COM2(*i*) (p,q+1).

Thus, in the period from Time t12 to Time t13, the light-emitting device 550(*i,j*)(p,q+1) performs display at the predetermined luminance on the basis of the potential difference between the pad 541(*i,j*) and the conductive film COM2(*i*)(p,q+1).

[Operation of Pixel 702(*i,j*)(p+1,q) in Second Step]

In a period from Time t15 to Time t16, for example, the pixel circuit 530(*i,j*)(p+1,q) is supplied with the second selection signal from a conductive film G2(*j*)(p+1,q) and controls the potential of the pad 541(*i,j*) on the basis of the obtained image signal.

In the period from Time t15 to Time t16, the predetermined potential is supplied to the conductive film COM2(*i*) (p+1,q).

Thus, in the period from Time t15 to Time t16, the light-emitting device 550(*i,j*)(p+1,q) performs display at the predetermined luminance on the basis of the potential difference between the pad 541(*i,j*) and the conductive film COM2(*i*)(p+1,q).

Structure Example 3 of Display Apparatus

The display apparatus described in this embodiment is different from that in Structure example 1 of display apparatus in including a conductive film G3(*i*)p and a conductive film G3(*j*)q instead of the conductive film G2(*i*)(p,q) (see FIG. 12B). Different portions will be described in detail here, and the above description is referred to for portions that can use similar structures.

Structure Example 1 of Conductive Film G3(*i*)p

The conductive film G3(*i*)p is electrically connected to the pixel circuit 530(*i,j*)(p,q) and the pixel circuit 530(*i,j*+1) (p,q).

Structure Example 1 of Conductive Film G3(*j*)q

The conductive film G3(*j*)q is electrically connected to the pixel circuit 530(*i,j*)(p,q) and the pixel circuit 530(*i*+1,j) (p,q).

Thus, for example, a signal can be supplied to one or more of the pixel circuits included in the pixel circuit set $530(i,j)$ in the first period with the use of the conductive film $G1(i)p$. In addition, a signal can be supplied to one or more of the pixel circuits included in another pixel circuit set $530(i,j+1)$ in the same first period. For another example, a signal can be supplied to the plurality of pixel circuits in the first period with the use of the conductive film $G1(i)p$.

For another example, a signal can be supplied to the pixel circuit $530(i,j)(p,q)$ included in the pixel circuit set $530(i,j)$ in the second period with the use of the conductive film $G3(i)p$ and the conductive film $G3(j)q$. For another example, a signal can be supplied to the pixel circuit $530(i,j+1)(p,q)$ included in the pixel circuit set $530(i,j+1)$ in the second period with the use of the conductive film $G3(i)p$ and a conductive film $G3(j+1)q$. For another example, a signal can be supplied to the pixel circuit $530(i+1,j)(p,q)$ included in the pixel circuit set $530(i+1,j)$ in the second period with the use of a conductive film $G3(i+1)p$ and the conductive film $G3(j)q$.

With the use of two conductive films intersecting with each other, e.g., the conductive film $G3(i)p$ and the conductive film $G3(j)q$, a signal can be supplied to one pixel circuit selected from the pixel circuit set $530(i,j)$; thus, the number of conductive films can be reduced. As a result, a novel display apparatus that is highly convenient, useful, or reliable can be provided.

Structure Example 6 of Pixel Circuit Set $530(i,j)$

The pixel circuit set $530(i,j)$ described in this embodiment includes, for example, the pixel circuit $530(i,j)(p,q)$ to the pixel circuit $530(i,j)(p,q+3)$ and the pixel circuit $530(i,j)(p+1,q)$ to the pixel circuit $530(i,j)(p+1,q+3)$ (see FIG. 27, FIG. 28, and FIG. 29).

Structure Example 3 of Pixel Circuit $530(i,j)$

The pixel circuit $530(i,j)$ is different from that in Structure example 1 of pixel circuit $530(i,j)$ in including a switch SW3$p$ and a switch SW3$q$ instead of the switch SW2$(p,q)$ (see FIG. 26A). Different portions will be described in detail here, and the above description is referred to for portions that can use similar structures.

The switch SW3$p$ includes a first terminal electrically connected to the second electrode of the transistor M11, and has a function of controlling its on/off state on the basis of the potential of the conductive film $G3(i)p$.

The switch SW3$q$ includes a first terminal electrically connected to a second terminal of the switch SW3$p$ and a second terminal electrically connected to the pad $541(i,j)$, and has a function of controlling its on/off state on the basis of the potential of the conductive film $G3(j)q$.

Driving Method Example 5 of Display Apparatus

A method for driving the display apparatus of one embodiment of the present invention will be described. Specifically, the method for driving the display apparatus is described using the operations of the pixel circuit $530(i,j)(p,q)$ to the pixel circuit $530(i,j)(p+1,q+3)$ included in the pixel set $703(i,j)$ (see FIG. 26B and FIG. 27). Note that the period FR1 in the drawing corresponds to one frame period.

[First Step]

In a period from Time t9 to Time t10, the first selection signal is supplied to the conductive film $G1(i)p$. In a period from Time t10 to Time t11, the first selection signal is supplied to the conductive film $G1(i)p+1$.

The pixel circuit $530(i,j)(p,q)$ obtains an image signal from the conductive film $S1(j)q$ on the basis of the first selection signal. In addition, the pixel circuit $530(i,j)(p,q+1)$ obtains an image signal from the conductive film $S1(j)q+1$ on the basis of the first selection signal.

[Second Step]

In a period from Time t11 to Time t15, one of the conductive film $G3(j)q$ to the conductive film $G3(j)q+3$ is selected in the predetermined order and a fourth selection signal is supplied while a third selection signal is being supplied to the conductive film $G3(i)p$. In addition, one of the conductive film $COM2(i)(p,q)$ to the conductive film $COM2(i)(p,q+3)$ is selected in the predetermined order and the predetermined potential is supplied.

[Operation of Pixel $702(i,j)(p,q)$ in Second Step]

In the period from Time t11 to Time t15, the pixel circuit $530(i,j)(p,q)$ is supplied with the third selection signal from the conductive film $G3(i)p$, for example. In a period from Time t11 to Time t12, the fourth selection signal is supplied from the conductive film $G3(j)q$ and the potential of the pad $541(i,j)$ is controlled on the basis of the obtained image signal.

In a period from Time t11 to Time t12, the predetermined potential is supplied to the conductive film $COM2(i)(p,q)$.

Thus, in the period from Time t11 to Time t12, the light-emitting device $550(i,j)(p,q)$ performs display at the predetermined luminance on the basis of the potential difference between the pad $541(i,j)$ and the conductive film $COM2(i)(p,q)$.

[Operation of Pixel $702(i,j)(p,q+1)$ in Second Step]

In the period from Time t11 to Time t15, the pixel circuit $530(i,j)(p,q+1)$ is supplied with the third selection signal from the conductive film $G3(i)p$, for example. In a period from Time t12 to Time t13, the fourth selection signal is supplied from a conductive film $G3(j)q+1$ and the potential of the pad $541(i,j)$ is controlled on the basis of the obtained image signal.

In the period from Time t12 to Time t13, the predetermined potential is supplied to the conductive film $COM2(i)(p,q+1)$.

Thus, in the period from Time t12 to Time t13, the light-emitting device $550(i,j)(p,q+1)$ performs display at the predetermined luminance on the basis of the potential difference between the pad $541(i,j)$ and the conductive film $COM2(i)(p,q+1)$.

[Operation of Pixel $702(i,j)(p+1,q)$ in Second Step]

In a period from Time t15 to Time t19, the pixel circuit $530(i,j)(p+1,q)$ is supplied with the third selection signal from the conductive film $G3(i)p+1$, for example. In a period from Time t15 to Time t16, the fourth selection signal is supplied from the conductive film $G3(j)q$ and the potential of the pad $541(i,j)$ is controlled on the basis of the obtained image signal.

In the period from Time t15 to Time t16, the predetermined potential is supplied to the conductive film $COM2(i)(p+1,q)$.

Thus, in the period from Time t15 to Time t16, the light-emitting device $550(i,j)(p+1,q)$ performs display at the predetermined luminance on the basis of the potential difference between the pad $541(i,j)$ and the conductive film $COM2(i)(p+1,q)$.

Structure Example 4 of Display Apparatus

The display apparatus of one embodiment of the present invention includes the conductive film $COM2(i)(p,q)$ (see FIG. 13A). A conductive film COM2(*i*+1)(p,q) and a conductive film COM2(*j*+1)(p,q) are also included.

Structure Example 1 of Light-Emitting Device Set 550(*i,j*)

The light-emitting device set 550(*i,j*) includes the light-emitting device 550(*i,j*)(p,q). The light-emitting device set 550(*i,j*) also includes a light-emitting device 550(*i,j*)(1,1) to a light-emitting device 550(*i,j*)(s,f).

Note that the display apparatus or light-emitting device of this embodiment has a function of displaying a video with the use of a light-emitting diode. In the case where a light-emitting diode, which is a self-luminous device, is used as a display device, a backlight is unnecessary and a polarizing plate does not have to be provided in the display apparatus. Thus, the display apparatus can have reduced power consumption and can be thin and lightweight. A display apparatus using a light-emitting diode as a display device can have high display quality because of its high luminance (e.g., higher than or equal to 5000 cd/m$^2$, preferably higher than or equal to 10000 cd/m$^2$), high contrast, and wide viewing angle. Furthermore, with the use of an inorganic material as a light-emitting material, the lifetime of the display apparatus can be extended and the reliability can be increased.

In this embodiment, in particular, an example of using a micro LED as the light-emitting diode is described. Note that in this embodiment, a micro LED having a double heterojunction is described. Note that there is no particular limitation on the light-emitting diode, and for example, a micro LED having a quantum well junction or a nanocolumn LED may be used.

The area of a light-emitting region of the light-emitting diode is preferably less than or equal to 1 mm$^2$, further preferably less than or equal to 10000 μm$^2$, still further preferably less than or equal to 3000 μm$^2$, even further preferably less than or equal to 700 μm$^2$. The area of the region is preferably greater than or equal to 1 μm$^2$, further preferably greater than or equal to 10 μm$^2$, still further preferably greater than or equal to 100 μm$^2$. Note that in this specification and the like, a light-emitting diode in which the area of a light-emitting region is less than or equal to 10000 μm$^2$ is referred to as a micro LED or a micro light-emitting diode in some cases.

The display apparatus of this embodiment preferably includes a transistor including a channel formation region in a metal oxide layer. The transistor using a metal oxide can have low power consumption. Thus, a combination with a micro LED can achieve a display apparatus with significantly reduced power consumption.

The display apparatus of this embodiment preferably includes a transistor including a channel formation region in a semiconductor substrate (e.g., a silicon substrate). This enables high-speed operation of the circuits.

The display apparatus of this embodiment preferably has a stacked-layer structure of a transistor including a channel formation region in a semiconductor substrate and a transistor including a channel formation region in a metal oxide layer. This enables high-speed operation of a circuit and extremely low power consumption.

Structure Example 1 of Light-Emitting Device Set 550(*i,j*+1)

The light-emitting device set 550(*i,j*+1) includes a light-emitting device 550(*i,j*+1)(p,q). The light-emitting device set 550(*i,j*+1) also includes a light-emitting device 550(*i,j*+1)(1,1) to a light-emitting device 550(*i,j*+1)(s,t).

Structure Example 1 of Light-Emitting Device Set 550(*i*+1,j)

The light-emitting device set 550(*i*+1,j) includes a light-emitting device 550(*i*+1,j)(p,q). The light-emitting device set 550(*i*+1,j) also includes a light-emitting device 550(*i*+1,j)(1,1) to a light-emitting device 550(*i*+1,j)(s,t).

Structure Example 1 of conductive film COM2(*i*)(p,q)

The conductive film COM2(*i*)(p,q) is electrically connected to the light-emitting device 550(*i,j*)(p,q) and the light-emitting device 550(*i,j*+1)(p,q).

Thus, for example, with the use of the conductive film COM2(*i*)(p,q), the light-emitting device 550(*i,j*+1)(p,q) included in the light-emitting device set 550(*i,j*+1) can be selected at the timing when the light-emitting device 550(*i,j*)(p,q) included in the light-emitting device set 550(*i,j*) is selected. In addition, the pad 542(*i,j*+1) can supply power to the light-emitting device 550(*i,j*+1)(p,q) at the timing when the pad 542(*i,j*) supplies power to the light-emitting device 550(*i,j*)(p,q).

The area of the pad 542(*i,j*) can be close to the area occupied by the light-emitting device set 550(*i,j*). Moreover, electrical connection between the pads 541(*i,j*) and 542(*i,j*) is facilitated. In addition, electrical connection between the pixel circuit set 530(*i,j*) and the light-emitting device set 550(*i,j*) is facilitated. Alternatively, bonding between the pixel circuit set 530(*i,j*) and the light-emitting device set 550(*i,j*) is facilitated. As a result, a novel display apparatus that is highly convenient, useful, or reliable can be provided.

Structure Example 2 of Light-Emitting Device Set 550(*i,j*)

The light-emitting device set 550(*i,j*) described in this embodiment includes a plurality of light-emitting devices including the light-emitting device 550(*i,j*)(p,q), for example (see FIG. 15, FIG. 18, FIG. 21, FIG. 24, and FIG. 27).

Structure Example 5 of Display Apparatus

The display apparatus described in this embodiment is different from that in Structure example 4 of display apparatus in including a conductive film COM2(*j*)(p,q) instead of the conductive film COM2(*i*)(p,q) (see FIG. 13B). Different portions will be described in detail here, and the above description is referred to for portions that can use similar structures.

Structure Example 1 of Conductive Film COM2(*j*)(p,q)

The conductive film COM2(*j*)(p,q) is electrically connected to the light-emitting device 550(*i,j*)(p,q) and the light-emitting device 550(*i*+1,j)(p,q).

Thus, for example, with the use of the conductive film COM2(*j*)(p,q), the light-emitting device 550(*i*+1,j)(p,q) included in the light-emitting device set 550(*i*+1,j) can be selected at the timing when the light-emitting device 550(*i,j*)(p,q) included in the light-emitting device set 550(*i,j*) is selected. In addition, a pad 542(*i*+1,j) can supply power to the light-emitting device 550(*i*+1,j)(p,q) at the timing when the pad 542(*i*,*j*) supplies power to the light-emitting device 550(*i*,*j*)(p,q). As a result, a novel display apparatus that is highly convenient, useful, or reliable can be provided.

Structure Example 3 of Light-Emitting Device Set 550(*i*,*j*)

The light-emitting device set 550(*i*,*j*) described in this embodiment includes a plurality of light-emitting devices including the light-emitting device 550(*i*,*j*)(p,q) and the light-emitting device 550(*i*,*j*)(p+1,q), for example (see FIG. 16, FIG. 19, FIG. 22, FIG. 25, and FIG. 29). Note that the light-emitting device 550(*i*,*j*)(p+1,q) is electrically connected to the conductive film COM2(*j*)(p+1,q).

This embodiment can be combined with the description of the other embodiments as appropriate.

Embodiment 3

In this embodiment, display apparatuses and a display system of one embodiment of the present invention will be described with reference to FIG. 30 to FIG. 35.

Figure 30:
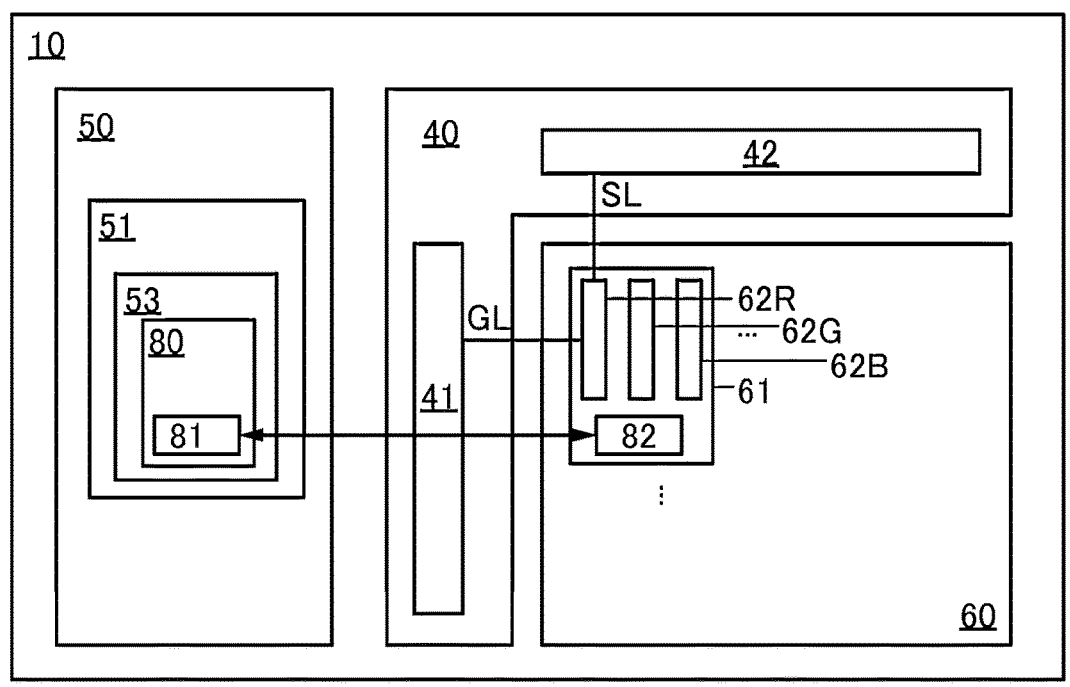
FIG. 30 is a diagram illustrating a structure of a display apparatus of an embodiment.

FIG. 30 is a block diagram illustrating a structure of a display apparatus of one embodiment of the present invention.

Figure 31:
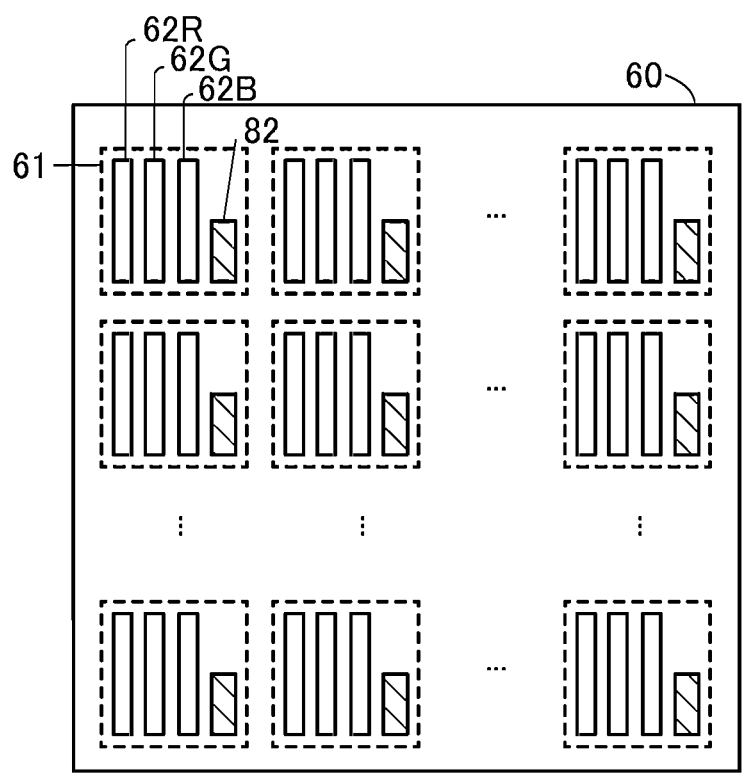
FIG. 31 is a diagram illustrating a structure of a display apparatus of an embodiment.

FIG. 31 is a block diagram illustrating a structure of a display portion illustrated in FIG. 30.

Figure 32:
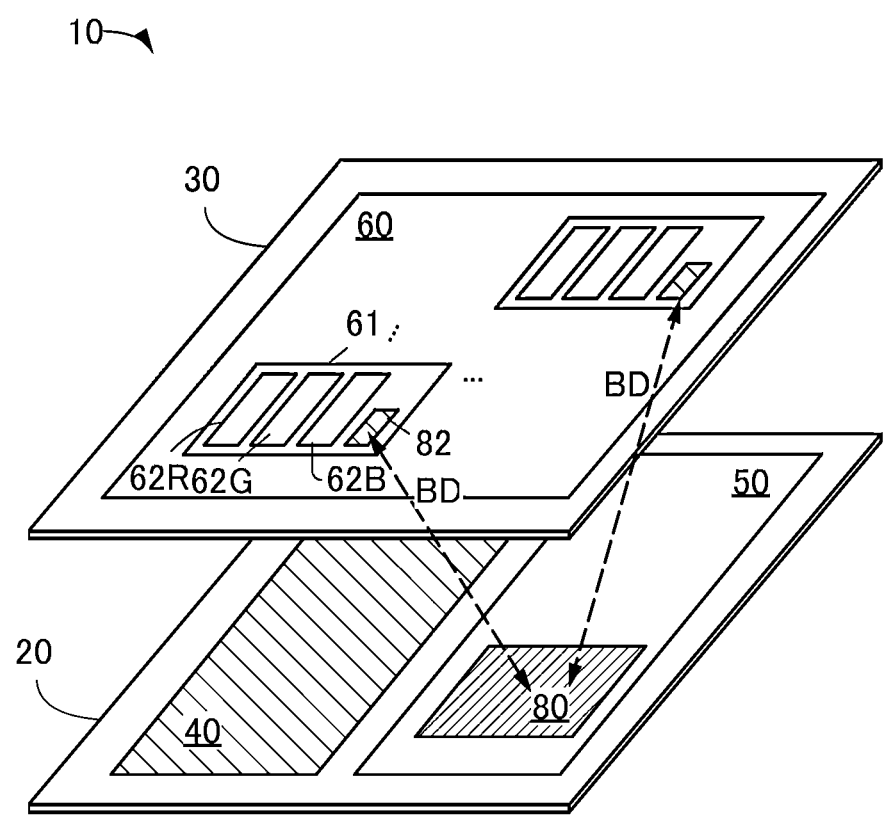
FIG. 32 is a diagram illustrating a structure of a display apparatus of an embodiment.

FIG. 32 is a block diagram illustrating a structure of the display apparatus of one embodiment of the present invention.

Figure 33A:
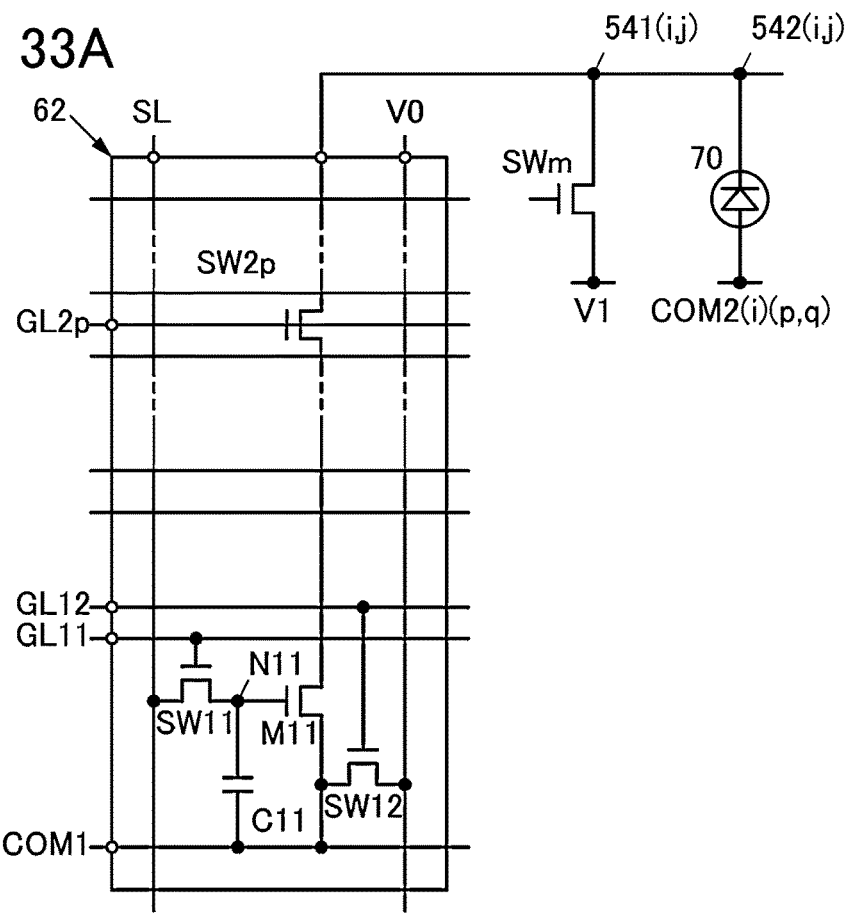
FIG. 33A and FIG. 33B are diagrams illustrating a structure of a display apparatus of an embodiment.
Figure 33B:
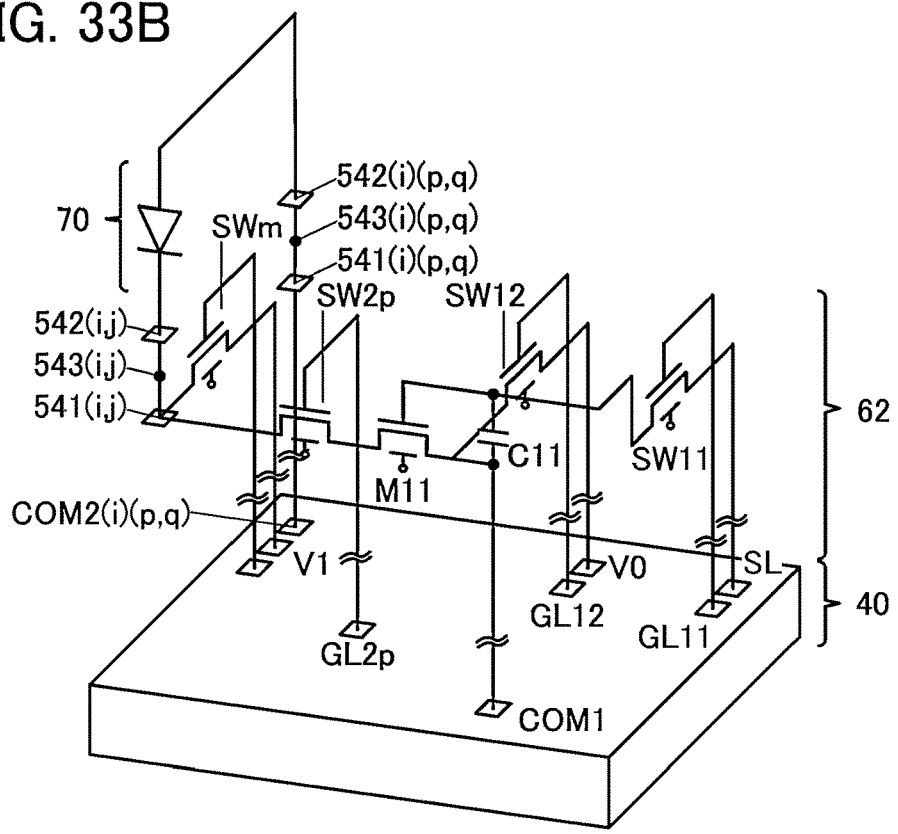

FIG. 33A and FIG. 33B are block diagrams illustrating the structure of the pixel illustrated in FIG. 32.

Figure 34:
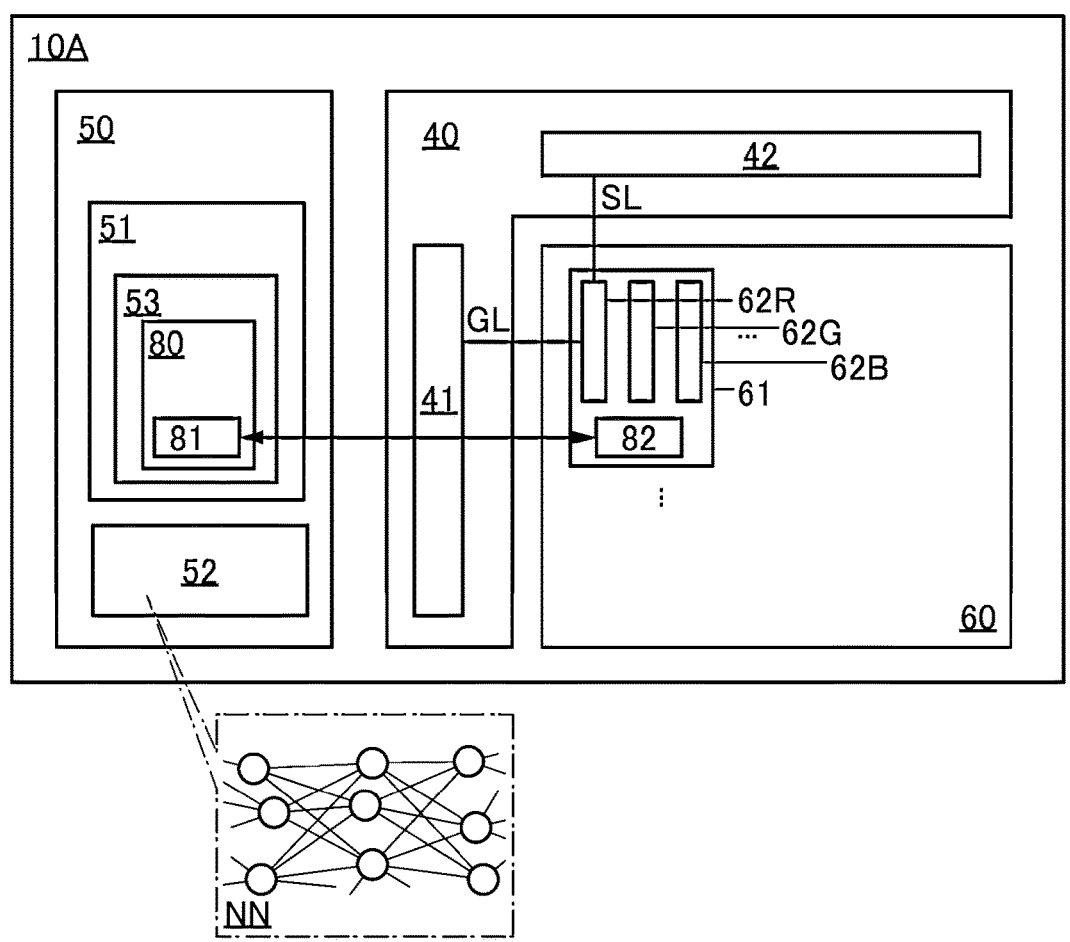
FIG. 34 is a diagram illustrating a structure of a display apparatus of an embodiment.

FIG. 34 is a block diagram illustrating a structure of a display apparatus of one embodiment of the present invention.

Figure 35A:
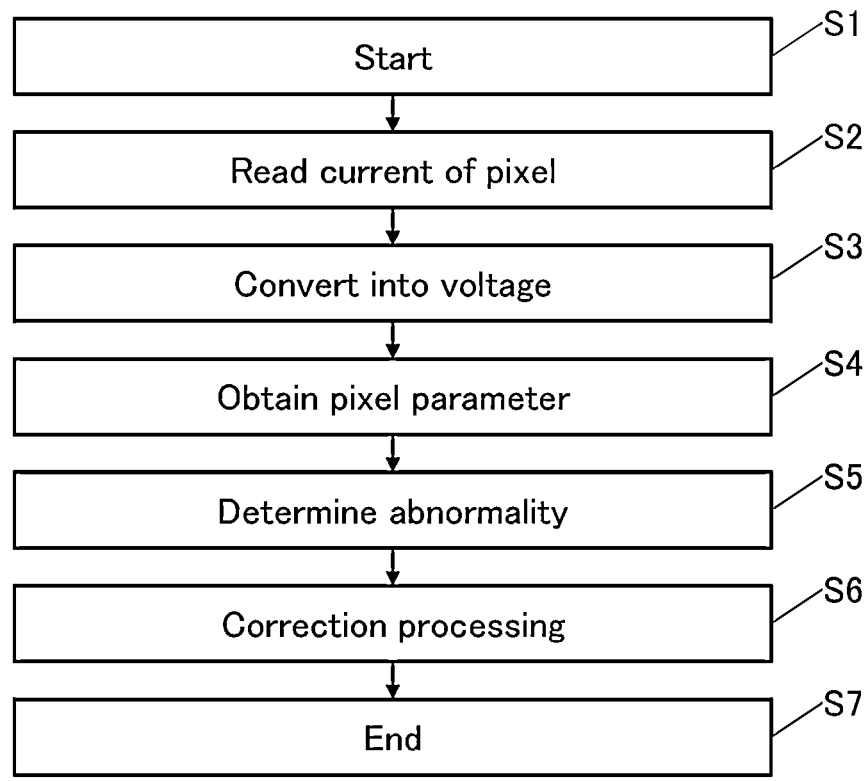
FIG. 35A and FIG. 35B are diagrams illustrating a structure of a display apparatus of an embodiment.
Figure 35B:
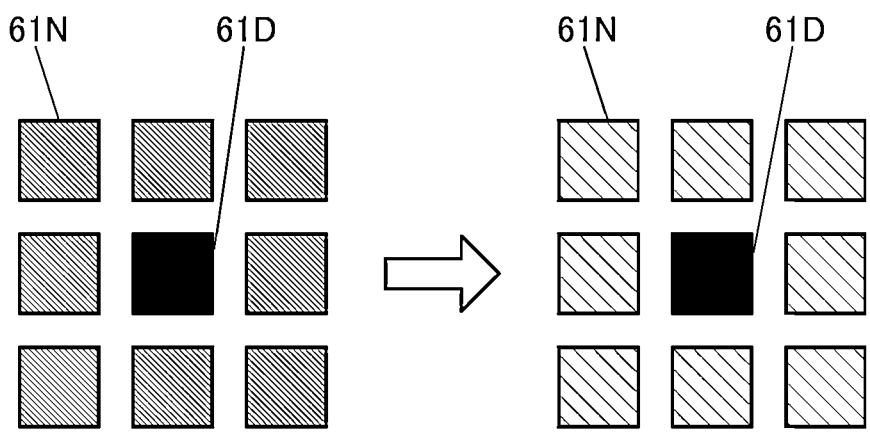

FIG. 35A is a flowchart for a correction method, and FIG. 35B is a schematic view explaining the correction method.

Structure Example 1 of Display Apparatus

Next, FIG. 30 is a block diagram illustrating components included in a display apparatus 10. The display apparatus includes a driver circuit 40, a functional circuit 50, and a display portion 60.

Structure Example 1 of Driver Circuit 40

The driver circuit 40 includes a gate driver 41 and a source driver 42, for example. The gate driver 41 has a function of driving a plurality of gate lines GL for outputting signals to pixel circuits 62R, 62G, and 62B. The source driver 42 has a function of driving a plurality of source lines SL for outputting signals to the pixel circuits 62R, 62G, and 62B. The driver circuit 40 supplies voltage for performing display with the pixel circuits 62R, 62G, and 62B to the pixel circuits 62R, 62G, and 62B through a plurality of wirings.

Structure Example 1 of Functional Circuit 50

The functional circuit 50 includes a CPU 51, and the CPU 51 can be used for arithmetic processing of data. The CPU 51 includes a CPU core 53. The CPU core 53 includes a flip-flop 80 for temporarily retaining data used for arithmetic processing. The flip-flop 80 includes a plurality of scan flip-flops 81, and each of the scan flip-flops 81 is electrically connected to a backup circuit 82 provided in the display portion 60. The flip-flop 80 inputs and outputs data of the scan flip-flops (backup data) to/from the backup circuit 82.

<<Display Portion 60>>

FIG. 31 and FIG. 30 illustrate a structure example of the layout of the backup circuit 82 and the pixel circuits 62R, 62G, and 62B functioning as subpixels in the display portion 60.

FIG. 31 illustrates a structure in which a plurality of pixels 61 are arranged in a matrix in the display portion 60. The pixels 61 each include the backup circuit 82 in addition to the pixel circuits 62R, 62G, and 62B. As described above, the backup circuit 82 and the pixel circuits 62R, 62G, and 62B can be formed using OS transistors and thus can be placed in the same pixel.

The display portion 60 includes the plurality of pixels 61 each including the pixel circuits 62R, 62G, and 62B and the backup circuit 82. The backup circuit 82 is not necessarily placed in each of the pixels 61 that are repeating units, as described with reference to FIG. 31. The backup circuit 82 can be placed freely in accordance with the shape of the display portion 60, the shapes of the pixel circuits 62R, 62G, and 62B, and the like.

Structure Example 2 of Display Apparatus

FIG. 32 is a block diagram schematically illustrating a structure example of the display apparatus 10 that is a display apparatus of one embodiment of the present invention. The display apparatus 10 includes a layer 20 and a layer 30, and the layer 30 can be stacked above the layer 20, for example. An interlayer insulator or a conductor for electrical connection between different layers can be provided between the layer 20 and the layer 30.

<<Layer 20>>

A transistor provided in the layer 20 can be a transistor containing silicon in a channel formation region (also referred to as a Si transistor), such as a transistor containing single crystal silicon in a channel formation region, for example. In particular, the use of a transistor containing single crystal silicon in a channel formation region as the transistor provided in the layer 20 can increase the on-state current of the transistor. This is preferable because circuits included in the layer 20 can be driven at high speed. The Si transistor can be formed by microfabrication to have a channel length of 3 nm to 10 nm, for example; thus, the display apparatus 10 can be provided with a CPU, an accelerator such as a GPU, an application processor, or the like.

The driver circuit 40 and the functional circuit 50 are provided in the layer 20. The Si transistor of the layer 20 can have a high on-state current. Thus, each circuit can be driven at high speed.

Structure Example 2 of Driver Circuit 40

The driver circuit 40 includes a gate line driver circuit, a source line driver circuit, and the like for driving the pixel circuits 62R, 62G, and 62B. The driver circuit 40 includes, for example, the gate line driver circuit and the source line driver circuit for driving the pixels 61 in the display portion 60. With a structure in which the driver circuit 40 is provided not in the layer 30 where the display is provided but in the layer 20, an area occupied by the display portion in the layer 30 can be large. In addition, the driver circuit 40 may include an LVDS (Low Voltage Differential Signaling) circuit, a D/A (Digital to Analog) converter circuit, or the like functioning as an interface for receiving data such as image data from the outside of the display apparatus 10. The Si transistor of the layer 20 can have a high on-state current. The channel length, the channel width, or the like of the Si transistor may be varied in accordance with the operation speed of each circuit.

<<Layer 30>>

As a transistor provided in the layer 30, a bottom-gate transistor, a top-gate transistor, or the like can be used. A semiconductor containing a Group 14 element can be used for a semiconductor film, for example. Specifically, a semiconductor containing silicon can be used for a semiconductor film. For example, hydrogenated amorphous silicon, polysilicon, or single crystal silicon can be used. Moreover, a metal oxide can be used for a semiconductor film. For example, an OS transistor can be used. In particular, a transistor including an oxide containing at least one of indium, an element M (the element M is aluminum, gallium, yttrium, or tin), and zinc in a channel formation region is preferably used as the OS transistor. Such an OS transistor has a characteristic of an extremely low off-state current. Thus, it is particularly preferable to use the OS transistor as a transistor provided in a pixel circuit included in a display portion, in which case analog data written to the pixel circuit can be retained for a long period.

The display portion 60 including the plurality of pixels 61 is provided in the layer 30. The pixel circuits 62R, 62G, and 62B that control emission of red light, green light, and blue light are provided in the pixels 61. The pixel circuits 62R, 62G, and 62B function as the subpixels of the pixels 61. Since the pixel circuits 62R, 62G, and 62B include the OS transistors, analog data written to the pixel circuits can be retained for a long period. The backup circuit 82 is provided in each of the pixels 61 included in the layer 30. Note that the backup circuit is sometimes referred to as a storage circuit or a memory circuit. The backup circuit inputs and outputs data of the scan flip-flops (backup data BD) to/from the flip-flop 80.

Structure Example 1 of Pixel Circuit

FIG. 33A and FIG. 33B illustrate a structure example of a pixel circuit 62 that can be used as the pixel circuits 62R, 62G, and 62B and a light-emitting element 70 connected to the pixel circuit 62. FIG. 33A is a diagram illustrating connection between elements, and FIG. 33B is a diagram schematically illustrating the vertical positional relationship of the driver circuit 40, the pixel circuit 62, and the light-emitting element 70.

In this specification and the like, the term "element" can be replaced with the term "device" in some cases. For example, a display element, a light-emitting element, and a liquid crystal element can be replaced with a display device, a light-emitting device, and a liquid crystal device, respectively.

The pixel circuit 62, which is illustrated as an example in FIG. 33A and FIG. 33B, includes the switch SW11, a switch SW2p, the switch SW12, a switch SWm, the transistor M11, and the capacitor C11. The switch SW11, the switch SW2p, the switch SW12, the switch SWm, and the transistor M11 can be formed of OS transistors. Each of the transistors of the switch SW11, the switch SW2p, the switch SW12, the switch SWm, and the transistor M11 preferably includes a back gate electrode, in which case the back gate electrode can be supplied with the same signal as a gate electrode, or the back gate electrode can be supplied with signals different from those of the gate electrode.

The switch SW11 includes the first terminal electrically connected to the source line SL and the second terminal electrically connected to the node N11, and has a function of controlling its on/off state on the basis of the potential of a gate line GL11.

The transistor M11 includes the gate electrode electrically connected to the node N11 and the first electrode electrically connected to the conductive film COM1. The conductive film COM1 is a wiring for supplying a potential for supplying current to the light-emitting element 70 and a wiring for outputting current flowing through the pixel circuit 62 to the driver circuit 40 or the functional circuit 50.

The capacitor C11 includes the conductive film electrically connected to the node N11 and the conductive film electrically connected to the conductive film COM1.

The switch SW2p includes a first terminal electrically connected to the second electrode of the transistor M11 and a second terminal electrically connected to the first pad 541($i,j$), and has a function of controlling its on/off state on the basis of the potential of a gate line GL2p.

The light-emitting element 70 includes one electrode electrically connected to the first pad 541($i,j$) and the other electrode electrically connected to the conductive film COM2($i$)(p,q). The conductive film COM2($i$)(p,q) is a wiring for supplying a potential for supplying current to the light-emitting element 70.

Accordingly, the intensity of light emitted from the light-emitting element 70 can be controlled in accordance with an image signal supplied to the gate electrode of the transistor M11.

The switch SW12 includes the first terminal electrically connected to a wiring V0 and the second terminal electrically connected to the first electrode of the transistor M11, and has a function of controlling its on/off state on the basis of the potential of a gate line GL12. The wiring V0 is a wiring for supplying a reference potential and outputting current flowing through the pixel circuit 62 to the driver circuit 40 or the functional circuit 50.

The switch SWm includes a first terminal electrically connected to the wiring V1 and a second terminal electrically connected to the first pad 541($i,j$), and has a function of controlling its on/off state on the basis of a control signal. The wiring V1 is a wiring for supplying a reference potential.

Thus, a current value that can be used for setting of pixel parameters can be output from the wiring V0 through the switch SWm and the switch SW12. More specifically, the wiring V0 can function as a monitor line for outputting current flowing through the transistor M11 to the outside. The current output to the wiring V0 is converted into voltage by a source follower circuit or the like and output to the outside. Alternatively, the current can be converted into a digital signal by an A-D converter or the like and output to the driver circuit 40 or the like.

Structure Example 2 of Pixel Circuit

Note that in the structure illustrated as an example in FIG. 33B, the wirings electrically connecting the pixel circuit 62 and the driver circuit 40 can be shortened, so that wiring resistance of the wirings can be reduced. Thus, data can be written at high speed, which enables high-speed driving of the display apparatus 10. Accordingly, even when the number of pixels 61 included in the display apparatus 10 is large, a sufficient frame period can be ensured, thereby increasing the pixel density of the display apparatus 10. In addition, the increased pixel density of the display apparatus 10 can increase the resolution of an image displayed by the display apparatus 10. For example, the pixel density of the display apparatus 10 can be higher than or equal to 1000 ppi, higher than or equal to 5000 ppi, or higher than or equal to 7000 ppi. Thus, the display apparatus 10 can be, for example, a display apparatus for AR or VR and can be suitably used in an electronic device with a short distance between the display portion and the user, such as an HMD.

Although the gate line GL11, the gate line GL12, the gate line GL2p, the conductive film COM1, the wiring V0, the wiring V1, and the source line SL are supplied with signals and voltage from the driver circuit 40 below the pixel circuit 62 through the wirings in FIG. 33B, one embodiment of the present invention is not limited thereto. For example, wirings for supplying signals and voltage of the driver circuit 40 may be led to an outer region of the display portion 60 and electrically connected to the pixel circuits 62 arranged in a matrix in the layer 30. In this case, a structure in which the gate driver 41 included in the driver circuit 40 is provided in the layer 30 is effective. That is, a structure in which OS transistors are used as transistors of the gate driver 41 is effective. A structure in which part of the function of the source driver 42 included in the driver circuit 40 is provided in the layer 30 is effective. For example, a structure in which a demultiplexer distributing signals output from the source driver 42 to source lines is provided in the layer 30 is effective. A structure in which OS transistors are used as transistors of the demultiplexer is effective.

<<Backup Circuit 82>>

As the backup circuit 82, for example, a memory including OS transistors is suitable. The backup circuit formed using OS transistors has advantages of, for example, inhibiting a decrease in voltage corresponding to data to be backed up and consuming almost no power for data retention, because the OS transistors have an extremely low off-state current. The backup circuit 82 including the OS transistors can be provided in the display portion 60 in which the plurality of pixels 61 are placed. FIG. 32 illustrates a state in which the backup circuit 82 is provided in each of the pixels 61.

The backup circuit 82 formed using the OS transistors can be stacked over the layer 20 including the Si transistor. The backup circuits 82 may be arranged in a matrix like the subpixels in the pixels 61; alternatively, one backup circuit 82 may be provided for every plurality of pixels. That is, the backup circuits 82 can be arranged in the layer 30 without being limited by the arrangement of the pixels 61. Therefore, the backup circuits 82 can be arranged without any increase in the circuit area and the degree of flexibility in the layout of the display portion or the circuits is enhanced, so that memory capacity of the backup circuits 82 required for arithmetic processing can be increased.

Structure Example 3 of Display Apparatus

FIG. 34 illustrates a modification example of the components included in the display apparatus 10 described above.

A block diagram of a display apparatus 10A illustrated in FIG. 34 corresponds to a structure in which an accelerator 52 is added to the functional circuit 50 in the display apparatus 10 in FIG. 30.

The accelerator 52 functions as a dedicated arithmetic circuit to product-sum operation processing of an artificial neural network NN. In the arithmetic operation using the accelerator 52, processing for correcting the outline of an image by up-conversion of display data or the like can be performed, for example. During the arithmetic processing with the accelerator 52, it is possible to reduce the power consumption by power gating control on the CPU 51.

Structure Example of Display System

In the display apparatus of one embodiment of the present invention, the pixel circuit and the functional circuit can be stacked; thus, a defective pixel can be detected using the functional circuit provided below the screen circuit. Information on the defective pixel can be used to correct a display defect due to the defective pixel, leading to normal display.

Part of a correction method described below as an example may be performed by a circuit provided outside the display apparatus. Part of the correction method may be performed by the driver circuit 40 of the display apparatus 10.

A more specific example of the correction method will be described below. FIG. 35A is a flowchart for the correction method described below.

First, the correction operation starts in Step S1.

Next, current of the pixels is read in Step S2. For example, each of the pixels can be driven to output current to a monitor line electrically connected to the pixel.

Then, the read current is converted into voltage in Step S3. In the case of using a digital signal in a subsequent process, conversion into digital data can be performed in Step S3. For example, analog data can be converted into digital data using an analog-digital converter circuit (ADC).

Next, pixel parameters of the pixels are obtained on the basis of the acquired data in Step S4. Examples of the pixel parameters include the threshold voltage and field-effect mobility of a driving transistor, the threshold voltage of a light-emitting element, and a current value at a certain voltage.

Subsequently, each of the pixels is determined to be abnormal or not on the basis of the pixel parameter in Step S5. For example, a pixel is determined to be abnormal when its pixel parameter has a value exceeding (or lower than) a predetermined threshold value.

An abnormal pixel is recognized as a dark spot defect when luminance is significantly lower than that corresponding to an input data potential, or recognized as a bright spot defect when luminance is significantly higher than that corresponding to an input data potential, for example.

The address of the abnormal pixel and the kind of the defect can be specified and acquired in Step S5.

Then, correction processing is performed in Step S6.

An example of the correction processing is described with reference to FIG. 35B. FIG. 35B schematically illustrates 3×3 pixels. Here, a pixel 61D at the center is regarded as a dark spot defect. FIG. 35B schematically illustrates a state in which the pixel 61D is in a non-lighting state and pixels 61N around the pixel 61D are in lighting states with predetermined luminance.

A dark spot defect is due to a pixel unlikely to have normal luminance even when correction for increasing a data potential input to the pixel is performed. Hence, correction for increasing luminance is performed on the pixels 61N around the pixel 61D recognized as a dark spot defect, as illustrated in FIG. 35B. As a result, a normal image can be displayed even when a dark spot defect exists.

In the case of a bright spot defect, the luminance of pixels around the defect is decreased, so that the bright spot defect can be less noticeable.

Such a correction method for compensating for an abnormal pixel by pixels around the abnormal pixel is effective particularly in the case of a display apparatus with a higher resolution (e.g., 1000 ppi or higher) because it is difficult to see individual pixels separately from each other.

It is preferred that correction be performed such that a data potential is not input to an abnormal pixel recognized as a dark spot defect, a bright spot defect, or the like.

As described above, a correction parameter can be set for each pixel. When the correction parameter is used for image data to be input, correction image data that enables the display apparatus 10 to display an optimal image can be generated.

As well as in an abnormal pixel and pixels around the abnormal pixel, pixel parameters vary in pixels not determined to be abnormal; thus, display unevenness due to the variation might be recognized when an image is displayed, in some cases. Hence, correction parameters for the pixels not determined to be abnormal can be set so as to cancel (level off) the variation of the pixel parameters. For example, a reference value based on the mean value, average value, or the like of pixel parameters of some or all of the pixels can be set, and a correction value used for canceling a difference of a pixel parameter of a certain pixel from the reference value can be set as a correction parameter of the pixel.

For each of pixels around an abnormal pixel, it is preferred to set correction data that takes into consideration both a correction amount for compensating for the abnormal pixel and a correction amount for canceling pixel parameter variation.

Next, the correction operation ends in Step S7.

After that, an image can be displayed on the basis of the correction parameters obtained in the correction operation and image data to be input.

Note that a neural network may be used for the correction operation. In the case where an arithmetic operation based on an artificial neural network is performed in the above-described display correction system, a product-sum operation is repeatedly performed. In the arithmetic operation using the accelerator 52, the above-mentioned correction of the display defects can be performed. During the arithmetic processing with the accelerator 52, it is possible to reduce the power consumption by power gating control on the CPU 51. The neural network can determine correction parameters on the basis of inference results obtained by machine learning, for example. Estimation can be performed by executing an arithmetic operation based on an artificial neural network such as a deep neural network (DNN), a convolutional neural network (CNN), a recurrent neural network (RNN), an autoencoder, a deep Boltzmann machine (DBM), or a deep belief network (DBN), for example. In the case where correction parameters are determined by a neural network, high-accuracy correction can be performed to make an abnormal pixel less noticeable without using a detailed algorithm for correction.

The above is the description of the correction method.

Note that during the arithmetic operation by the display correction system, which is performed for correcting current flowing through a pixel, data in the arithmetic operation can be retained as backup data in the CPU 51. Therefore, the display correction system is particularly effective in arithmetic processing performed with an enormous amount of calculation, such as an arithmetic operation based on an artificial neural network. Note that it is also possible to reduce power consumption in addition to a reduction in display defects by making the CPU 51 function as an application processor, in combination with, for example, driving that makes a frame frequency changeable.

This embodiment can be combined with the description of the other embodiments as appropriate.

Embodiment 4

In this embodiment, an example of a cross-sectional structure of the display apparatus 10 of one embodiment of the present invention will be described with reference to FIG. 36 to FIG. 41.

Figure 36:
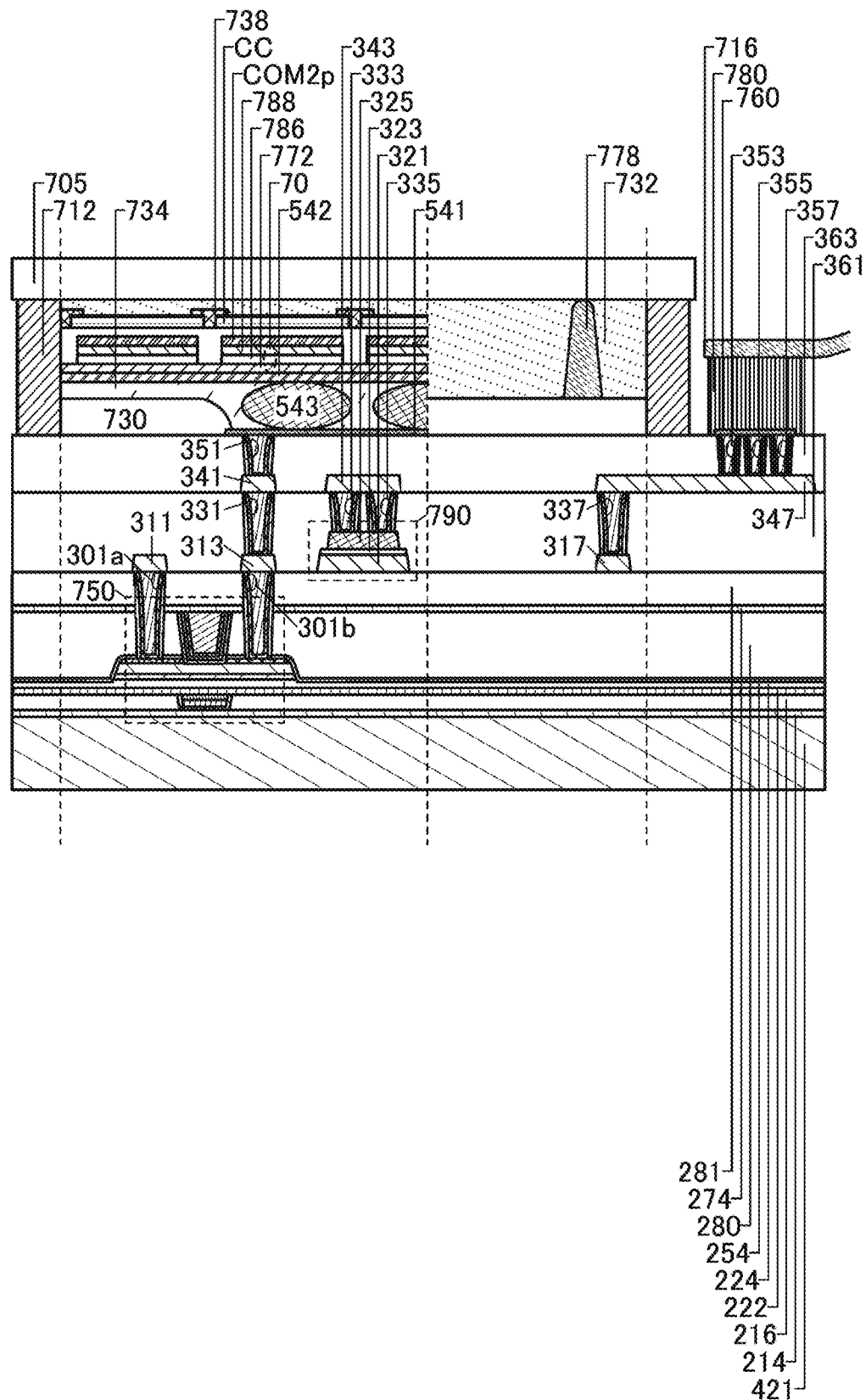
FIG. 36 is a diagram illustrating a structure of a display apparatus of an embodiment.

FIG. 36 is a cross-sectional view illustrating a structure of the display apparatus of one embodiment of the present invention.

Figure 37:
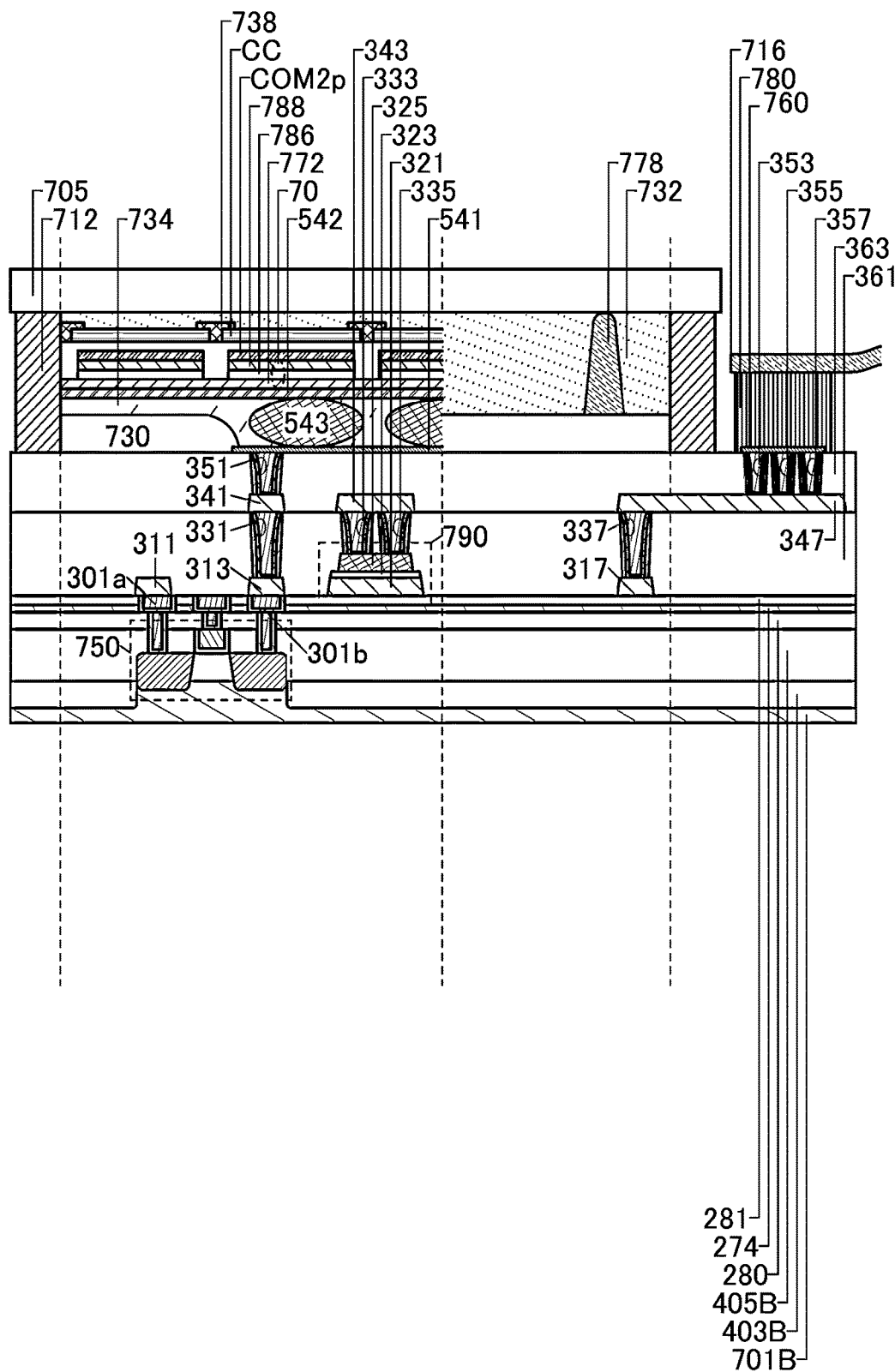
FIG. 37 is a diagram illustrating a structure of a display apparatus of an embodiment.

FIG. 37 is a cross-sectional view illustrating a structure of the display apparatus of one embodiment of the present invention that is different from the structure illustrated in FIG. 36.

Figure 38:
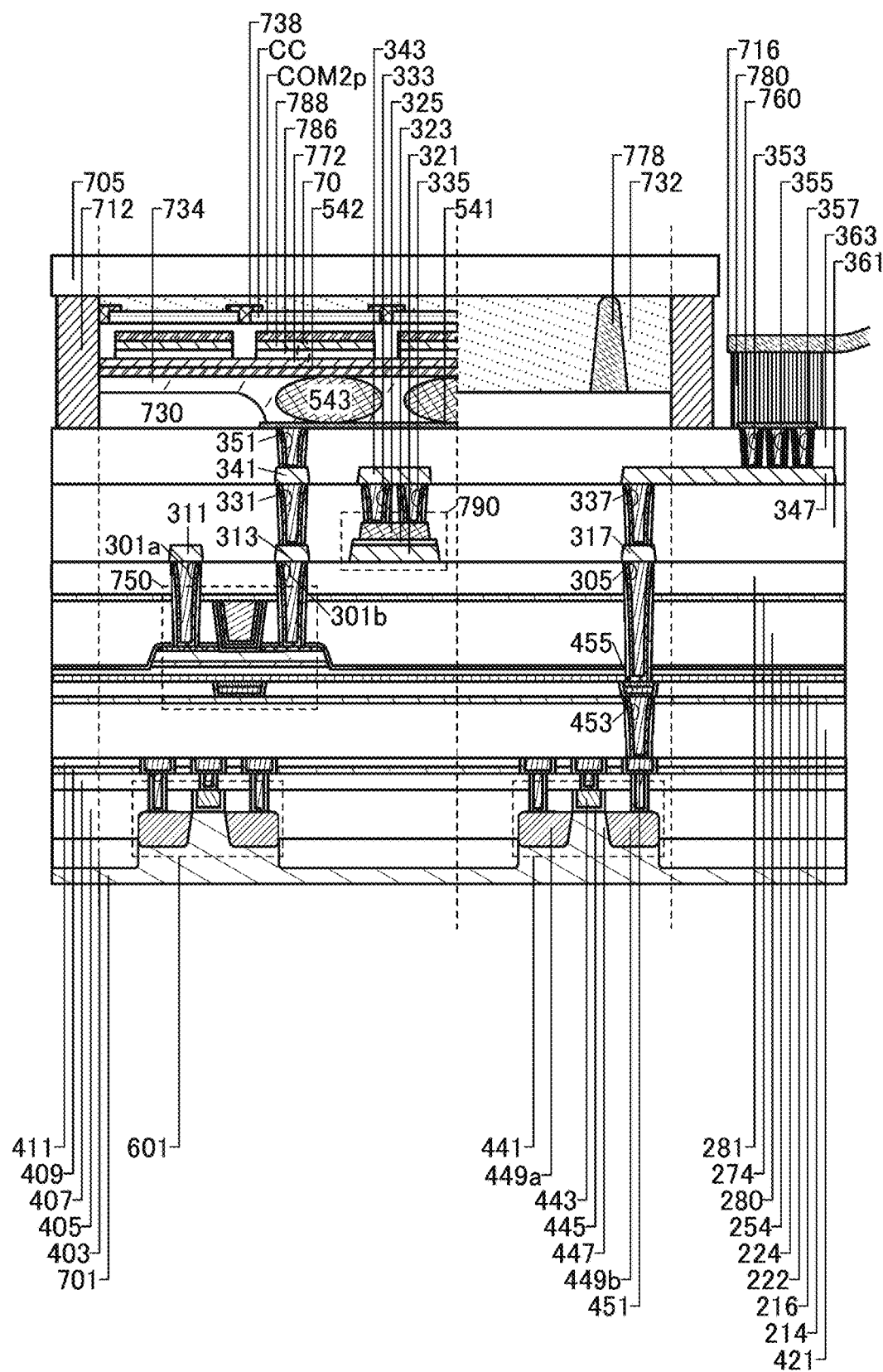
FIG. 38 is a diagram illustrating a structure of a display apparatus of an embodiment.

FIG. 38 is a cross-sectional view illustrating a structure of the display apparatus of one embodiment of the present invention that is different from the structure illustrated in FIG. 36.

Figure 39:
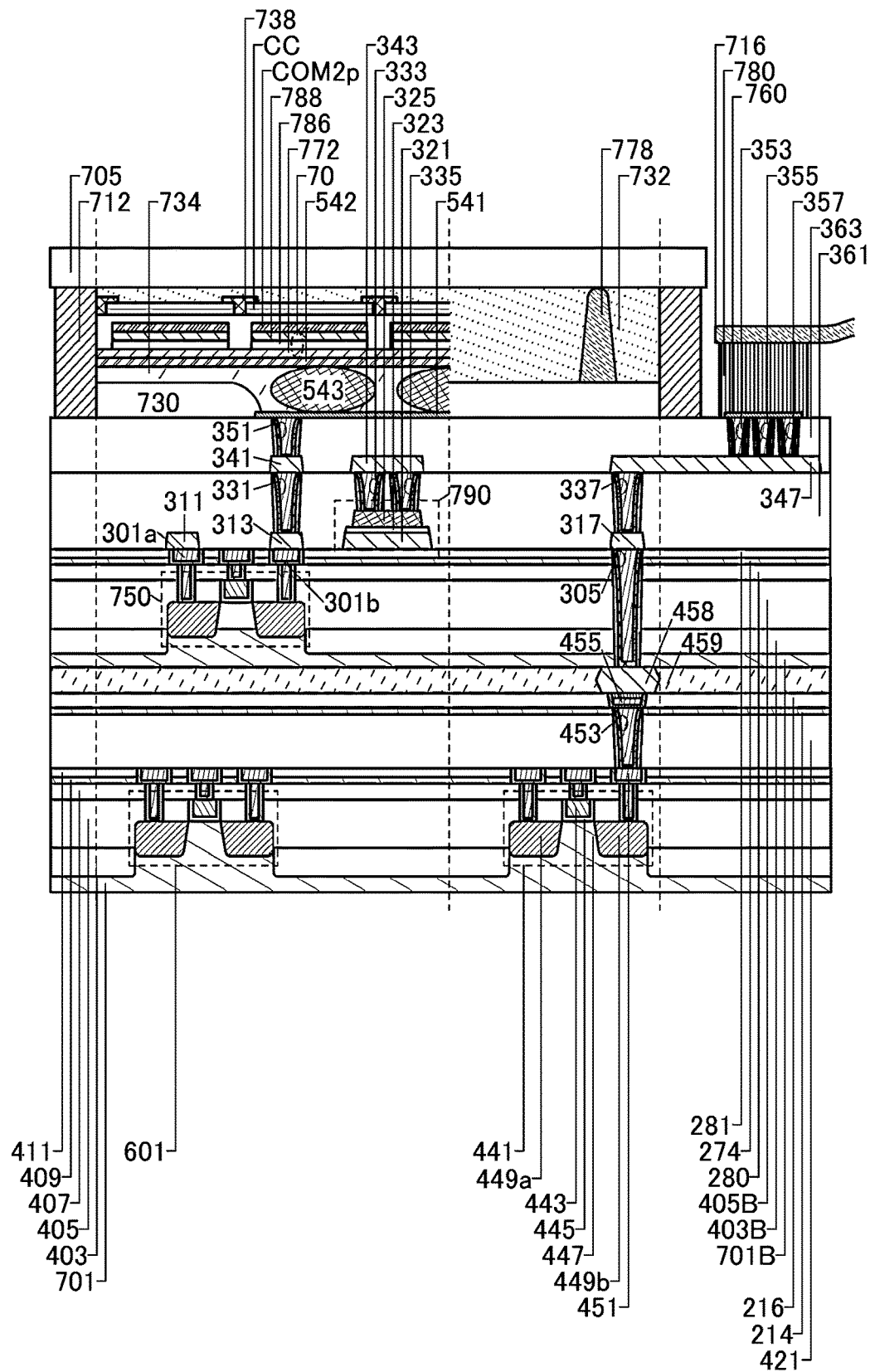
FIG. 39 is a diagram illustrating a structure of a display apparatus of an embodiment.

FIG. 39 is a cross-sectional view illustrating a structure of the display apparatus of one embodiment of the present invention that is different from the structure illustrated in FIG. 38.

Figure 40:
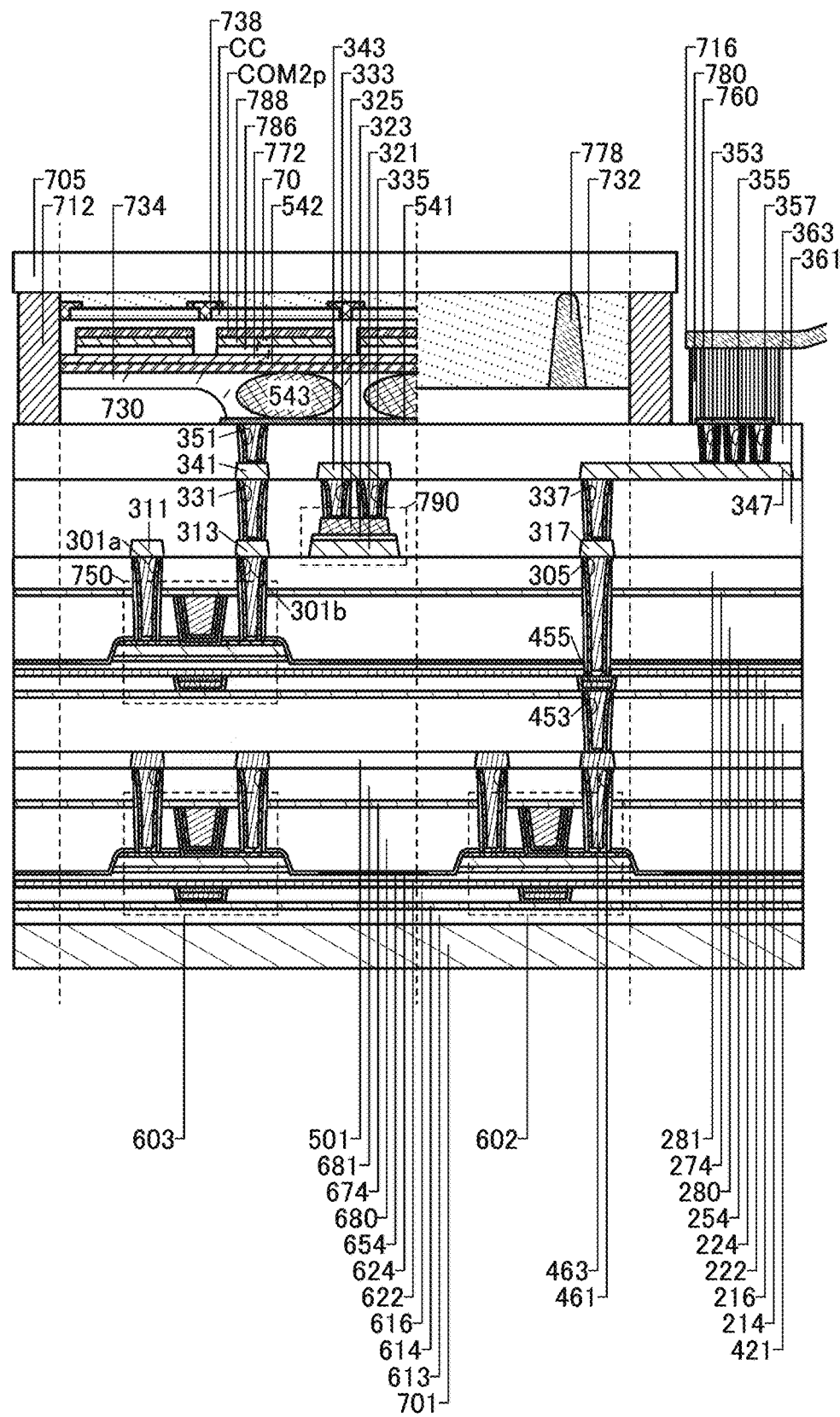
FIG. 40 is a diagram illustrating a structure of a display apparatus of an embodiment.

FIG. 40 is a cross-sectional view illustrating a structure of the display apparatus of one embodiment of the present invention that is different from the structures illustrated in FIG. 36 to FIG. 39.

Figure 41:
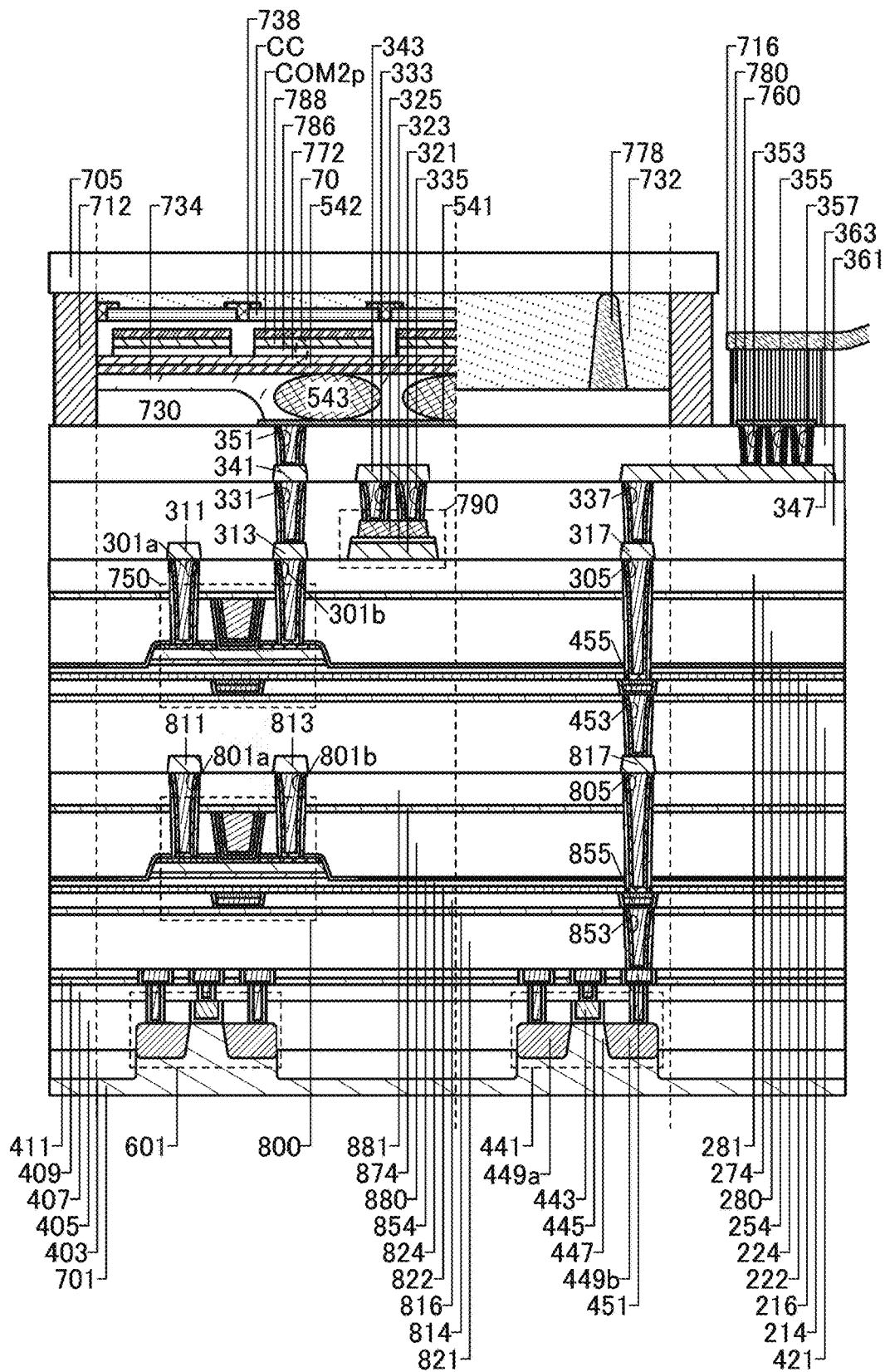
FIG. 41 is a diagram illustrating a structure of a display apparatus of an embodiment.

FIG. 41 is a cross-sectional view illustrating a structure of the display apparatus of one embodiment of the present invention that is different from the structures illustrated in FIG. 36 to FIG. 40.

Structure Example 1 of Display Apparatus

FIG. 36 is a cross-sectional view illustrating a structure example of the display apparatus 10. The display apparatus 10 includes an insulator 421 and a substrate 705, and the insulator 421 and the substrate 705 are bonded to each other with a sealant 712. It is preferable to use an OS transistor for the pixel circuit. Furthermore, at least part of the driver circuit may be formed using an OS transistor. In addition, at least part of the functional circuit may be formed using an OS transistor. Moreover, at least part of the driver circuit may be externally provided. At least part of the functional circuit may be externally provided.

<<Insulator 421, Insulator 214, and Insulator 216>>

Any of a variety of insulator substrates such as a glass substrate and a sapphire substrate can be used for the insulator 421. An insulator 214 is provided over the insulator 421, and an insulator 216 is provided over the insulator 214.

<<Insulator 222, Insulator 224, Insulator 254, Insulator 280, Insulator 274, and Insulator 281>>

An insulator 222, an insulator 224, an insulator 254, an insulator 280, an insulator 274, and an insulator 281 are provided over the insulator 216.

The insulator 421, the insulator 214, the insulator 280, the insulator 274, and the insulator 281 have a function of an interlayer film and may have a function of a planarization film that covers an uneven shape thereunder.

<<Insulator 361>>

An insulator 361 is provided over the insulator 281. A conductor 317 and a conductor 337 are embedded in the insulator 361. Here, the top surface of the conductor 337 and the top surface of the insulator 361 can be substantially level with each other.

<<Insulator 363>>

An insulator 363 is provided over the conductor 337 and the insulator 361. A conductor 347, a conductor 353, a conductor 355, and a conductor 357 are embedded in the insulator 363. Here, the top surfaces of the conductor 353, the conductor 355, and the conductor 357 and the top surface of the insulator 363 can be substantially level with each other.

A conductor 341, a conductor 343, and a conductor 351 are embedded in the insulator 363. Here, the top surface of the conductor 351 and the top surface of the insulator 363 can be substantially level with each other.

The insulator 361 and the insulator 363 have a function of an interlayer film and may also have a function of a planarization film that covers an uneven shape thereunder. For example, the top surface of the insulator 363 may be planarized by planarization treatment using a chemical mechanical polishing (CMP) method or the like to have the increased planarity.

<<Connection Electrode 760>>

A connection electrode 760 is provided over the conductor 353, the conductor 355, the conductor 357, and the insulator 363. An anisotropic conductor 780 is provided to be electrically connected to the connection electrode 760, and an FPC (Flexible Printed Circuit) 716 is provided to be electrically connected to the anisotropic conductor 780. A variety of signals and the like are supplied to the display apparatus 10 from the outside of the display apparatus 10 through the FPC 716.

Although FIG. 36 illustrates three conductors of the conductor 353, the conductor 355, and the conductor 357 as conductors having a function of electrically connecting the connection electrode 760 and the conductor 347, one embodiment of the present invention is not limited thereto. The number of conductors having a function of electrically connecting the connection electrode 760 and the conductor 347 may be one, two, or four or more. Providing a plurality of conductors having a function of electrically connecting the connection electrode 760 and the conductor 347 can reduce the contact resistance.

<<Transistor 750>>

A transistor 750 is provided over the insulator 214. The transistor 750 can be the transistor provided in the layer 30 described in Embodiment 3. For example, the transistor 750 can be the transistor provided in the pixel circuit 62. An OS transistor can be suitably used as the transistor 750. The OS transistor has a feature of an extremely low off-state current. Thus, the retention time for image data or the like can be increased, so that the frequency of the refresh operation can be reduced. Accordingly, the power consumption of the display apparatus 10 can be reduced.

The transistor 750 can be the transistor provided in the backup circuit 82. The OS transistor can be suitably used as the transistor 750. The OS transistor has a feature of an extremely low off-state current. Thus, data in the flip-flop can be retained even in a period during which the sharing of power supply voltage is stopped. Hence, a normally-off operation (the intermittent stop operation of the supply of the power supply voltage) of the CPU can be performed. Accordingly, the power consumption of the display apparatus 10 can be reduced.

A conductor 301a and a conductor 301b are embedded in the insulator 254, the insulator 280, the insulator 274, and the insulator 281. The conductor 301a is electrically connected to one of a source and a drain of the transistor 750, and the conductor 301b is electrically connected to the other of the source and the drain of the transistor 750. Here, the top surfaces of the conductor 301a and the conductor 301b and the top surface of the insulator 281 can be substantially level with each other.

A conductor 311, a conductor 313, a conductor 331, a capacitor 790, a conductor 333, and a conductor 335 are embedded in the insulator 361. The conductor 311 and the conductor 313 are electrically connected to the transistor 750 and have a function of a wiring. The conductor 333 and the conductor 335 are electrically connected to the capacitor 790. Here, the top surfaces of the conductor 331, the conductor 333, and the conductor 335 and the top surface of the insulator 361 can be substantially level with each other.

<<Capacitor 790>>

As illustrated in FIG. 36, the capacitor 790 includes a lower electrode 321 and an upper electrode 325. An insulator 323 is provided between the lower electrode 321 and the upper electrode 325. In other words, the capacitor 790 has a stacked-layer structure in which the insulator 323 functioning as a dielectric is provided between the pair of electrodes. Although FIG. 36 illustrates the example in which the capacitor 790 is provided over the insulator 281, the capacitor 790 may be provided over an insulator different from the insulator 281.

In the example illustrated in FIG. 36, the conductor 301a, the conductor 301b, and a conductor 305 are formed in the same layer. In the illustrated example, the conductor 311, the conductor 313, the conductor 317, and the lower electrode 321 are formed in the same layer. In the illustrated example, the conductor 331, the conductor 333, the conductor 335, and the conductor 337 are formed in the same layer. In the illustrated example, the conductor 341, the conductor 343, and the conductor 347 are formed in the same layer. In the illustrated example, the conductor 351, the conductor 353, the conductor 355, and the conductor 357 are formed in the same layer. Forming a plurality of conductors in the same layer simplifies the fabrication process of the display apparatus 10 and thus the manufacturing cost of the display apparatus 10 can be reduced. Note that these conductors may be formed in different layers or may contain different types of materials.

<<Light-Emitting Element 70>>

The display apparatus 10 illustrated in FIG. 36 includes the light-emitting element 70. The light-emitting element 70 includes a conductor 772, a light-emitting layer 786, and a conductor 788. The light-emitting layer 786 contains an inorganic compound or an organic compound.

For example, a compound semiconductor can be used for the light-emitting layer 786. Specifically, the light-emitting layer 786 can be sandwiched between a P-type clad layer and an N-type clad layer. This allows carrier recombination in the light-emitting layer 786. As a result, light emission owing to the carrier recombination can be obtained.

A layered material for emitting blue light, a layered material for emitting green light, a layered material for emitting red light, or the like can be used for the light-emitting layer 786, for example. Specifically, a compound of gallium and phosphorus, a compound of gallium and arsenic, a compound of gallium, aluminum, and arsenic, a compound of aluminum, gallium, indium, and phosphorus, a compound of indium and gallium nitride, or the like can be used for the light-emitting layer 786.

Moreover, quantum dots or the like can be used for the light-emitting layer 786. Specifically, a colloidal quantum dot material, an alloyed quantum dot material, a core-shell quantum dot material, a core quantum dot material, or the like can be used for the light-emitting layer 786.

Moreover, a fluorescent organic compound, a phosphorescent organic compound, or the like can be used for the light-emitting layer 786. For example, a low molecular compound can be used for the light-emitting layer 786. Furthermore, a high molecular compound can be used for the light-emitting layer 786.

For example, a mini LED can be used as the light-emitting element 70. Specifically, a mini LED whose light-emitting region has an area of 1 mm² or less, preferably 50000 μm² or less, further preferably 30000 μm² or less, still further preferably 10000 μm² or less and 200 μm² or more can be used as the light-emitting element 70.

Alternatively, a micro LED can be used as the light-emitting element 70. Specifically, a micro LED whose light-emitting region has an area of less than 200 μm², preferably 60 μm² or less, further preferably 15 μm² or less, still further preferably 5 μm² or less and 3 μm² or more can be used as the light-emitting element 70.

A visible-light-transmitting material can be used for the conductor 772 and the conductor 788. As a light-transmitting material, for example, an oxide material containing indium, zinc, tin, or the like is preferably used. Note that the light-emitting element 70 may have a bottom-emission structure in which light is emitted to the conductor 772 side, a top-emission structure in which light is emitted to the conductor 788 side, or a dual-emission structure in which light is emitted to both the conductor 772 side and the conductor 788 side.

A visible-light-reflecting material can be used for the conductor 772 or the conductor 788. As a light-reflecting material, for example, a material containing aluminum, silver, or the like is preferably used.

The light-emitting element 70 can have a micro optical resonator (microcavity) structure. Thus, light of predetermined colors (e.g., RGB) can be extracted without a coloring layer, and the display apparatus 10 can perform color display. The structure without a coloring layer can prevent light absorption by the coloring layer. As a result, the display apparatus 10 can display high-luminance images, and the power consumption of the display apparatus 10 can be reduced.

<<Pad 542, Conductive Material 543, Pad 541, and Conductive Film COM2*p*>>

The light-emitting element 70 is electrically connected to the other of the source and the drain of the transistor 750 through the conductor 772, the pad 542, the conductive material 543, the pad 541, the conductor 351, the conductor 341, the conductor 331, the conductor 313, and the conductor 301*b*. In other words, the conductor 772, the pad 542, the conductive material 543, the pad 541, the conductor 351, the conductor 341, the conductor 331, the conductor 313, and the conductor 301*b* have a function of electrically connecting the light-emitting element 70 to the pixel circuit.

The pad 542 is formed in contact with the conductor 772.

The conductive material 543 is dispersed in an insulator 734, for example. Thus, the insulator 734 has a function of an anisotropic conductive adhesive or an anisotropic conductive film.

Without being limited thereto, the pad 542 and the pad 541 may be directly bonded to each other by a surface activated bonding method, e.g., a metal-to-metal bonding method, specifically, a Cu-to-Cu bonding method.

The conductive film COM2*p* is formed in contact with the conductor 772. For example, voltage at which the light-emitting element 70 is driven at the maximum luminance is supplied.

<<Color Conversion Layer CC>>

A color conversion layer CC is provided to overlap with the light-emitting element 70. The color conversion layer CC has a function of converting a color of light emitted from the light-emitting element 70 into another color.

For example, a material that converts blue light emitted from a light-emitting element into green light can be used for the color conversion layer CC. Moreover, a material that converts blue light into red light can be used for the color conversion layer CC.

For another example, a material that converts ultraviolet light emitted from a light-emitting element into blue light can be used for the color conversion layer CC. Moreover, a material that converts ultraviolet light into green light can be used for the color conversion layer CC. Furthermore, a material that converts ultraviolet light into red light can be used for the color conversion layer CC.

Thus, a plurality of light-emitting elements can be formed using the same material through the same step and the color conversion layers CC can be formed separately using different materials to overlap with the respective light-emitting elements, so that different colors can be displayed.

In addition, a coloring layer can be provided. The coloring layer is provided to have a region overlapping with the light-emitting element 70. Providing the coloring layer can improve the color purity of light extracted from the light-emitting element 70. Thus, the display apparatus 10 can display high-quality images. Furthermore, all the light-emitting elements 70, for example, in the display apparatus 10 can be light-emitting elements that emit white light. Although not illustrated in FIG. 36, an optical member (an optical substrate) such as a polarizing member, a retardation member, or an anti-reflection member can be provided in the display apparatus 10, for example.

<<Insulator 730>>

In the display apparatus 10 illustrated in FIG. 36, an insulator 730 is provided over the insulator 363. Here, the insulator 730 can cover part of the pad 541.

<<Insulator 734>>

The insulator 734 is sandwiched between the pad 541 and the pad 542 and has a function of bonding the pad 541 and the pad 542. The conductive material 543 is dispersed in the insulator 734. Thus, the insulator 734 has a function of an anisotropic conductive adhesive.

<<Light-Blocking Layer 738>>

The light-blocking layer 738 has a function of blocking light emitted from adjacent regions. In addition, the light-blocking layer 738 has a function of reducing the intensity of external light reaching the transistor 750 and the like.

<<Sealing Layer 732>>

A sealing layer 732 covers the light-emitting element 70. The sealing layer 732 has a function of inhibiting diffusion of an impurity that reduces the reliability of the light-emitting element 70 into the light-emitting element 70 from the outside of the light-emitting element 70.

<<Structure Body 778>>

A structure body 778 is provided between the insulator 730 and the substrate 705 and has a function of adjusting a gap between the insulator 730 and the substrate 705.

Structure Example 2 of Display Apparatus

FIG. 37 is a cross-sectional view illustrating a structure example of the display apparatus 10. The display apparatus 10 includes a substrate 701B and the substrate 705, and the substrate 701B and the substrate 705 are bonded to each other with the sealant 712. The display apparatus 10 illustrated in FIG. 37 is different from the display apparatus 10 illustrated in FIG. 36 in that the transistor 750 is formed over a single crystal semiconductor substrate.

<<Substrate 701B>>

As the substrate 701B, a single crystal semiconductor substrate such as a single crystal silicon substrate can be used. Note that a semiconductor substrate other than a single crystal semiconductor substrate may be used as the substrate 701B.

The transistor 750 is provided over the substrate 701B. The transistor 750 can be the transistor provided in the layer 30 described in Embodiment 3. For example, the transistor 750 can be the transistor provided in the pixel circuit 62.
<<Transistor 750>>

The transistor 750 can have a structure similar to that of a transistor 441 described later.

Structure Example 3 of Display Apparatus

FIG. 38 is a cross-sectional view illustrating a structure example of the display apparatus 10. The display apparatus 10 includes a substrate 701 and the substrate 705, and the substrate 701 and the substrate 705 are bonded to each other with the sealant 712. The display apparatus 10 illustrated in FIG. 38 is different from the display apparatus 10 illustrated in FIG. 36 in including a transistor 601.
<<Substrate 701>>

As the substrate 701, a single crystal semiconductor substrate such as a single crystal silicon substrate can be used. Note that a semiconductor substrate other than a single crystal semiconductor substrate may be used as the substrate 701.

The transistor 441 and the transistor 601 are provided over the substrate 701. The transistor 441 and the transistor 601 can be the transistors provided in the layer 20 described in Embodiment 3. For example, the transistor 441 and the transistor 601 can be used as the transistors in the driver circuit 40 or the transistors in the functional circuit 50 included in the layer 20.
<<Transistor 441>>

The transistor 441 is formed of a conductor 443 having a function of a gate electrode, an insulator 445 having a function of a gate insulator, and part of the substrate 701 and includes a semiconductor region 447 including a channel formation region, a low-resistance region 449a having a function of one of a source region and a drain region, and a low-resistance region 449b having a function of the other of the source region and the drain region. The transistor 441 may be either a p-channel transistor or an n-channel transistor.

The transistor 441 is electrically isolated from other transistors by an element isolation layer 403. FIG. 38 illustrates the case where the transistor 441 and the transistor 601 are electrically isolated from each other by the element isolation layer 403. The element isolation layer 403 can be formed by a LOCOS (LOCal Oxidation of Silicon) method, an STI (Shallow Trench Isolation) method, or the like.

Here, in the transistor 441 illustrated in FIG. 38, the semiconductor region 447 has a projecting shape. Moreover, the conductor 443 is provided to cover the side surface and the top surface of the semiconductor region 447 with the insulator 445 therebetween. Note that FIG. 38 does not illustrate the state where the conductor 443 covers the side surface of the semiconductor region 447. A material adjusting the work function can be used for the conductor 443.

A transistor having a projecting semiconductor region, like the transistor 441, can be referred to as a fin-type transistor because a projecting portion of a semiconductor substrate is used. An insulator having a function of a mask for forming a projecting portion may be provided in contact with an upper portion of the projecting portion. Although FIG. 38 illustrates the structure in which the projecting portion is formed by processing part of the substrate 701, a semiconductor having a projecting shape may be formed by processing an SOI substrate.

Note that the structure of the transistor 441 illustrated in FIG. 38 is an example; the structure of the transistor 441 is not limited thereto and can be changed as appropriate in accordance with the circuit structure, an operation method for the circuit, or the like. For example, the transistor 441 may be a planar transistor.
<<Transistor 601>>

The transistor 601 can have a structure similar to that of the transistor 441.
<<Insulator 405, Insulator 407, Insulator 409, and Insulator 411>>

An insulator 405, an insulator 407, an insulator 409, and an insulator 411 are provided over the substrate 701, in addition to the element isolation layer 403, the transistor 441, and the transistor 601. A conductor 451 is embedded in the insulator 405, the insulator 407, the insulator 409, and the insulator 411. Here, the top surface of the conductor 451 and the top surface of the insulator 411 can be substantially level with each other.

The insulator 405, the insulator 407, the insulator 409, and the insulator 411 have a function of an interlayer film and may have a function of a planarization film that covers an uneven shape thereunder.
<<Insulator 421, Insulator 214, and Insulator 216>>

The insulator 421 and the insulator 214 are provided over the conductor 451 and the insulator 411. A conductor 453 is embedded in the insulator 421 and the insulator 214. Here, the top surface of the conductor 453 and the top surface of the insulator 214 can be substantially level with each other.

The insulator 216 is provided over the conductor 453 and the insulator 214. A conductor 455 is embedded in the insulator 216. Here, the top surface of the conductor 455 and the top surface of the insulator 216 can be substantially level with each other.
<<Insulator 222, Insulator 224, Insulator 254, Insulator 280, Insulator 274, and Insulator 281>>

The insulator 222, the insulator 224, the insulator 254, the insulator 280, the insulator 274, and the insulator 281 are provided over the conductor 455 and the insulator 216.

The conductor 305 is embedded in the insulator 222, the insulator 224, the insulator 254, the insulator 280, the insulator 274, and the insulator 281. Here, the top surface of the conductor 305 and the top surface of the insulator 281 can be substantially level with each other. The insulator 421, the insulator 214, the insulator 280, the insulator 274, and the insulator 281 have a function of an interlayer film and may have a function of a planarization film that covers an uneven shape thereunder.
<<Insulator 361>>

The insulator 361 is provided over the conductor 305 and the insulator 281.
<<Transistor 441>>

As illustrated in FIG. 38, the low-resistance region 449b having a function of the other of the source region and the drain region of the transistor 441 is electrically connected to the FPC 716 through the conductor 451, the conductor 453, the conductor 455, the conductor 305, the conductor 317, the conductor 337, the conductor 347, the conductor 353, the conductor 355, the conductor 357, the connection electrode 760, and the anisotropic conductor 780.

Structure Example 4 of Display Apparatus

FIG. 39 is a cross-sectional view illustrating a structure example of the display apparatus 10. The display apparatus 10 includes the substrate 701B and the substrate 705, and the substrate 701B and the substrate 705 are bonded to each other with the sealant 712. The display apparatus 10 illustrated in FIG. 39 is different from the display apparatus 10 illustrated in FIG. 38 in that the transistor 750 and the transistor 441 have the same structure and in that the substrate 701B and the substrate 701 are bonded to each other with a bonding layer 459.

<<Bonding Layer 459>>

The bonding layer 459 is provided over the insulator 216. A bump 458 is embedded in the bonding layer 459. The bonding layer 459 bonds the insulator 216 and the substrate 701B. The bottom surface of the bump 458 is in contact with the conductor 455 and the top surface of the bump 458 is in contact with the conductor 305 so that the conductor 455 and the conductor 305 are electrically connected to each other.

<<Insulator 405B, Insulator 280, Insulator 274, and Insulator 281>>

An insulator 405B, the insulator 280, the insulator 274, and the insulator 281 are provided over the substrate 701B, in addition to an element isolation layer 403B and the transistor 750. The conductor 305 is embedded in the insulator 405B, the insulator 280, the insulator 274, and the insulator 281. Here, the top surface of the conductor 305 and the top surface of the insulator 281 can be substantially level with each other.

The insulator 405B, the insulator 280, the insulator 274, and the insulator 281 have a function of an interlayer film and may have a function of a planarization film that covers an uneven shape thereunder.

Structure Example 5 of Display Apparatus

The display apparatus 10 illustrated in FIG. 40 is different from the display apparatus 10 illustrated in FIG. 38 mainly in that a transistor 602 and a transistor 603 that are OS transistors are provided in place of the transistor 441 and the transistor 601. Moreover, the OS transistor can be used as the transistor 750. That is, the display apparatus 10 illustrated in FIG. 40 includes a stack of OS transistors. In the example illustrated in FIG. 40, the transistor 602 and the transistor 603 are provided over the substrate 701. As the substrate 701, a single crystal semiconductor substrate such as a single crystal silicon substrate, or another semiconductor substrate can be used as described above. In addition, a variety of insulator substrates such as a glass substrate or a sapphire substrate may be used as the substrate 701.

<<Insulator 613 and Insulator 614>>

An insulator 613 and an insulator 614 are provided over the substrate 701, and the transistor 602 and the transistor 603 are provided over the insulator 614. Note that a transistor or the like may be provided between the substrate 701 and the insulator 613. For example, a transistor having a structure similar to those of the transistor 441 and the transistor 601 illustrated in FIG. 38 may be provided between the substrate 701 and the insulator 613.

<<Transistor 602 and Transistor 603>>

The transistor 602 and the transistor 603 can be the transistors provided in the layer 20 described in Embodiment 3.

The transistor 602 and the transistor 603 can be transistors having a structure similar to that of the transistor 750. Note that the transistor 602 and the transistor 603 may be OS transistors having a structure different from that of the transistor 750.

<<Insulator 616, Insulator 622, Insulator 624, Insulator 654, Insulator 680, Insulator 674, and Insulator 681>>

An insulator 616, an insulator 622, an insulator 624, an insulator 654, an insulator 680, an insulator 674, and an insulator 681 are provided over the insulator 614, in addition to the transistor 602 and the transistor 603. A conductor 461 is embedded in the insulator 654, the insulator 680, the insulator 674, and the insulator 681. Here, the top surface of the conductor 461 and the top surface of the insulator 681 can be substantially level with each other.

<<Insulator 501>>

An insulator 501 is provided over the conductor 461 and the insulator 681. A conductor 463 is embedded in the insulator 501. Here, the top surface of the conductor 463 and the top surface of the insulator 501 can be substantially level with each other.

The insulator 421 and the insulator 214 are provided over the conductor 463 and the insulator 501. The conductor 453 is embedded in the insulator 421 and the insulator 214. Here, the top surface of the conductor 453 and the top surface of the insulator 214 can be substantially level with each other.

As illustrated in FIG. 40, one of a source and a drain of the transistor 602 is electrically connected to the FPC 716 through the conductor 461, the conductor 463, the conductor 453, the conductor 455, the conductor 305, the conductor 317, the conductor 337, the conductor 347, the conductor 353, the conductor 355, the conductor 357, the connection electrode 760, and the anisotropic conductor 780.

The conductor 305 is embedded in the insulator 222, the insulator 224, the insulator 254, the insulator 280, the insulator 274, and the insulator 281. Here, the top surface of the conductor 305 and the top surface of the insulator 281 can be substantially level with each other.

The insulator 613, the insulator 614, the insulator 680, the insulator 674, the insulator 681, and the insulator 501 have a function of an interlayer film and may have a function of a planarization film that covers an uneven shape thereunder.

When the display apparatus 10 has the structure illustrated in FIG. 40, all the transistors included in the display apparatus 10 can be OS transistors while the bezel and size of the display apparatus 10 are reduced. Accordingly, the transistors provided in the layer 20 and the transistors provided in the layer 30 described in Embodiment 3 can be fabricated using the same apparatus, for example. Consequently, the fabrication cost of the display apparatus 10 can be reduced, making the display apparatus 10 inexpensive.

Structure Example 6 of Display Apparatus

FIG. 41 is a cross-sectional view illustrating a structure example of the display apparatus 10. The display apparatus 10 in FIG. 41 is different from the display apparatus 10 illustrated in FIG. 38 mainly in that a layer including a transistor 800 is provided between the layer including the transistor 750 and the layer including the transistor 601 and the transistor 441.

In the structure of FIG. 41, the layer 20 described in Embodiment 3 can include the layer including the transistor 601 and the transistor 441 and the layer including the transistor 800. The transistor 750 can be the transistor provided in the layer 30 described in Embodiment 3.

<<Insulator 821 and Insulator 814>>

An insulator 821 and an insulator 814 are provided over the conductor 451 and the insulator 411. A conductor 853 is embedded in the insulator 821 and the insulator 814. Here, the top surface of the conductor 853 and the top surface of the insulator 814 can be substantially level with each other.

<<Insulator 816>>

An insulator 816 is provided over the conductor 853 and the insulator 814. A conductor 855 is embedded in the insulator 816. Here, the top surface of the conductor 855 and the top surface of the insulator 816 can be substantially level with each other.

<<Insulator 822, Insulator 824, Insulator 854, Insulator 880, Insulator 874, and Insulator 881>>

An insulator 822, an insulator 824, an insulator 854, an insulator 880, an insulator 874, and an insulator 881 are provided over the conductor 855 and the insulator 816. A conductor 805 is embedded in the insulator 822, the insulator 824, the insulator 854, the insulator 880, the insulator 874, and the insulator 881. Here, the top surface of the conductor 805 and the top surface of the insulator 881 can be substantially level with each other.

The insulator 421 and the insulator 214 are provided over a conductor 817 and the insulator 881.

As illustrated in FIG. 41, the low-resistance region 449b having a function of the other of the source region and the drain region of the transistor 441 is electrically connected to the FPC 716 through the conductor 451, the conductor 853, the conductor 855, the conductor 805, the conductor 817, the conductor 453, the conductor 455, the conductor 305, the conductor 317, the conductor 337, the conductor 347, the conductor 353, the conductor 355, the conductor 357, the connection electrode 760, and the anisotropic conductor 780.

<<Transistor 800>>

The transistor 800 is provided over the insulator 814. The transistor 800 can be the transistor provided in the layer 20 described in Embodiment 3. The transistor 800 is preferably an OS transistor. For example, the transistor 800 can be the transistor provided in the backup circuit 82.

A conductor 801a and a conductor 801b are embedded in the insulator 854, the insulator 880, the insulator 874, and the insulator 881. The conductor 801a is electrically connected to one of a source and a drain of the transistor 800, and the conductor 801b is electrically connected to the other of the source and the drain of the transistor 800. Here, the top surfaces of the conductor 801a and the conductor 801b and the top surface of the insulator 881 can be substantially level with each other.

<<Transistor 750>>

The transistor 750 can be the transistor provided in the layer 30 described in Embodiment 3. For example, the transistor 750 can be the transistor provided in the pixel circuit 62. The transistor 750 is preferably an OS transistor.

The insulator 405, the insulator 407, the insulator 409, the insulator 411, the insulator 821, the insulator 814, the insulator 880, the insulator 874, the insulator 881, the insulator 421, the insulator 214, the insulator 280, the insulator 274, the insulator 281, the insulator 361, and the insulator 363 have a function of an interlayer film and may have a function of a planarization film that covers an uneven shape thereunder.

In the example illustrated in FIG. 41, the conductor 801a, the conductor 801b, and the conductor 805 are formed in the same layer. In the illustrated example, a conductor 811, a conductor 813, and the conductor 817 are formed in the same layer.

At least part of this embodiment can be implemented in combination with the other embodiments described in this specification as appropriate.

Embodiment 5

In this embodiment, a transistor that can be used in the display apparatus of one embodiment of the present invention will be described.

Structure Example of Transistor

Figure 42A:
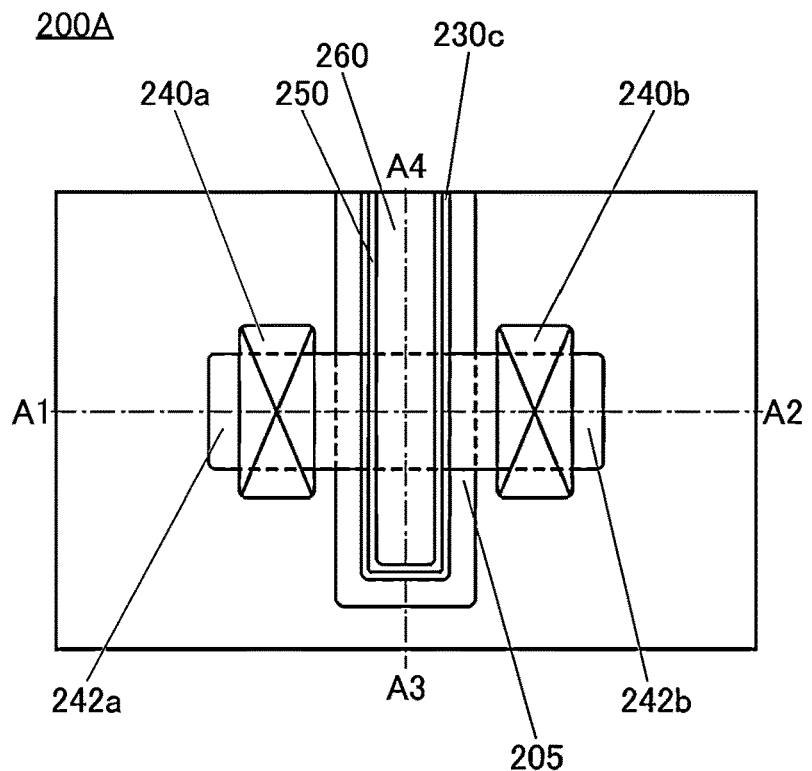
FIG. 42A to FIG. 42C are diagrams illustrating a structure of a transistor of an embodiment.
Figure 42C:
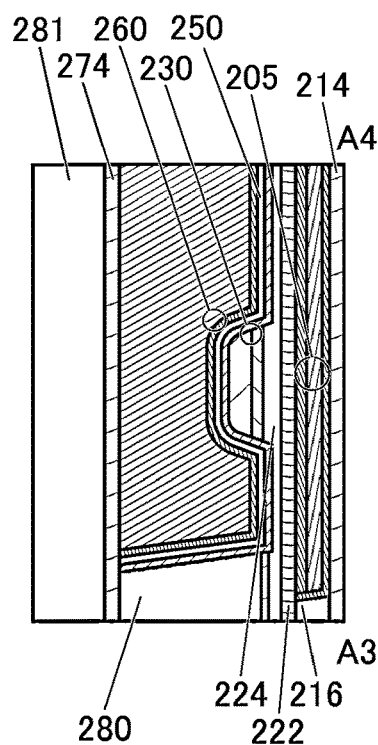
Figure 42B:
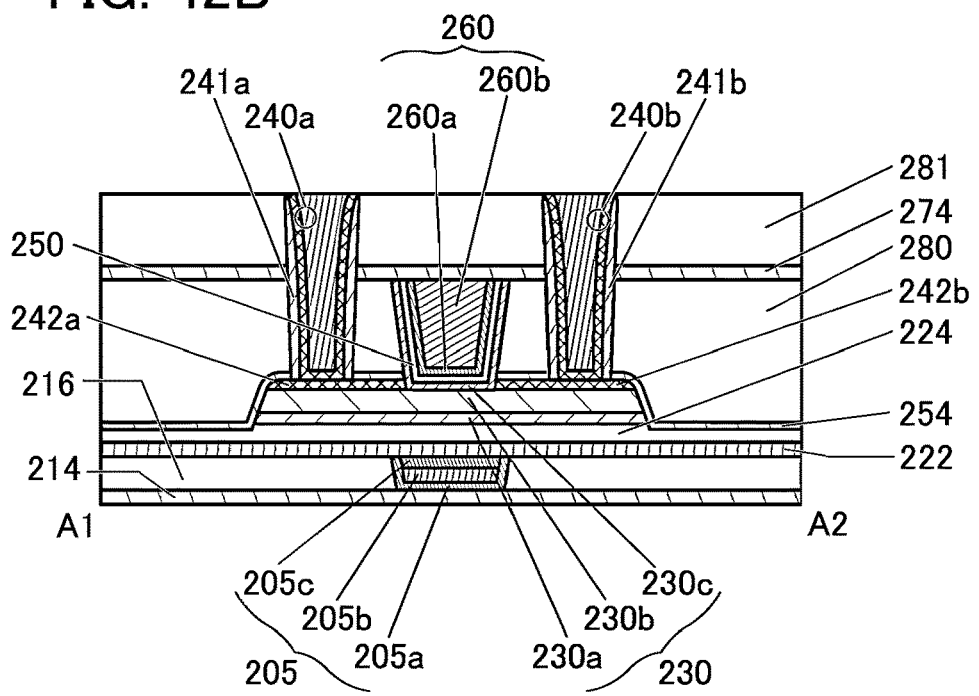

FIG. 42A, FIG. 42B, and FIG. 42C are a top view and cross-sectional views of a transistor 200A that can be used in the display apparatus of one embodiment of the present invention and the periphery of the transistor 200A. The transistor 200A can be used in the display apparatus of one embodiment of the present invention.

FIG. 42A is the top view of the transistor 200A. FIG. 42B and FIG. 42C are the cross-sectional views of the transistor 200A. Here, FIG. 42B is a cross-sectional view of a portion indicated by the dashed-dotted line A1-A2 in FIG. 42A and is a cross-sectional view of the transistor 200A in the channel length direction. FIG. 42C is a cross-sectional view of a portion indicated by the dashed-dotted line A3-A4 in FIG. 42A and is a cross-sectional view of the transistor 200A in the channel width direction. Note that some components are omitted in the top view of FIG. 42A for clarity of the drawing.

As illustrated in FIG. 42, the transistor 200A includes a metal oxide 230a placed over a substrate (not illustrated); a metal oxide 230b placed over the metal oxide 230a; a conductor 242a and a conductor 242b that are placed apart from each other over the metal oxide 230b; the insulator 280 that is placed over the conductor 242a and the conductor 242b and has an opening between the conductor 242a and the conductor 242b; a conductor 260 placed in the opening; an insulator 250 placed between the conductor 260 and each of the metal oxide 230b, the conductor 242a, the conductor 242b, and the insulator 280; and a metal oxide 230c placed between the insulator 250 and each of the metal oxide 230b, the conductor 242a, the conductor 242b, and the insulator 280. Here, as illustrated in FIG. 42B and FIG. 42C, preferably, the top surface of the conductor 260 is substantially aligned with the top surfaces of the insulator 250, the insulator 254, the metal oxide 230c, and the insulator 280. Hereinafter, the metal oxide 230a, the metal oxide 230b, and the metal oxide 230c may be collectively referred to as a metal oxide 230. The conductor 242a and the conductor 242b may be collectively referred to as a conductor 242.

In the transistor 200A illustrated in FIG. 42, the side surfaces of the conductor 242a and the conductor 242b on the conductor 260 side are substantially perpendicular. Note that the transistor 200A illustrated in FIG. 42 is not limited thereto, and the angle formed between the side surfaces and the bottom surfaces of the conductor 242a and the conductor 242b may be greater than or equal to 10° and less than or equal to 80°, preferably greater than or equal to 30° and less than or equal to 60°. The side surfaces of the conductor 242a and the conductor 242b that face each other may have a plurality of surfaces.

As illustrated in FIG. 42, the insulator 254 is preferably placed between the insulator 280 and each of the insulator 224, the metal oxide 230a, the metal oxide 230b, the conductor 242a, the conductor 242b, and the metal oxide 230c. Here, as illustrated in FIG. 42B and FIG. 42C, the insulator 254 is preferably in contact with the side surface of the metal oxide 230c, the top surface and the side surface of the conductor 242a, the top surface and the side surface of the conductor 242b, the side surfaces of the metal oxide 230a and the metal oxide 230b, and the top surface of the insulator 224.

In the transistor 200A, three layers of the metal oxide 230a, the metal oxide 230b, and the metal oxide 230c are stacked in and around a region where a channel is formed (hereinafter, also referred to as a channel formation region); however, the present invention is not limited thereto. For example, a two-layer structure of the metal oxide 230b and the metal oxide 230c or a stacked-layer structure of four or more layers may be employed. Although the conductor 260 is illustrated to have a stacked-layer structure of two layers in the transistor 200A, the present invention is not limited thereto. For example, the conductor 260 may have a single-layer structure or a stacked-layer structure of three or more layers. Furthermore, each of the metal oxide 230a, the metal oxide 230b, and the metal oxide 230c may have a stacked-layer structure of two or more layers.

For example, in the case where the metal oxide 230c has a stacked-layer structure including a first metal oxide and a second metal oxide over the first metal oxide, the first metal oxide preferably has a composition similar to that of the metal oxide 230b and the second metal oxide preferably has a composition similar to that of the metal oxide 230a.

Here, the conductor 260 functions as a gate electrode of the transistor, and the conductor 242a and the conductor 242b function as a source electrode and a drain electrode. As described above, the conductor 260 is formed to be embedded in the opening of the insulator 280 and the region interposed between the conductor 242a and the conductor 242b. Here, the positions of the conductor 260, the conductor 242a, and the conductor 242b are selected in a self-aligned manner with respect to the opening of the insulator 280. That is, in the transistor 200A, the gate electrode can be placed between the source electrode and the drain electrode in a self-aligned manner. Thus, the conductor 260 can be formed without an alignment margin, resulting in a reduction in the area occupied by the transistor 200A. Accordingly, the display apparatus can have higher resolution. In addition, the display apparatus can have a narrow bezel.

As illustrated in FIG. 42, the conductor 260 preferably includes a conductor 260a provided on the inner side of the insulator 250 and a conductor 260b provided to be embedded on the inner side of the conductor 260a.

The transistor 200A preferably includes the insulator 214 placed over the substrate (not illustrated); the insulator 216 placed over the insulator 214; a conductor 205 placed to be embedded in the insulator 216; the insulator 222 placed over the insulator 216 and the conductor 205; and the insulator 224 placed over the insulator 222. The metal oxide 230a is preferably placed over the insulator 224.

The insulator 274 and the insulator 281 functioning as interlayer films are preferably placed over the transistor 200A. Here, the insulator 274 is preferably placed in contact with the top surfaces of the conductor 260, the insulator 250, the insulator 254, the metal oxide 230c, and the insulator 280.

The insulator 222, the insulator 254, and the insulator 274 preferably have a function of inhibiting diffusion of at least one of hydrogen (e.g., a hydrogen atom and a hydrogen molecule). For example, the insulator 222, the insulator 254, and the insulator 274 preferably have a lower hydrogen permeability than the insulator 224, the insulator 250, and the insulator 280. Moreover, the insulator 222 and the insulator 254 preferably have a function of inhibiting diffusion of oxygen (e.g., at least one of an oxygen atom and an oxygen molecule). For example, the insulator 222 and the insulator 254 preferably have a lower oxygen permeability than the insulator 224, the insulator 250, and the insulator 280.

Here, the insulator 224, the metal oxide 230, and the insulator 250 are separated from the insulator 280 and the insulator 281 by the insulator 254 and the insulator 274. This can inhibit entry of impurities such as hydrogen contained in the insulator 280 and the insulator 281 into the insulator 224, the metal oxide 230, and the insulator 250 and excess oxygen into the insulator 224, the metal oxide 230a, the metal oxide 230b, and the insulator 250.

A conductor 240 (a conductor 240a and a conductor 240b) that is electrically connected to the transistor 200A and functions as a plug is preferably provided. Note that an insulator 241 (an insulator 241a and an insulator 241b) is provided in contact with the side surface of the conductor 240 functioning as a plug. That is, the insulator 241 is provided in contact with the inner wall of an opening in the insulator 254, the insulator 280, the insulator 274, and the insulator 281. In addition, a structure may be employed in which a first conductor of the conductor 240 is provided in contact with the side surface of the insulator 241 and a second conductor of the conductor 240 is provided on the inner side of the first conductor. Here, the top surface of the conductor 240 and the top surface of the insulator 281 can be substantially level with each other. Although the transistor 200A has a structure in which the first conductor of the conductor 240 and the second conductor of the conductor 240 are stacked, the present invention is not limited thereto. For example, the conductor 240 may have a single-layer structure or a stacked-layer structure of three or more layers. In the case where a component has a stacked-layer structure, layers may be distinguished by ordinal numbers corresponding to the formation order.

In the transistor 200A, a metal oxide functioning as an oxide semiconductor (hereinafter, also referred to as an oxide semiconductor) is preferably used as the metal oxide 230 including the channel formation region (the metal oxide 230a, the metal oxide 230b, and the metal oxide 230c). For example, the metal oxide to be the channel formation region of the metal oxide 230 preferably has a band gap of 2 eV or more, further preferably 2.5 eV or more.

The metal oxide preferably contains at least indium (In) or zinc (Zn). In particular, indium (In) and zinc (Zn) are preferably contained. In addition to them, an element M is preferably contained. As the element M, one or more of aluminum (Al), gallium (Ga), yttrium (Y), tin (Sn), boron (B), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), magnesium (Mg), and cobalt (Co) can be used. In particular, the element M is preferably one or more of aluminum (Al), gallium (Ga), yttrium (Y), and tin (Sn). Furthermore, the element M preferably contains one or both of Ga and Sn.

As illustrated in FIG. 42B, the metal oxide 230b in a region not overlapping with the conductor 242 sometimes has a smaller thickness than the metal oxide 230b in a region overlapping with the conductor 242. The thin region is formed when part of the top surface of the metal oxide 230b is removed at the time of forming the conductor 242a and the conductor 242b. When a conductive film to be the conductor 242 is formed, a low-resistance region is sometimes formed on the top surface of the metal oxide 230b in the vicinity of the interface with the conductive film. Removing the low-resistance region positioned between the conductor 242a and the conductor 242b on the top surface of the metal oxide 230b in the above manner can prevent formation of the channel in the region.

According to one embodiment of the present invention, a display apparatus that includes small-size transistors and has high resolution can be provided. A display apparatus that includes a transistor with a high on-state current and has high luminance can be provided. A display apparatus that includes a transistor operating at high speed and thus operates at high speed can be provided. A display apparatus that includes a transistor having stable electrical characteristics and is highly reliable can be provided. A display apparatus that includes a transistor with a low off-state current and has low power consumption can be provided.

The structure of the transistor 200A that can be used in the display apparatus of one embodiment of the present invention will be described in detail.

The conductor 205 is placed to include a region overlapping with the metal oxide 230 and the conductor 260. Furthermore, the conductor 205 is preferably provided to be embedded in the insulator 216.

The conductor 205 includes a conductor 205a, a conductor 205b, and a conductor 205c. The conductor 205a is provided in contact with the bottom surface and the side wall of the opening provided in the insulator 216. The conductor 205b is provided to be embedded in a recessed portion formed by the conductor 205a. Here, the level of the top surface of the conductor 205b is lower than the levels of the top surface of the conductor 205a and the top surface of the insulator 216. The conductor 205c is provided in contact with the top surface of the conductor 205b and the side surface of the conductor 205a. Here, the top surface of the conductor 205c is substantially level with the top surface of the conductor 205a and the top surface of the insulator 216. That is, the conductor 205b is surrounded by the conductor 205a and the conductor 205c.

For the conductor 205a and the conductor 205c, it is preferable to use a conductive material having a function of inhibiting diffusion of impurities such as a hydrogen atom, a hydrogen molecule, a water molecule, a nitrogen atom, a nitrogen molecule, a nitrogen oxide molecule (N2O, NO, NO2, or the like), and a copper atom. Alternatively, it is preferable to use a conductive material having a function of inhibiting diffusion of oxygen (e.g., at least one of an oxygen atom and an oxygen molecule).

When the conductor 205a and the conductor 205c are formed using a conductive material having a function of inhibiting diffusion of hydrogen, impurities such as hydrogen contained in the conductor 205b can be inhibited from diffusing into the metal oxide 230 through the insulator 224 and the like. When the conductor 205a and the conductor 205c are formed using a conductive material having a function of inhibiting diffusion of oxygen, the conductivity of the conductor 205b can be inhibited from being lowered because of oxidation. As the conductive material having a function of inhibiting diffusion of oxygen, for example, titanium, titanium nitride, tantalum, tantalum nitride, ruthenium, ruthenium oxide, or the like is preferably used. Thus, the conductor 205a is a single layer or stacked layers of the above conductive materials. For example, titanium nitride is used for the conductor 205a.

For the conductor 205b, a conductive material containing tungsten, copper, or aluminum as its main component is preferably used. For example, tungsten is used for the conductor 205b.

The conductor 260 sometimes functions as a first gate (also referred to as top gate) electrode. The conductor 205 sometimes functions as a second gate (also referred to as bottom gate) electrode. In that case, by changing a potential applied to the conductor 205 not in synchronization with but independently of a potential applied to the conductor 260, $V_{th}$ of the transistor 200A can be controlled. In particular, by application of a negative potential to the conductor 205, $V_{th}$ of the transistor 200A can be higher than 0 V and the off-state current can be made low. Thus, a drain current at the time when a potential applied to the conductor 260 is 0 V can be lower in the case where a negative potential is applied to the conductor 205 than in the case where the negative potential is not applied to the conductor 205.

The conductor 205 is preferably provided to be larger than the channel formation region in the metal oxide 230. In particular, it is preferable that the conductor 205 extend beyond an end portion of the metal oxide 230 that intersects with the channel width direction, as illustrated in FIG. 42C. In other words, the conductor 205 and the conductor 260 preferably overlap with each other with the insulator placed therebetween, in a region outside the side surface of the metal oxide 230 in the channel width direction.

With the above structure, the channel formation region of the metal oxide 230 can be electrically surrounded by an electric field of the conductor 260 having a function of the first gate electrode and an electric field of the conductor 205 having a function of the second gate electrode.

As illustrated in FIG. 42C, the conductor 205 extends to function as a wiring as well. However, without limitation to this structure, a structure in which a conductor functioning as a wiring is provided below the conductor 205 may be employed.

The insulator 214 preferably functions as a barrier insulating film that inhibits entry of an impurity such as water or hydrogen into the transistor 200A from the substrate side. Accordingly, it is preferable to use, for the insulator 214, an insulating material having a function of inhibiting diffusion of impurities such as a hydrogen atom, a hydrogen molecule, a water molecule, a nitrogen atom, a nitrogen molecule, a nitrogen oxide molecule (e.g., N2O, NO, and NO2), and a copper atom (an insulating material through which the impurities are less likely to pass). Alternatively, it is preferable to use an insulating material having a function of inhibiting diffusion of oxygen (e.g., at least one of an oxygen atom and an oxygen molecule) (an insulating material through which the oxygen is less likely to pass).

For example, aluminum oxide or silicon nitride is preferably used for the insulator 214. Accordingly, it is possible to inhibit diffusion of an impurity such as water or hydrogen to the transistor 200A side from the substrate side through the insulator 214. Alternatively, it is possible to inhibit diffusion of oxygen contained in the insulator 224 and the like to the substrate side through the insulator 214.

The permittivity of each of the insulator 216, the insulator 280, and the insulator 281 functioning as an interlayer film is preferably lower than that of the insulator 214. When a material with a low permittivity is used for an interlayer film, the parasitic capacitance generated between wirings can be reduced. For the insulator 216, the insulator 280, and the insulator 281, for example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used as appropriate.

The insulator 222 and the insulator 224 have a function of a gate insulator.

Here, the insulator 224 in contact with the metal oxide 230 preferably releases oxygen by heating. In this specification, oxygen that is released by heating is referred to as excess oxygen in some cases. For example, silicon oxide, silicon oxynitride, or the like can be used as appropriate for the insulator 224. When an insulator containing oxygen is provided in contact with the metal oxide 230, oxygen vacancies in the metal oxide 230 can be reduced, leading to improved reliability of the transistor 200A.

Specifically, an oxide material that releases part of oxygen by heating is preferably used for the insulator 224. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably in the range of 100° C. to 700° C., inclusive or 100° C. to 400° C., inclusive.

As illustrated in FIG. 42C, the insulator 224 in a region overlapping with neither the insulator 254 nor the metal oxide 230b sometimes has a smaller thickness than that in the other regions. In the insulator 224, the region overlapping with neither the insulator 254 nor the metal oxide 230b preferably has a thickness with which the above oxygen can be adequately diffused.

Like the insulator 214 and the like, the insulator 222 preferably functions as a barrier insulating film that inhibits entry of an impurity such as water or hydrogen into the transistor 200A from the substrate side. For example, the insulator 222 preferably has a lower hydrogen permeability than the insulator 224. When the insulator 224, the metal oxide 230, the insulator 250, and the like are surrounded by the insulator 222, the insulator 254, and the insulator 274, entry of an impurity such as water or hydrogen into the transistor 200A from the outside can be inhibited.

Furthermore, it is preferable that the insulator 222 have a function of inhibiting diffusion of oxygen (e.g., at least one of an oxygen atom and an oxygen molecule) (it is preferable that the oxygen be less likely to pass through the insulator 222). For example, the insulator 222 preferably has a lower oxygen permeability than the insulator 224. The insulator 222 preferably has a function of inhibiting diffusion of oxygen and impurities, in which case oxygen contained in the metal oxide 230 is less likely to diffuse to the substrate side. Moreover, the conductor 205 can be inhibited from reacting with oxygen contained in the insulator 224 or the metal oxide 230.

As the insulator 222, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. In the case where the insulator 222 is formed using such a material, the insulator 222 functions as a layer inhibiting release of oxygen from the metal oxide 230 and entry of impurities such as hydrogen into the metal oxide 230 from the periphery of the transistor 200A.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over any of the above insulators.

The insulator 222 may be a single layer or a stacked layer using an insulator containing what is called a high-k material, such as aluminum oxide, hafnium oxide, tantalum oxide, zirconium oxide, lead zirconate titanate (PZT), strontium titanate (SrTiO$_3$), or (Ba,Sr)TiO$_3$ (BST). With scaling down and higher integration of transistors, a problem such as leakage current may arise because of a thinned gate insulator. When a high-k material is used for the insulator functioning as a gate insulator, a gate potential at the time of the operation of the transistor can be reduced while the physical thickness is maintained.

Note that the insulator 222 and the insulator 224 may each have a stacked-layer structure of two or more layers. In that case, without limitation to a stacked-layer structure formed of the same material, a stacked-layer structure formed of different materials may be employed. For example, an insulator similar to the insulator 224 may be provided below the insulator 222.

The metal oxide 230 includes the metal oxide 230a, the metal oxide 230b over the metal oxide 230a, and the metal oxide 230c over the metal oxide 230b. When the metal oxide 230 includes the metal oxide 230a under the metal oxide 230b, it is possible to inhibit diffusion of impurities into the metal oxide 230b from the components formed below the metal oxide 230a. Moreover, when the metal oxide 230 includes the metal oxide 230c over the metal oxide 230b, it is possible to inhibit diffusion of impurities into the metal oxide 230b from the components formed above the metal oxide 230c.

Note that the metal oxide 230 preferably has a stacked-layer structure of a plurality of oxide layers that differ in the atomic ratio of metal atoms. For example, in the case where the metal oxide 230 contains at least indium (In) and the element M, the proportion of the number of atoms of the element M contained in the metal oxide 230a to the number of atoms of all elements that constitute the metal oxide 230a is preferably higher than the proportion of the number of atoms of the element M contained in the metal oxide 230b to the number of atoms of all elements that constitute the metal oxide 230b. In addition, the atomic ratio of the element M to In in the metal oxide 230a is preferably greater than the atomic ratio of the element M to In in the metal oxide 230b. Here, a metal oxide that can be used as the metal oxide 230a or the metal oxide 230b can be used as the metal oxide 230c.

The energy of the conduction band minimum of each of the metal oxide 230a and the metal oxide 230c is preferably higher than the energy of the conduction band minimum of the metal oxide 230b. In other words, the electron affinity of each of the metal oxide 230a and the metal oxide 230c is preferably smaller than the electron affinity of the metal oxide 230b. In this case, a metal oxide that can be used as the metal oxide 230a is preferably used as the metal oxide 230c. Specifically, the proportion of the number of atoms of the element M contained in the metal oxide 230c to the number of atoms of all elements that constitute the metal oxide 230c is preferably higher than the proportion of the number of atoms of the element M contained in the metal oxide 230b to the number of atoms of all elements that constitute the metal oxide 230b. In addition, the atomic ratio of the element M to In in the metal oxide 230c is preferably greater than the atomic ratio of the element M to In in the metal oxide 230b.

Here, the energy level of the conduction band minimum gently changes at junction portions between the metal oxide 230a, the metal oxide 230b, and the metal oxide 230c. In other words, at the junction portions between the metal oxide 230a, the metal oxide 230b, and the metal oxide 230c, the energy level of the conduction band minimum continuously changes or the energy levels are continuously connected. This can be achieved by decreasing the densities of defect states in mixed layers formed at the interface between the metal oxide 230a and the metal oxide 230b and the interface between the metal oxide 230b and the metal oxide 230c.

Specifically, when the metal oxide 230a and the metal oxide 230b or the metal oxide 230b and the metal oxide 230c contain the same element (as a main component) in addition to oxygen, a mixed layer with a low density of defect states can be formed. For example, an In—Ga—Zn oxide, a Ga—Zn oxide, gallium oxide, or the like may be used as the metal oxide 230a and the metal oxide 230c, in the case where the metal oxide 230b is an In—Ga—Zn oxide. The metal oxide 230c may have a stacked-layer structure. For example, a stacked-layer structure of an In—Ga—Zn oxide and a Ga—Zn oxide over the In—Ga—Zn oxide or a stacked-layer structure of an In—Ga—Zn oxide and gallium oxide over the In—Ga—Zn oxide can be employed. In other words, the metal oxide 230c may have a stacked-layer structure of an In—Ga—Zn oxide and an oxide that does not contain In.

Specifically, as the metal oxide 230a, a metal oxide with In:Ga:Zn=1:3:4 [atomic ratio] or 1:1:0.5 [atomic ratio] can be used. As the metal oxide 230b, a metal oxide with In:Ga:Zn=4:2:3 [atomic ratio] or 3:1:2 [atomic ratio] can be used. As the metal oxide 230c, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] can be used. Specific examples of a stacked-layer structure of the metal oxide 230c include a stacked-layer structure of a layer with In:Ga:Zn=4:2:3 [atomic ratio] and a layer with Ga:Zn=2:1 [atomic ratio], a stacked-layer structure of a layer with In:Ga:Zn=4:2:3 [atomic ratio] and a layer with Ga:Zn=2:5 [atomic ratio], and a stacked-layer structure of a layer with In:Ga:Zn=4:2:3 [atomic ratio] and a layer of gallium oxide.

At this time, the metal oxide 230b serves as a main carrier path. When the metal oxide 230a and the metal oxide 230c have the above structure, the densities of defect states at the interface between the metal oxide 230a and the metal oxide 230b and the interface between the metal oxide 230b and the metal oxide 230c can be made low. This reduces the influence of interface scattering on carrier conduction, and the transistor 200A can have a high on-state current and high frequency characteristics. Note that in the case where the metal oxide 230c has a stacked-layer structure, not only the effect of reducing the density of defect states at the interface between the metal oxide 230b and the metal oxide 230c, but also the effect of inhibiting diffusion of the constituent elements contained in the metal oxide 230c to the insulator 250 side can be expected. Specifically, the metal oxide 230c has a stacked-layer structure in which an oxide not containing In is positioned in the upper layer of the stacked-layer structure, whereby the diffusion of In to the insulator 250 side can be inhibited. Since the insulator 250 functions as a gate insulator, the transistor has defects in characteristics when In diffuses. Thus, the metal oxide 230c having a stacked-layer structure allows a highly reliable display apparatus to be provided.

The conductor 242 (the conductor 242a and the conductor 242b) functioning as the source electrode and the drain electrode is provided over the metal oxide 230b. For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even after absorbing oxygen.

When the conductor 242 is provided in contact with the metal oxide 230, the oxygen concentration of the metal oxide 230 in the vicinity of the conductor 242 sometimes decreases. In addition, a metal compound layer that contains the metal contained in the conductor 242 and the component of the metal oxide 230 is sometimes formed in the metal oxide 230 in the vicinity of the conductor 242. In such cases, the carrier density of the region in the metal oxide 230 in the vicinity of the conductor 242 increases, and the region becomes a low-resistance region.

Here, the region between the conductor 242a and the conductor 242b is formed to overlap with the opening of the insulator 280. Accordingly, the conductor 260 can be placed in a self-aligned manner between the conductor 242a and the conductor 242b.

The insulator 250 functions as a gate insulator. The insulator 250 is preferably placed in contact with the top surface of the metal oxide 230c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which are thermally stable, are preferable.

As in the insulator 224, the concentration of an impurity such as water or hydrogen in the insulator 250 is preferably reduced. The thickness of the insulator 250 is preferably greater than or equal to 1 nm and less than or equal to 20 nm.

A metal oxide may be provided between the insulator 250 and the conductor 260. The metal oxide preferably inhibits oxygen diffusion from the insulator 250 into the conductor 260. Accordingly, oxidation of the conductor 260 due to oxygen in the insulator 250 can be inhibited.

The metal oxide functions as part of the gate insulator in some cases. Therefore, when silicon oxide, silicon oxynitride, or the like is used for the insulator 250, a metal oxide that is a high-k material with a high dielectric constant is preferably used as the metal oxide. When the gate insulator has a stacked-layer structure of the insulator 250 and the metal oxide, the stacked-layer structure can be thermally stable and have a high dielectric constant. Accordingly, a gate potential applied during the operation of the transistor can be reduced while the physical thickness of the gate insulator is maintained. In addition, the equivalent oxide thickness (EOT) of the insulator functioning as the gate insulator can be reduced.

Specifically, a metal oxide containing one kind or two or more kinds selected from hafnium, aluminum, gallium, yttrium, zirconium, tungsten, titanium, tantalum, nickel, germanium, magnesium, and the like can be used. It is particularly preferable to use an insulator containing an oxide of one or both of aluminum and hafnium, such as aluminum oxide, hafnium oxide, or an oxide containing aluminum and hafnium (hafnium aluminate).

Although the conductor 260 is illustrated to have a two-layer structure in FIG. 42, the conductor 260 may have a single-layer structure or a stacked-layer structure of three or more layers.

The conductor 260a is preferably formed using the aforementioned conductor having a function of inhibiting diffusion of impurities such as a hydrogen atom, a hydrogen molecule, a water molecule, a nitrogen atom, a nitrogen molecule, a nitrogen oxide molecule (e.g., N2O, NO, and NO2), and a copper atom. Alternatively, it is preferable to use a conductive material having a function of inhibiting diffusion of oxygen (e.g., at least one of an oxygen atom and an oxygen molecule).

When the conductor 260a has a function of inhibiting diffusion of oxygen, the conductivity of the conductor 260b can be inhibited from being lowered by oxidation due to oxygen contained in the insulator 250. As a conductive material having a function of inhibiting oxygen diffusion, for example, tantalum, tantalum nitride, ruthenium, ruthenium oxide, or the like is preferably used.

A conductive material containing tungsten, copper, or aluminum as its main component is preferably used for the conductor 260b. The conductor 260 also functions as a wiring and thus is preferably formed using a conductor having high conductivity. For example, a conductive material containing tungsten, copper, or aluminum as its main component can be used. The conductor 260b may have a stacked-layer structure, for example, a stacked-layer structure of titanium or titanium nitride and the above conductive material.

As illustrated in FIG. 42A and FIG. 42C, the side surface of the metal oxide 230 is covered with the conductor 260 in a region where the metal oxide 230b does not overlap with the conductor 242, that is, the channel formation region of the metal oxide 230. Accordingly, an electric field of the conductor 260 functioning as the first gate electrode is likely to act on the side surface of the metal oxide 230. Thus, the on-state current of the transistor 200A can be increased and the frequency characteristics can be improved.

The insulator 254, like the insulator 214 and the like, preferably functions as a barrier insulating film that inhibits entry of an impurity such as water or hydrogen into the transistor 200A from the insulator 280 side. The insulator 254 preferably has a lower hydrogen permeability than the insulator 224, for example. Furthermore, as illustrated in FIG. 42B and FIG. 42C, the insulator 254 is preferably in contact with the side surface of the metal oxide 230c, the top and side surfaces of the conductor 242a, the top and side surfaces of the conductor 242b, the side surfaces of the metal oxide 230a and the metal oxide 230b, and the top surface of the insulator 224. Such a structure can inhibit entry of hydrogen contained in the insulator 280 into the metal oxide 230 through the top surfaces or side surfaces of the conductor 242a, the conductor 242b, the metal oxide 230a, the metal oxide 230b, and the insulator 224.

Furthermore, it is preferable that the insulator 254 have a function of inhibiting diffusion of oxygen (e.g., at least one of an oxygen atom and an oxygen molecule) (it is preferable that the oxygen be less likely to pass through the insulator 254). For example, the insulator 254 preferably has a lower oxygen permeability than the insulator 280 or the insulator 224.

The insulator 254 is preferably formed by a sputtering method. When the insulator 254 is formed by a sputtering method in an oxygen-containing atmosphere, oxygen can be added to the vicinity of a region of the insulator 224 that is in contact with the insulator 254. Thus, oxygen can be supplied from the region to the metal oxide 230 through the insulator 224. Here, with the insulator 254 having a function of inhibiting upward diffusion of oxygen, oxygen can be prevented from diffusing from the metal oxide 230 into the insulator 280. Moreover, with the insulator 222 having a function of inhibiting downward diffusion of oxygen, oxygen can be prevented from diffusing from the metal oxide 230 to the substrate side. In the above manner, oxygen is supplied to the channel formation region of the metal oxide 230. Accordingly, oxygen vacancies in the metal oxide 230 can be reduced, so that the transistor can be inhibited from having normally-on characteristics.

As the insulator 254, an insulator containing an oxide of one or both of aluminum and hafnium is preferably formed, for example. Note that as the insulator containing an oxide of one or both of aluminum and hafnium, aluminum oxide, hafnium oxide, an oxide containing aluminum and hafnium (hafnium aluminate), or the like is preferably used.

The insulator 224, the insulator 250, and the metal oxide 230 are covered with the insulator 254 having a barrier property against hydrogen, whereby the insulator 280 is isolated from the insulator 224, the metal oxide 230, and the insulator 250 by the insulator 254. This can inhibit entry of impurities such as hydrogen from the outside of the transistor 200A, resulting in excellent electrical characteristics and high reliability of the transistor 200A.

The insulator 280 is provided over the insulator 224, the metal oxide 230, and the conductor 242 with the insulator 254 therebetween. The insulator 280 preferably includes, for example, silicon oxide, silicon oxynitride, silicon nitride oxide, silicon oxide to which fluorine is added, silicon oxide to which carbon is added, silicon oxide to which carbon and nitrogen are added, or porous silicon oxide. In particular, silicon oxide and silicon oxynitride are preferable because they are thermally stable. In particular, materials such as silicon oxide, silicon oxynitride, and porous silicon oxide are preferably used, in which case a region containing oxygen to be released by heating can be easily formed.

The concentration of an impurity such as water or hydrogen in the insulator 280 is preferably reduced. In addition, the top surface of the insulator 280 may be planarized.

Like the insulator 214 and the like, the insulator 274 preferably functions as a barrier insulating film that inhibits entry of an impurity such as water or hydrogen into the insulator 280 from the above. As the insulator 274, for example, the insulator that can be used as the insulator 214, the insulator 254, and the like can be used.

The insulator 281 functioning as an interlayer film is preferably provided over the insulator 274. As in the insulator 224 or the like, the concentration of an impurity such as water or hydrogen in the insulator 281 is preferably reduced.

The conductor 240a and the conductor 240b are placed in openings formed in the insulator 281, the insulator 274, the insulator 280, and the insulator 254. The conductor 240a and the conductor 240b are provided to face each other with the conductor 260 therebetween. Note that the top surfaces of the conductor 240a and the conductor 240b may be level with the top surface of the insulator 281.

The insulator 241a is provided in contact with the inner wall of the opening in the insulator 281, the insulator 274, the insulator 280, and the insulator 254, and the first conductor of the conductor 240a is formed in contact with the side surface of the insulator 241a. The conductor 242a is positioned on at least part of the bottom portion of the opening, and the conductor 240a is in contact with the conductor 242a. Similarly, the insulator 241b is provided in contact with the inner wall of the opening in the insulator 281, the insulator 274, the insulator 280, and the insulator 254, and the first conductor of the conductor 240b is formed in contact with the side surface of the insulator 241b. The conductor 242b is positioned on at least part of the bottom portion of the opening, and the conductor 240b is in contact with the conductor 242b.

The conductor 240a and the conductor 240b are preferably formed using a conductive material containing tungsten, copper, or aluminum as its main component. The conductor 240a and the conductor 240b may each have a stacked-layer structure.

In the case where the conductor 240 has a stacked-layer structure, the aforementioned conductor having a function of inhibiting diffusion of an impurity such as water or hydrogen is preferably used as the conductor in contact with the metal oxide 230a, the metal oxide 230b, the conductor 242, the insulator 254, the insulator 280, the insulator 274, and the insulator 281. For example, tantalum, tantalum nitride, titanium, titanium nitride, ruthenium, ruthenium oxide, or the like is preferably used. The conductive material having a function of inhibiting diffusion of an impurity such as water or hydrogen can be used as a single layer or stacked layers. The use of the conductive material can inhibit oxygen added to the insulator 280 from being absorbed by the conductor 240a and the conductor 240b. Moreover, an impurity such as water or hydrogen can be inhibited from entering the metal oxide 230 through the conductor 240a and the conductor 240b from a layer above the insulator 281.

As the insulator 241a and the insulator 241b, for example, the insulator that can be used as the insulator 254 or the like can be used. Since the insulator 241a and the insulator 241b are provided in contact with the insulator 254, an impurity such as water or hydrogen in the insulator 280 or the like can be inhibited from entering the metal oxide 230 through the conductor 240a and the conductor 240b. Furthermore, oxygen contained in the insulator 280 can be inhibited from being absorbed by the conductor 240a and the conductor 240b.

Although not illustrated, a conductor functioning as a wiring may be placed in contact with the top surface of the conductor 240a and the top surface of the conductor 240b. For the conductor functioning as a wiring, a conductive material containing tungsten, copper, or aluminum as its main component is preferably used. Furthermore, the conductor may have a stacked-layer structure and may be a stack of titanium or titanium nitride and the above conductive material, for example. Note that the conductor may be formed to be embedded in an opening provided in an insulator.

<Materials for Transistor>

Materials that can be used for the transistor will be described.

[Substrate]

As a substrate where the transistor 200A is formed, an insulator substrate, a semiconductor substrate, or a conductor substrate can be used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like and a compound semiconductor substrate of silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the elements provided for the substrates include a capacitor, a resistor, a switching element, a light-emitting element, and a memory element.

[Insulator]

Examples of an insulator include an oxide, a nitride, an oxynitride, a nitride oxide, a metal oxide, a metal oxynitride, and a metal nitride oxide, each of which has an insulating property.

With scaling down and higher integration of transistors, for example, a problem such as leakage current may arise because of a thinned gate insulator. When a high-k material is used for the insulator functioning as a gate insulator, the voltage at the time of the operation of the transistor can be reduced while the physical thickness is maintained. By contrast, when a material with a low dielectric constant is used for the insulator functioning as an interlayer film, the parasitic capacitance generated between wirings can be reduced. Thus, a material is preferably selected depending on the function of an insulator.

Examples of the insulator having a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator having a low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor using an oxide semiconductor is surrounded by insulators having a function of inhibiting the passage of oxygen and impurities such as hydrogen (e.g., the insulator 214, the insulator 222, the insulator 254, and the insulator 274), the electrical characteristics of the transistor can be stable. An insulator having a function of inhibiting the passage of oxygen and impurities such as hydrogen can be formed to have a single layer or a stacked layer including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide or a metal nitride such as aluminum nitride, aluminum titanium nitride, titanium nitride, silicon nitride oxide, or silicon nitride can be used.

An insulator functioning as a gate insulator is preferably an insulator including a region containing oxygen to be released by heating. For example, when a structure is employed in which silicon oxide or silicon oxynitride that includes a region containing oxygen to be released by heating is provided in contact with the metal oxide 230, oxygen vacancies included in the metal oxide 230 can be filled.

[Conductor]

For a conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even after absorbing oxygen. A semiconductor having high electrical conductivity, typified by polycrystalline silicon containing an impurity element such as phosphorus, or silicide such as nickel silicide may be used.

A plurality of conductors formed using any of the above materials may be stacked. For example, a stacked-layer structure combining a material containing the above metal element and a conductive material containing oxygen may be employed. In addition, a stacked-layer structure combining a material containing the above metal element and a conductive material containing nitrogen may be employed. Furthermore, a stacked-layer structure combining a material containing the above metal element, a conductive material containing oxygen, and a conductive material containing nitrogen may be employed.

In the case where a metal oxide is used for the channel formation region of the transistor, the conductor functioning as the gate electrode preferably has a stacked-layer structure combining a material containing the above metal element and a conductive material containing oxygen. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in the metal oxide where the channel is formed. A conductive material containing the above metal element and nitrogen may be used. For example, a conductive material containing nitrogen, such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With the use of such a material, hydrogen contained in the metal oxide where the channel is formed can be captured in some cases. Alternatively, hydrogen entering from an external insulator or the like can be captured in some cases.

At least part of this embodiment can be implemented in combination with the other embodiments described in this specification as appropriate.

Embodiment 6

Described in this embodiment is a metal oxide (hereinafter, also referred to as an oxide semiconductor) that can be used in the OS transistor described in the above embodiment.

<Classification of Crystal Structures>

First, the classification of the crystal structures of an oxide semiconductor will be described with reference to FIG. 43A. FIG. 43A is a diagram showing the classification of the crystal structures of an oxide semiconductor, typically IGZO (a metal oxide containing In, Ga, and Zn).

As shown in FIG. 43A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite). Note that the term "Crystalline" excludes single crystal, poly crystal, and completely amorphous. The term "Crystal" includes single crystal and poly crystal.

Note that the structures in the thick frame shown in FIG. 43A are in an intermediate state between "Amorphous" and "Crystal", and belong to a new crystalline phase. That is, these structures are completely different from "Amorphous", which is energetically unstable, or "Crystal".

A crystal structure of a film or a substrate can be evaluated with an X-ray diffraction (XRD) spectrum. FIG. 43B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 43B and obtained by GIXD measurement is hereinafter simply referred to as an XRD spectrum. The CAAC-IGZO film in FIG. 43B has a composition in the neighborhood of In:Ga:Zn=4:2:3 [atomic ratio]. The CAAC-IGZO film in FIG. 43B has a thickness of 500 nm.

As shown in FIG. 43B, a clear peak indicating crystallinity is observed in the XRD spectrum of the CAAC-IGZO film. Specifically, a peak indicating c-axis alignment is detected at 2θ of around 31° in the XRD spectrum of the CAAC-IGZO film. As shown in FIG. 43B, the peak at 2θ of around 31° is asymmetric with the angle at which the peak intensity is detected as the axis.

A crystal structure of a film or a substrate can also be evaluated with a diffraction pattern obtained by a nanobeam electron diffraction method (NBED) (such a pattern is also referred to as a nanobeam electron diffraction pattern). FIG. 43C shows a diffraction pattern of the CAAC-IGZO film. FIG. 43C shows a diffraction pattern obtained by the NBED method in which an electron beam is incident in the direction parallel to the substrate. The CAAC-IGZO film in FIG. 43C has a composition in the neighborhood of In:Ga:Zn=4:2:3 [atomic ratio]. In the nanobeam electron diffraction method, electron diffraction is performed with a probe diameter of 1 nm.

As shown in FIG. 43C, a plurality of spots indicating c-axis alignment are observed in the diffraction pattern of the CAAC-IGZO film.

[Structure of Oxide Semiconductor]

Oxide semiconductors might be classified in a manner different from that in FIG. 43A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one minute crystal, the maximum diameter of the crystal region is less than 10 nm. In the case where the crystal region is formed of a large number of minute crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at or around 2θ of 31°. Note that the position of the peak indicating c-axis alignment (the value of 2θ) may change depending on the kind, composition, or the like of the metal elements contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, or the like is included in the distortion in some cases. Note that a clear grain boundary cannot be observed even in the vicinity of the distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called polycrystal. It is highly probable that the grain boundary becomes a recombination center and traps carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is less likely to occur. Moreover, since the crystallinity of an oxide semiconductor might be decreased by entry of impurities, formation of defects, or the like, the CAAC-OS can be regarded as an oxide semiconductor that has a small amount of impurities or defects (e.g., oxygen vacancies). Therefore, an oxide semiconductor including the CAAC-OS is physically stable.

Accordingly, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. There is no regularity of crystal orientation between different nanocrystals in the nc-OS. Hence, the orientation in the whole film is not observed. Accordingly, in some cases, the nc-OS cannot be distinguished from an a-like OS or an amorphous oxide semiconductor, depending on an analysis method. For example, when an nc-OS film is subjected to structural analysis by out-of-plane XRD measurement with an XRD apparatus using θ/2θ scanning, a peak indicating crystallinity is not observed. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., larger than or equal to 1 nm and smaller than or equal to 30 nm).

[A-Like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has a higher hydrogen concentration in the film than the nc-OS and the CAAC-OS.

[Composition of Oxide Semiconductor]

Next, the CAC-OS will be described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. Alternatively, for example, the first region has [In] higher than [In] in the second region and [Ga] lower than [Ga] in the second region. Moreover, the second region has [Ga] higher than [Ga] in the first region and [In] lower than [In] in the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, in EDX mapping obtained by energy dispersive X-ray spectroscopy (EDX), it is confirmed that the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, a high on-state current (Ion), high field-effect mobility (u), and excellent switching operation can be achieved. An oxide semiconductor can have any of various structures that show different properties. Two or more of the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, a case where the oxide semiconductor is used for a transistor will be described.

When the oxide semiconductor is used for a transistor, the transistor can have high field-effect mobility. In addition, the transistor can have high reliability.

An oxide semiconductor having a low carrier concentration is preferably used for the transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$ and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Charges trapped by the trap states in an oxide semiconductor take a long time to be released and may behave like fixed charges. A transistor whose channel formation region is formed in an oxide semiconductor having a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, the impurity concentration in an adjacent film is also preferably reduced. Examples of impurities include hydrogen, nitrogen, alkali metal, alkaline earth metal, iron, nickel, and silicon.

<Impurity>

Here, the influence of impurities in the oxide semiconductor will be described.

When silicon or carbon, which is a Group 14 element, is contained in an oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by SIMS) are each set lower than or equal to $2\times10^{18}$ atoms/cm$^3$, preferably lower than or equal to $2\times10^{17}$ atoms/cm$^3$.

When the oxide semiconductor contains alkali metal or alkaline earth metal, defect states are formed and carriers are generated in some cases. Accordingly, a transistor using an oxide semiconductor that contains alkali metal or alkaline earth metal tends to have normally-on characteristics. Thus, the concentration of alkali metal or alkaline earth metal in the oxide semiconductor, which is obtained by SIMS, is lower than or equal to $1\times10^{18}$ atoms/cm$^3$, preferably lower than or equal to $2\times10^{16}$ atoms/cm$^3$.

An oxide semiconductor containing nitrogen easily becomes n-type by generation of electrons serving as carriers and an increase in carrier concentration. As a result, a transistor using, as a semiconductor, an oxide semiconductor containing nitrogen tends to have normally-on characteristics. When nitrogen is contained in the oxide semiconductor, a trap state is sometimes formed. This might make the electrical characteristics of the transistor unstable. Thus, the nitrogen concentration in the oxide semiconductor, which is obtained by SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen tends to have normally-on characteristics. For this reason, hydrogen in the oxide semiconductor is preferably reduced as much as possible. Specifically, the hydrogen concentration in the oxide semiconductor, which is obtained by SIMS, is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for a channel formation region in a transistor, stable electrical characteristics can be given.

At least part of this embodiment can be implemented in combination with the other embodiments described in this specification as appropriate.

Embodiment 7

In this embodiment, electronic devices each including the display apparatus and the display system of one embodiment of the present invention will be described.

Figure 44A:
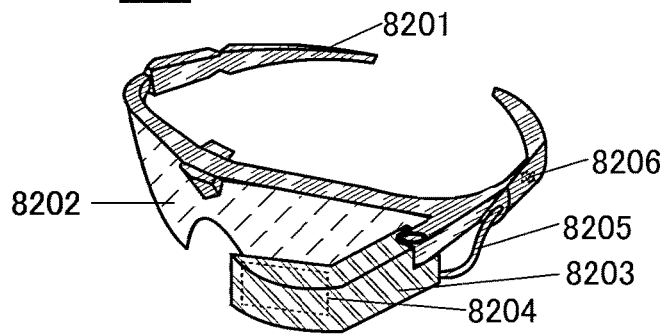
FIG. 44A to FIG. 44D are diagrams illustrating electronic devices of an embodiment.

FIG. 44A is a diagram illustrating an external view of a head-mounted display 8200.

The head-mounted display 8200 includes a wearing portion 8201, a lens 8202, a main body 8203, a display portion 8204, a cable 8205, and the like. A battery 8206 is incorporated in the wearing portion 8201.

The cable 8205 supplies electric power from the battery 8206 to the main body 8203. The main body 8203 includes a wireless receiver or the like and can display an image corresponding to the received image data or the like on the display portion 8204. The movement of the eyeball or the eyelid of the user can be captured by a camera provided in the main body 8203 and then coordinates of the sight line of the user can be calculated using the information to utilize the sight line of the user as an input means.

A plurality of electrodes may be provided in the wearing portion 8201 at a position in contact with the user. The main body 8203 may have a function of sensing current flowing through the electrodes along with the movement of the user's eyeball to recognize the user's sight line. The main body 8203 may have a function of sensing current flowing through the electrodes to monitor the user's pulse. The wearing portion 8201 may include various sensors such as a temperature sensor, a pressure sensor, and an acceleration sensor to have a function of displaying the user's biological information on the display portion 8204. The main body 8203 may sense the movement of the user's head or the like to change an image displayed on the display portion 8204 in synchronization with the movement.

The display apparatus of one embodiment of the present invention can be used in the display portion 8204. Thus, the power consumption of the head-mounted display 8200 can be reduced, so that the head-mounted display 8200 can be used continuously for a long time. The power consumption of the head-mounted display 8200 can be reduced, which allows the battery 8206 to be downsized and lighter and accordingly allows the head-mounted display 8200 to be downsized and lighter. Thus, a burden of the user of the head-mounted display 8200 can be reduced, and the user is less likely to feel fatigue.

Figure 44B:
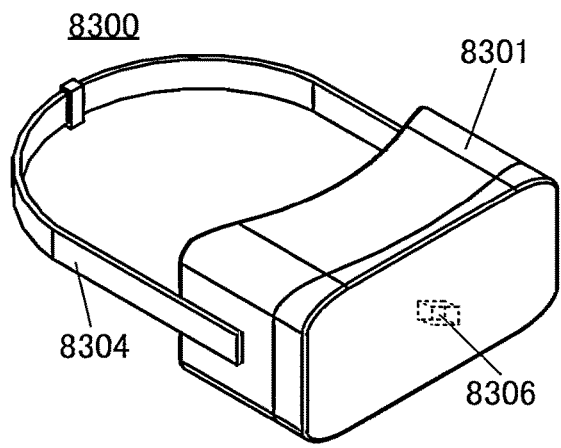
Figure 44C:
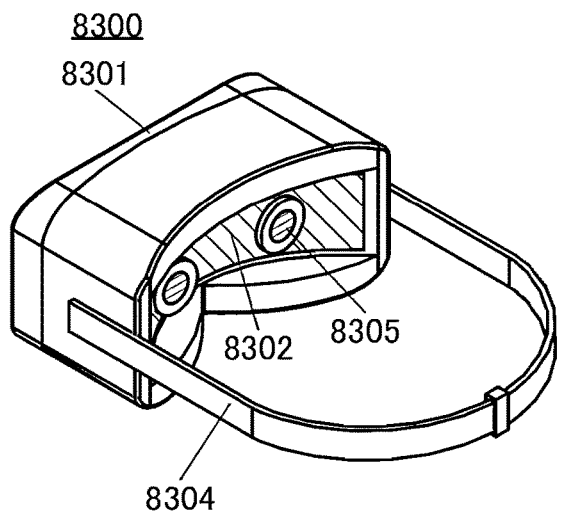
Figure 44D:
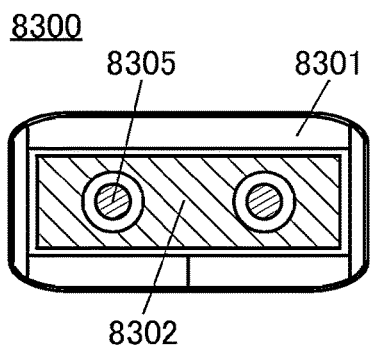

FIG. 44B, FIG. 44C, and FIG. 44D are external views of a head-mounted display 8300. The head-mounted display 8300 includes a housing 8301, a display portion 8302, a fixing band 8304, and a pair of lenses 8305. A battery 8306 is incorporated in the housing 8301, and electric power can be supplied from the battery 8306 to the display portion 8302 and the like.

A user can see display on the display portion 8302 through the lenses 8305. It is suitable that the display portion 8302 be curved and placed. When the display portion 8302 is curved and placed, a user can feel a high realistic sensation. Note that although the structure in which one display portion 8302 is provided is described in this embodiment as an example, the structure is not limited thereto, and a structure in which two display portions 8302 are provided may also be employed. In that case, one display portion is placed for one eye of the user, so that three-dimensional display using parallax or the like is possible.

The display apparatus of one embodiment of the present invention can be used in the display portion 8302. Thus, the power consumption of the head-mounted display 8300 can be reduced, so that the head-mounted display 8300 can be used continuously for a long time. The power consumption of the head-mounted display 8300 can be reduced, which allows the battery 8306 to be downsized and lighter and accordingly allows the head-mounted display 8300 to be downsized and lighter. Thus, a burden of the user of the head-mounted display 8300 can be reduced, and the user is less likely to feel fatigue.

Figure 45A:
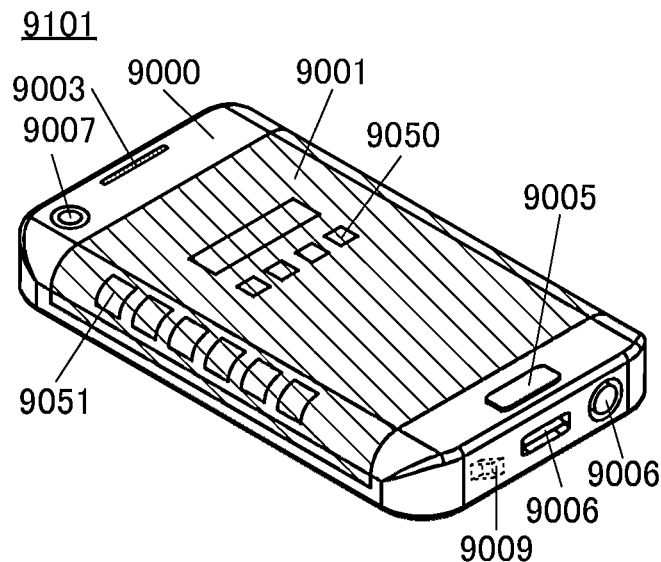
FIG. 45A and FIG. 45B are diagrams illustrating electronic devices of an embodiment.
Figure 45B:
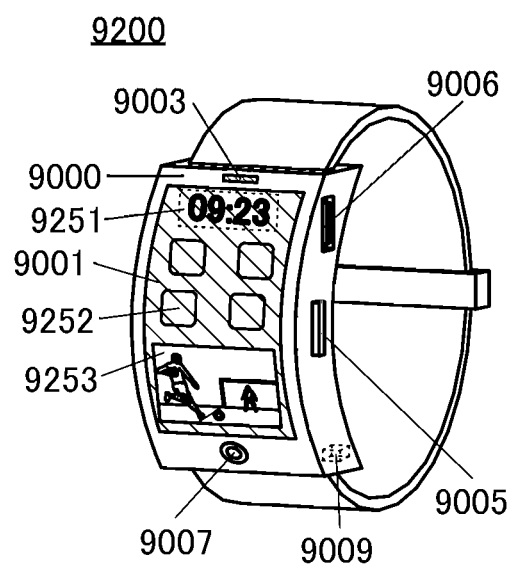

Next, FIG. 45A and FIG. 45B illustrate examples of electronic devices that are different from the electronic devices illustrated in FIG. 44A to FIG. 44D.

Electronic devices illustrated in FIG. 45A and FIG. 45B include a housing 9000, a display portion 9001, a speaker 9003, an operation key 9005 (including a power switch or an operation switch), a connection terminal 9006, a sensor 9007 (having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a battery 9009, and the like.

The electronic devices illustrated in FIG. 45A and FIG. 45B have a variety of functions. Examples of the functions include a function of displaying a variety of information (a still image, a moving image, a text image, and the like) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a memory medium and displaying it on the display portion. Note that functions of the electronic devices illustrated in FIG. 45A and FIG. 45B are not limited thereto, and the electronic devices can have a variety of functions. Although not illustrated in FIG. 45A and FIG. 45B, the electronic devices may each include a plurality of display portions. The electronic devices may each include a camera and the like and have a function of taking a still image, a function of taking a moving image, a function of storing the taken image in a memory medium (externally attached or incorporated in the camera), a function of displaying the taken image on the display portion, and the like.

The details of the electronic devices illustrated in FIG. 45A and FIG. 45B will be described below.

FIG. 45A is a perspective view illustrating a portable information terminal 9101. The portable information terminal 9101 has a function of, for example, one or more selected from a telephone set, a notebook, an information browsing system, and the like. Specifically, the portable information terminal can be used as a smartphone. The portable information terminal 9101 can display text or an image on its plurality of surfaces. For example, three operation buttons 9050 (also referred to as operation icons, or simply, icons) can be displayed on one surface of the display portion 9001. Information 9051 indicated by a dashed rectangular can be displayed on another surface of the display portion 9001. Examples of the information 9051 include display indicating reception of an e-mail, an SNS (social networking service), a telephone call, or the like; the title of an e-mail, an SNS, or the like; the sender of an e-mail, an SNS, or the like; the date; the time; remaining battery; and the reception strength of an antenna. Alternatively, the operation buttons 9050 or the like may be displayed on the position where the information 9051 is displayed, in place of the information 9051.

The display apparatus of one embodiment of the present invention can be used for the portable information terminal 9101. Thus, the power consumption of the portable information terminal 9101 can be reduced, so that the portable information terminal 9101 can be used continuously for a long time. The power consumption of the portable information terminal 9101 can be reduced, which allows the battery 9009 to be downsized and lighter and accordingly allows the portable information terminal 9101 to be downsized and lighter. Thus, the portability of the portable information terminal 9101 can be increased.

FIG. 45B is a perspective view of a watch-type portable information terminal 9200. The portable information terminal 9200 can execute a variety of applications such as mobile phone calls, e-mailing, viewing and editing texts, music reproduction, Internet communication, and computer games. The display surface of the display portion 9001 is curved, and display can be performed on the curved display surface. FIG. 45B illustrates an example in which time 9251, operation buttons 9252 (also referred to as operation icons, or simply, icons), and a content 9253 are displayed on the display portion 9001. The content 9253 can be a moving image, for example.

The portable information terminal 9200 is capable of executing near field communication conformable to a communication standard. For example, mutual communication with a headset capable of wireless communication enables hands-free calling. The portable information terminal 9200 includes the connection terminal 9006, and data can be directly transmitted to and received from another information terminal via a connector. Power charging through the connection terminal 9006 is also possible. Note that the charging operation may be performed by wireless power feeding without through the connection terminal 9006.

The display apparatus of one embodiment of the present invention can be used for the portable information terminal 9200. Thus, the power consumption of the portable information terminal 9200 can be reduced, so that the portable information terminal 9200 can be used continuously for a long time. The power consumption of the portable information terminal 9200 can be reduced, which allows the battery 9009 to be downsized and lighter and accordingly allows the portable information terminal 9200 to be downsized and lighter. Thus, the portability of the portable information terminal 9200 can be increased.

At least part of this embodiment can be implemented in combination with the other embodiments described in this specification as appropriate.

<Supplementary Notes on Description in this Specification and the Like>

The following are notes on the description of the foregoing embodiments and the structures in the embodiments.

One embodiment of the present invention can be constituted by appropriately combining the structure described in an embodiment with any of the structures described in the other embodiments. In addition, in the case where a plurality of structure examples are described in one embodiment, some of the structure examples can be combined as appropriate.

Note that a content (or part thereof) described in one embodiment can be applied to, combined with, or replaced with another content (or part thereof) in the same embodiment and/or a content (or part thereof) described in another embodiment or other embodiments, for example. Note that in each embodiment, a content described in the embodiment is a content described with reference to a variety of diagrams or a content described with text disclosed in the specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.

In this specification and the like, components are classified on the basis of the functions, and shown as blocks independent of one another in block diagrams. However, in an actual circuit and the like, such components are sometimes hard to classify functionally, and there is a case where one circuit is associated with a plurality of functions and a case where a plurality of circuits are associated with one function. Therefore, the blocks in the block diagrams are not limited by the components described in the specification, and the description can be changed appropriately depending on the situation.

In drawings, the size, the layer thickness, or the region is shown arbitrarily for description convenience. Therefore, the size, the layer thickness, or the region is not limited to the illustrated scale. Note that the drawings are schematically shown for clarity, and embodiments of the present invention are not limited to shapes, values, or the like shown in the drawings. For example, variation in signal, voltage, or current due to noise or variation in signal, voltage, or current due to difference in timing can be included.

In this specification and the like, the terms "one of a source and a drain" (or a first electrode or a first terminal) and "the other of the source and the drain" (or a second electrode or a second terminal) are used to describe the connection relationship of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In this specification and the like, the terms such as "electrode" and "wiring" do not limit the functions of the components. For example, an "electrode" is used as part of a "wiring" in some cases, and vice versa. Furthermore, the term such as "electrode" or "wiring" also includes the case where a plurality of "electrodes" or "wirings" are formed in an integrated manner, for example.

In this specification and the like, voltage and potential can be replaced with each other as appropriate. The term voltage refers to a potential difference from a reference potential, and when the reference potential is a ground potential, for example, voltage can be replaced with potential. The ground potential does not necessarily mean 0 V. Potentials are relative values, and a potential supplied to a wiring or the like is sometimes changed depending on the reference potential.

In this specification and the like, the terms "film" and "layer" can be interchanged with each other depending on the case or circumstances. For example, the term "conductive layer" can be changed into the term "conductive film" in some cases. Also, for example, the term "insulating film" can be changed into the term "insulating layer" in some cases.

In this specification and the like, a switch is in a conduction state (on state) or in a non-conduction state (off state) to determine whether current flows therethrough or not. Alternatively, a switch has a function of selecting and changing a current path.

In this specification and the like, the channel length refers to, for example, the distance between a source and a drain in a region where a semiconductor (or a portion where current flows in a semiconductor when a transistor is on) and a gate overlap with each other or a region where a channel is formed in a top view of the transistor.

In this specification and the like, the channel width refers to, for example, the length of a portion where a source and a drain face each other in a region where a semiconductor (or a portion where current flows in a semiconductor when a transistor is on) and a gate electrode overlap with each other or a region where a channel is formed.

In this specification and the like, the expression "A and B are connected" means the case where A and B are electrically connected to each other as well as the case where A and B are directly connected to each other. Here, the expression "A and B are electrically connected" means the case where electric signals can be transmitted and received between A and B when an object having any electric action exists between A and B.

REFERENCE NUMERALS

CC: color conversion layer, C11: capacitor, C12: capacitor, COM1: conductive film, COM2: conductive film, COM2p: conductive film, FR1: period, FR2: period, G1: conductive film, G2: conductive film, G3: conductive film, G12: conductive film, G13: conductive film, GD: driver circuit, GL: gate line, GL2p: gate line, GL11: gate line, GL12: gate line, M11: transistor, N11: node, SD: driver circuit, SWm: switch, SW11: switch, SW12: switch, SW13: switch, SW2: switch, SW2p: switch, SW3p: switch, SW3q: switch, S1: conductive film, V0: wiring, V1: wiring, 10: display apparatus, 10A: display apparatus, 20: layer, 30: layer, 40: driver circuit, 41: gate driver, 42: source driver, 50: functional circuit, 51: CPU, 52: accelerator, 53: CPU core, 60: display portion, 61: pixel, 61D: pixel, 61N: pixel, 62: pixel circuit, 62B: pixel circuit, 62G: pixel circuit, 62R: pixel circuit, 70: light-emitting element, 80: flip-flop, 81: scan flip-flop, 82: backup circuit, 200A: transistor, 205: conductor, 205a: conductor, 205b: conductor, 205c: conductor, 214: insulator, 216: insulator, 222: insulator, 224: insulator, 230: metal oxide, 230a: metal oxide, 230b: metal oxide, 230c: metal oxide, 231: region, 240: conductor, 240a: conductor, 240b: conductor, 241: insulator, 241a: insulator, 241b: insulator, 242: conductor, 242a: conductor, 242b: conductor, 250: insulator, 254: insulator, 260: conductor, 260a: conductor, 260b: conductor, 274: insulator, 280: insulator, 281: insulator, 301a: conductor, 301b: conductor, 305: conductor, 311: conductor, 313: conductor, 317: conductor, 321: lower electrode, 323: insulator, 325: upper electrode, 331: conductor, 333: conductor, 335: conductor, 337: conductor, 341: conductor, 343: conductor, 347: conductor, 351: conductor, 353: conductor, 355: conductor, 357: conductor, 361: insulator, 363: insulator, 403: element isolation layer, 403B: element isolation layer, 405: insulator, 405B: insulator, 407: insulator, 409: insulator, 411: insulator, 421: insulator, 441: transistor, 443: conductor, 445: insulator, 447: semiconductor region, 449a: low-resistance region, 449b: low-resistance region, 451: conductor, 453: conductor, 455: conductor, 459: bonding layer, 461: conductor, 463: conductor, 501: insulator, 520: functional layer, 530: pixel circuit, 541: pad, 542: pad, 543: conductive material, 550: light-emitting device, 601: transistor, 602: transistor, 603: transistor, 613: insulator, 614: insulator, 616: insulator, 622: insulator, 624: insulator, 654: insulator, 674: insulator, 680: insulator, 681: insulator, 700: display apparatus, 701: substrate, 701B: substrate, 702: pixel, 703: pixel, 705: substrate, 712: sealant, 716: FPC, 730: insulator, 732: sealing layer, 734: insulator, 738: light-blocking layer, 750: transistor, 760: connection electrode, 772: conductor, 778: structure body, 780: anisotropic conductor, 786: light-emitting layer, 788: conductor, 790: capacitor, 800: transistor, 801a: conductor, 801b: conductor, 805: conductor, 811: conductor, 813: conductor, 814: insulator, 816: insulator, 817: conductor, 821: insulator, 822: insulator, 824: insulator, 853: conductor, 854: insulator, 855: conductor, 874: insulator, 880: insulator, 881: insulator, 8200: head-mounted display, 8201: wearing portion, 8202: lens, 8203: main body, 8204: display portion, 8205: cable, 8206: battery, 8300: head-mounted display, 8301: housing, 8302: display portion, 8304: fixing band, 8305: lens, 8306: battery, 9000: housing, 9001: display portion, 9003: speaker, 9005: operation key, 9006: connection terminal, 9007: sensor, 9009: battery, 9050: operation button, 9051: information, 9101: portable information terminal, 9200: portable information terminal, 9251: time, 9252: operation button, 9253: content

The invention claimed is:

1. A display apparatus comprising:
a first pixel set;
a first conductive film;
a plurality of second conductive films; and
a plurality of third conductive films,
wherein the first pixel set comprises first to third light-emitting devices, a first pad, a second pad, a conductive material, and first to third pixel circuits,
wherein each of the first to third light-emitting devices comprise a first electrode and a second electrode,
wherein the first electrodes of the first to third light-emitting devices are electrically connected to the first pad,
wherein the second electrode of the first light-emitting device is electrically connected to one of the plurality of third conductive films and the second electrode of the second light-emitting device is electrically connected to another one of the plurality of third conductive films,
wherein the first pad overlaps with the second pad,
wherein the conductive material is sandwiched between the first pad and the second pad,
wherein the conductive material electrically connects the first pad and the second pad,
wherein each of the first to third pixel circuits comprises a first transistor, a second transistor, a third transistor, and a capacitor,
wherein in each of the first to third pixel circuits:
a gate of the first transistor is electrically connected to the first conductive film,
a first terminal of the first transistor, a gate of the third transistor, and a first electrode of the capacitor are electrically connected to each other,
a second electrode of the capacitor and a first terminal of the third transistor are electrically connected to each other,
a second terminal of the of the third transistor and a first terminal of the second transistor are electrically connected to each other, and
a second terminal of the second transistor is electrically connected to the second pad, and
wherein a gate of the second transistor in the first pixel circuit is electrically connected to one of the plurality of the second conductive films and a gate of the second transistor in the second pixel circuit is electrically connected to another one of the plurality of the second conductive films.

2. The display apparatus according to claim 1, further comprising:
a second pixel set,
wherein the second pixel set comprises fourth to sixth light-emitting devices and fourth to sixth pixel circuits, and
wherein the first conductive film is electrically connected to the fourth to sixth pixel circuits.

3. The display apparatus according to claim 1, wherein the first light-emitting device is a light-emitting diode.

4. The display apparatus according to claim 1, further comprising a first driver circuit,
wherein the first driver circuit supplies a first selection signal to the first conductive film, and
wherein the first driver circuit supplies a second selection signal to the plurality of second conductive films.

5. The display apparatus according to claim 1, further comprising a first functional layer and a second functional layer,
wherein the first functional layer comprises the first to third pixel circuits and the second pad,
wherein the second functional layer overlaps with the first functional layer, and
wherein the second functional layer comprises the first to third light-emitting devices and the first pad.

6. The display apparatus according to claim 5, further comprising a third functional layer,
wherein the third functional layer comprises a region where the first functional layer is sandwiched between the second functional layer and the third functional layer,
wherein the third functional layer comprises a second driver circuit, and
wherein the second driver circuit is configured to supply an image signal.

7. An electronic device comprising:
the display apparatus according to claim 6; and
an arithmetic portion,
wherein the third functional layer comprises the arithmetic portion,
wherein the arithmetic portion generates image information, and
wherein the display apparatus displays the image information.

8. An electronic device comprising:
an arithmetic portion; and
the display apparatus according to claim 1,
wherein the arithmetic portion generates image information, and
wherein the display apparatus displays the image information.

* * * * *